United States Patent
Brust et al.

(10) Patent No.: US 9,512,243 B2
(45) Date of Patent: *Dec. 6, 2016

(54) METHODS FOR USING SILVER-CONTAINING POLYMERIC COMPLEXES

(71) Applicant: Eastman Kodak Company, Rochester, NY (US)

(72) Inventors: Thomas B. Brust, Webster, NY (US); Anne Troxell Wyand, Victor, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/661,327

(22) Filed: Mar. 18, 2015

(65) Prior Publication Data

US 2016/0272734 A1    Sep. 22, 2016

(51) Int. Cl.
| | | |
|---|---|---|
| *G03F 7/00* | (2006.01) | |
| *C08F 8/42* | (2006.01) | |
| *B05D 7/04* | (2006.01) | |
| *C23C 18/38* | (2006.01) | |
| *C23C 18/30* | (2006.01) | |
| *G03F 7/20* | (2006.01) | |

(52) U.S. Cl.
CPC . *C08F 8/42* (2013.01); *B05D 7/04* (2013.01); *C23C 18/30* (2013.01); *C23C 18/38* (2013.01); *G03F 7/20* (2013.01)

(58) Field of Classification Search
CPC ....................................................... G03F 7/00
See application file for complete search history.

(56) References Cited

U.S. PATENT DOCUMENTS

| | | | |
|---|---|---|---|
| 6,949,598 | B2 | 9/2005 | Terry |
| 7,143,709 | B2 | 12/2006 | Brennan et al. |
| 7,348,365 | B2 | 3/2008 | Lee et al. |
| 7,650,848 | B2 | 1/2010 | Brennan et al. |
| 8,361,553 | B2 | 1/2013 | Karandikar et al. |
| 8,828,275 | B2 | 9/2014 | Wang et al. |
| 9,081,282 | B1 * | 7/2015 | Brust .................... G03F 7/0388 |
| 2008/0102122 | A1 | 5/2008 | Mahadevan et al. |
| 2009/0263496 | A1 | 10/2009 | Kijlstra et al. |
| 2010/0226943 | A1 | 9/2010 | Brennan et al. |
| 2014/0221543 | A1 | 8/2014 | Wang et al. |

OTHER PUBLICATIONS

Bo et al., "A Simple and 'Green' Synthesis of Polymer-Based Silver Colloids and Their Antibacterial Properties," Chemistry & Biodiversity, vol. 6 (2009), pp. 111-116.
Bryaskova et al., "Antibacterial activity of poly(viny alcohol)-b-poly(acrylonitrile) based micelles loaded with silver nanoparticles," Journal of Colloid and Interface Science 344 (2010) pp. 424-428.
Bryaskova et al., "Synthesis, characterization and antibacterial activity of PVA/TEOS/Ag—Np hybrid thin films," Journal of Colloid and Interface Science 349 (2010) pp. 77-85.
Bryaskova et al., "Synthesis and comparative study on the antimicrobial activity of hybrid materials based on silver nanoparticles (AgNps) stabilized by polyvinylpyrrolidone (PVP)," J. Chem Biol (2011) 4:185-191, DOI 10.1007/s 12154-011-0063-9, pp. 185-191.
Chaloupka et al., "Nanosilver as a new generation of nanoproduct in biomedical applications," Trends in Biotechnology (Nov. 2010), vol. 28, No. 11, pp. 580-588.
Chen et al., "One-step process to fabricate Ag-polypyrrole coaxial nanocables," Chem. Commun. 2005, pp. 1863-1864.
Dallas et al., "Silver polymeric nanocomposites as advanced antimicrobial agents: Classification, synthetic paths, applications, and perspectives," Advances in Colloid and Interface Science 166 (2011), pp. 119-135.
Dantam et al., "Biocidal Efficacy of Silver-Impregnated Contact Lens Storage Cases In Vitro," Investigative Ophthalmology & Visual Science, Jan. 2011, vol. 52, No. 1, (2011) pp. 51-57.
Girard et al., "Development of a polystyrene sulfonate/silver nanocomposite with self-healing properties for biomaterial applications," Comptes Rendus Chimie 16(6): 550-556, 2013.
Hantzschel et al., "Hybrid Microgels with Antibacterial Properties," Macromolecular Bioscience (2009), 9, pp. 444-449.
Harmata, "Silver in Organic Chemistry," 2010.
Kvitek et al., "Effect of Surfactants and Polymers on Stability and Antibacterial Activity of Silver Nanoparticles (NPs)," J. Phys. Chem. C 2008, 112, pp. 5825-5834.
Mohan et al., "Controlling of silver nanoparticles structure by hydrogel networks," Journal of Colloid and Interface Science 342 (2010) pp. 73-82.
Mohan et al., "Hydrogel networks as nanoreactors: A novel approach to silver nanoparticles for antibacterial applications," ScienceDirect Polymer 48 (2007) pp. 158-164.

(Continued)

*Primary Examiner* — Chanceity Robinson
(74) *Attorney, Agent, or Firm* — J. Lanny Tucker

(57) ABSTRACT

A method can be used to provide electrically-conductive articles with electrolessly plated metal, or articles having antimicrobial properties for marine environments. The method includes disposing a silver-containing composition onto one or more supporting sides of a substrate such as continuous polymeric web. The silver-containing composition comprises a water-soluble complex of a reactive polymer with reducible silver ions, the reactive polymer comprising: (a) greater than 1 mol % of recurring units comprising sulfonic acid or sulfonate groups, (b) at least 5 mol % of recurring units comprising a pendant group capable of crosslinking via [2+2] photocycloaddition, and optionally (c) at least 1 mol % of recurring units comprising a pendant amide, hydroxyl, lactam, phosphonic acid, or carboxylic acid group. The reducible silver ions can be suitably reduced and the reactive polymer can be photoexposed to provide crosslinking in patternwise or uniform fashion.

20 Claims, No Drawings

(56) References Cited

OTHER PUBLICATIONS

Murthy et al., "First successful design of semi-IPN hydrogel-silver nanocomposites: A facile approach for antibacterial application," Journal of Colloid and Interface Science 318 (2008), pp. 217-224.
Pal et al., "Does the Antibacterial Activity of Silver Nanoparticles Depend on the Shape of the Nanoparticle? A Study of the Gram-Negative Bacterium *Escherichia coli*," Applied and Environmental Microbiology, Mar. 2007, pp. 1712-1720.
Panacek et al., "Silver Colloid Nanoparticles: Synthesis, Characterization, and Their Antibacterial Activity," J. Phys. Chem. B 2006, pp. 16248-16253.
Rai et al., "Silver nanoparticles as a new generation of antimicrobials," Biotechnology Advances 27 (2009) pp. 76-83.
Ruparelia et al., "Strain specificity in antimicrobial activity of silver and copper nanoparticles," Acta Biomaterialia, 2007, pp. 707-716.
Sharma et al., "Silver nanoparticles: Green synthesis and their antimicrobial activities," Advances in Colloid and Interface Science 145 (2009) pp. 83-96.
Signori et al., "Formation of Catalytic Silver Nanoparticles Supported on Branched Polyethyleneimine Derivatives," Langmuir Article, 2010 American Chemical Society, pp. 17772-17779.
Song et al., "Complex-mediated growth mechanism of silver nanoparticles-poly(vinyl alcohol) composite nanofibers," The Royal Society of Chemistry (2013), pp. 22308-22313.
Stiufiuc et al., "SERS-active silver colloids prepared by reduction of silver nitrate with short-chain polyethylene glycol," Nanoscale Research Letters, (2013), 8:47, pp. 1-5.
Thomas et al., "A versatile strategy to fabricate hydrogel-silver nanocomposites and investigation of their antimicrobial activity," Journal of Colloid and Interface Science 315 (2007) pp. 389-395.
Uygun et al., "Antibacterial Acrylamide Hydrogels Containing Silver Nanoparticles by Simultaneous Photoinduced Free Radical Polymerization and Electron Transfer Processes," Macromolecular Chemistry and Physics, (2009), 210, pp. 1867-1875.
Valle et al., "Preparation and Characterization of Hydrogel-Nanosilver Composites Based on Copolymers from Sodium 2-Acrylamido-2-Methylpropanesulfonate," Journal of Applied Polymer Science, (2013), DOI:10.1002/APP.38655, pp. 537-548.
Vasilev et al., "Antibacterial surfaces by adsorptive binding of polyvinyl-sulphonate-stabilized silver nanoparticles," Nanotechnology 21 (2010) pp. 1-6.
Vimala et al., "Controlled silver nanoparticles synthesis in semi-hydrogel networks of poly(acrylamide) and carbohydrates: A rational methodology for antibacterial application," Carbohydrate Polymers 75 (2009) pp. 463-471.
Wei et al., "The synthesis of chitosan-based silver nanoparticles and their antibacterial activity," Carbohydrate Research 344 (2009) pp. 2375-2382.
Xia et al., "Responsive hydrogels with poly(N-isopropylacrylamide-co-acrylic acid) colloidal spheres as building blocks," Journal of Colloid and Interface Science 349 (2010) pp. 106-113.

* cited by examiner

METHODS FOR USING SILVER-CONTAINING POLYMERIC COMPLEXES

CROSS-REFERENCE TO RELATED APPLICATIONS

Related subject matter is described and claimed in the following copending and commonly assigned patent applications:

U.S. Ser. No. 14/661,278 filed on Mar. 18, 2015 by Brust and Wyand and entitled "Articles with Silver-Containing Polymeric Complexes;" and U.S. Ser. No. 14/661,235 filed on Mar. 18, 2015 by Brust, Bennett, and Falkner and entitled "Silver-Containing Compositions Containing Reactive Polymers."

FIELD OF THE INVENTION

This invention relates to methods for using silver-containing compositions comprising a water-soluble complex of reducible silver ions or silver nanoparticles with a reactive polymer. Such methods can be used to provide electrolessly plated articles. Alternatively, the methods can be used to provide articles that have antimicrobial properties, especially for marine environments. The useful reactive polymers have pendant sulfonic acid or sulfonate groups as well as pendant groups capable of crosslinking via [2+2] photocycloaddition.

BACKGROUND OF THE INVENTION

Both silver ions and silver metal have a long history of chemical and biological activity. In particular, some of the silver salts are photoactive and can form catalytic silver nanoparticles on exposure to suitable radiation. Many chemical reactions are known to be catalyzed by both silver metal and various silver salts or silver ion complexes. Electrophilic substitutions where silver serves as a Lewis acid catalyst are also known as well as organosilver compounds with chemical reactivity.

Silver has been known for biocidal (antimicrobial) activity for over a century and renewed interest in its biocidal properties has arisen due to the emergence of antibiotic-resistant strains of pathogenic bacteria such as MERSA [see for example, Rai et al., *Biotechnology Advances* 27 (2009) 76-83]. There is growing evidence that silver is an effective biocide because it can attack an organism through multiple pathways and thereby disrupt multiple critical systems such as cell wall integrity and transport, protein synthesis, and DNA and RNA replication. In spite of the very aggressive attack by silver at the microbial level, it has a long history of low toxicity to humans and other complex organisms.

Silver nanoparticles can be made without polymeric stabilizers by reducing the silver ammonium complex with sugars such as glucose or maltose. Another frequently used method utilizes citrate to both complex the silver ions and to act as a reducing agent. Often an additional reducing agent such as sodium borohydride, or ascorbic acid can be used with the citrate. Often a surfactant or polymeric stabilizer such as poly(vinyl pyrrolidone) or poly(ethylene glycol) (PEG) is added after silver nanoparticles are prepared without a polymeric stabilizer.

Polymer composites with silver metal are known (Review by Dallas et al., *Advances in Colloid and Interface Science* 166 (2011) 119-135); in commercial products such as antimicrobial coatings on medical devices such as catheters, neurological shunts (Chaloupka et al., *Trends in Biotechnology*, Vol. 28, No. 11, November 2010); or as coatings for contact lens storage cases (Dantam et al., *Investigative Ophthalmology and Visual Science*, Vol. 52, No. 1, January 2011). The silver nanoparticles can be formed by reducing silver ions usually provided as silver nitrate in the presence of a polymer than can peptize or stabilize the resulting silver nanoparticles to maintain a uniform distribution and to prevent particle agglomeration or growth through Ostwald ripening effects. A variety of polymers have been reported to serve this purpose, including poly(vinyl alcohol) or PVA copolymers, poly(vinyl pyrrolidone), and poly(ethylene glycol). A polymeric catalyst prepared by forming silver nanoparticles in modified polyethyleneimine has been reported (Signori et al., Langmuir 2010, 26(22), 17772-17779).

Efforts to use naturally occurring, biodegradable, or "green" polymers in polymer-silver composites have included starch and polysaccharides that serve as both a stabilizing agent and a reducing agent. Silver nanoparticles showing antimicrobial behavior have been formed in the presence of biodegradable and non-toxic chitosan derived from crab shells.

A large body of research has been focused on forming silver nanoparticles inside a network of water-soluble polymers that can be crosslinked to form a water-, ion-, and silver nanoparticle-permeable gel or hydrogel, for example using poly(acrylamide) (Uygun et al., *Macromolecular Chemistry and Physics* 2009 210, 1867-1875) or copolymers derived from an acrylamide and acrylic acid [Thomas et al., *Journal of Colloid and Interface Science* 315 (2007) 389-395, Mohan et al., *Journal of Colloid and Interface Science* 342 (2010) 73-82]. Often an additional water-soluble polymer is present during the polymerization and crosslinking of acrylamide to form an interpenetrating network (or IPN). For example, the formation of silver nanoparticles in poly(acrylamide)-based IPN's is demonstrated for poly(ethylene glycol) and poly(vinyl sulfonic acid) by Mohan et al., *Journal of Colloid and Interface Science* 342 (2010) 73-82, and in an acrylamide-based IPN with poly(vinylpyrrolidone) by Murthy et al., *Journal of Colloid and Interface Science* 318 (2008) 217-224. An acrylamide-starch IPN has been used to form silver nanoparticles for antimicrobial purposes. A hydrogel formed from vinyl caprolactam and glycidyl methacrylate has also been used to form antimicrobial gel containing silver nanoparticles. Hydrogel networks based on N-isopropylacrylamide (NIPAM) copolymerized with acrylic acid and other monomers have also shown the ability to form silver nanoparticles with antimicrobial activity while retaining the temperature responsive swelling behavior well known for such polymers.

The formation of silver nanoparticles in an ionic polymer or polyelectrolyte is also known from Girard et al, *Comptes Rendus Chimie* 16(6) 550-556, 2013 where silver nanoparticles were formed in an aqueous solution of poly(styrene sulfonate). Silver nanoparticles formed in poly(vinyl sulfonate) are reported in Vasilev et al., *Nanotechnology* 21 (2010) 215102. Hydrogels prepared using copolymers derived from 2-acrylamido-2-methylpropanesulfonate and vinyl pyrrolidone or acrylamide were loaded with preformed silver nanoparticles to evaluate the antimicrobial properties (see Valle et al., *Journal of Applied Polymer Science*, 2013, DOI: 10.1002/APP.38655). This art suggests that sulfonate-bearing polymers may be useful for stabilizing silver nanoparticles.

The formation of silver nanoparticles in the presence of a polymer containing both sulfonate and carboxylate groups is described in U.S. Pat. No. 8,828,275B2 (Wang et al.) where very highly concentrated dispersions are prepared for the purpose of forming a conductive silver ink. U.S. Pat. No. 8,361,553B2 (Karandikar et al.) describes polymeric silver nanoparticle dispersions formed by reducing silver ion in the presence of saccharinate derivatives and a variety of water-soluble polymers derived from both carboxylate and sulfonate bearing monomers. These dispersions are used to form antimicrobial surfaces on various substrates. Silver nanoparticle dispersions are also described in U.S. Patent Application Publication 2009/0263496A1 (Kijlstra et al.) by first forming silver oxide in the presence of various dispersing polymers such as poly(vinyl pyrrolidone), poly(aspartic acid), or poly(naphthalene sulfonic acid) and reducing the silver oxide to silver with a reducing agent such as formaldehyde.

U.S. Pat. No. 7,348,365B2 (Lee et al.) described the use of gamma radiation to reduce silver ion to silver nanoparticles in the presence of copolymers derived from vinyl pyrrolidone, acrylic acid, and acrylamide to form antimicrobial coatings. Various particles of silver salts, some specified to be less than 200 nm, are formed in the presence of water soluble polymers such as poly(vinyl pyrrolidone) and poly(acrylic acid) to form antimicrobial coatings or devices in U.S. Patent Application Publication 2008/0102122A1 (Mahadevan et al.) and U.S. Pat. No. 6,949,598B2 (Terry).

While there are numerous polymer-silver complexes described in the art, there remains a need for polymer-silver complexes that are water-soluble and water-coatable, but which can be crosslinked with UV light to become water-insoluble and highly durable after coating. There is a need for such polymer-silver complexes that can be readily used in antimicrobial compositions or articles, or that can be used to form high resolution electrically-conductive patterns without the need for added crosslinking agents or photoinitiators.

There is the further need to provide water-soluble polymeric complexes that contain reducible silver ions that are readily reduced in the polymeric complexes, before or after the polymers are crosslinked. It would be desirable to form silver nanoparticles in the size range of 1 to 500 nm using such materials.

SUMMARY OF THE INVENTION

The present invention provides method for providing a silver-containing article, the method comprising:

disposing a silver-containing composition onto a first supporting side of a substrate, the silver-containing composition comprising a water-soluble complex of a reactive polymer with reducible silver ions, the reactive polymer comprising: (a) greater than 1 mol % of recurring units comprising sulfonic acid or sulfonate groups, (b) at least 5 mol % of recurring units comprising a pendant group capable of crosslinking via [2+2] photocycloaddition, and optionally (c) at least 1 mol % of recurring units comprising a pendant amide, hydroxyl, lactam, phosphonic acid, or carboxylic acid group, all amounts based on the total recurring units in the reactive polymer.

The method of this invention can further comprise:

either immediately before or immediately after disposing the silver-containing composition onto the substrate, reducing the reducible silver ions in the water-soluble complex to form silver nanoparticles in the water-soluble complex.

In addition, after reducing the reducible silver ions, the method can comprise photoexposing the water-soluble complex containing the silver nanoparticles to form a crosslinked water-insoluble complex comprising the silver nanoparticles, either uniformly or in a patternwise fashion on the substrate.

After photoexposing the water-soluble complex to form the crosslinked water-insoluble complex containing silver nanoparticles, the method can comprise:

In some embodiments, the method further comprises:

electrolessly plating the crosslinked water-insoluble complex using an electrically-conductive metal.

When duplex articles are to be made, the method can comprise:

disposing the silver-containing composition onto the first supporting side of a substrate, either immediately before or immediately after disposing the silver-containing composition onto the first supporting side of the substrate, reducing the reducible silver ions in the water-soluble complex to form silver nanoparticles in the water-soluble complex on the first supporting side of the substrate, disposing the same or different silver-containing composition onto an opposing second supporting side of the substrate, either immediately before or immediately after disposing the silver-containing composition onto the opposing second supporting side of the substrate, reducing the reducible silver ions in the water-soluble complex to form silver nanoparticles in the water-soluble complex on the opposing second supporting side of the substrate, and photoexposing the water-soluble complex containing the silver nanoparticles on either or both of the first supporting side and opposing second supporting side of the substrate, to form a crosslinked water-insoluble complex comprising the silver nanoparticles on either or both of the first supporting side and opposing supporting side of the substrate, and optionally, removing any remaining water-soluble complex from both the first supporting side and the opposing second supporting side of the substrate.

Such methods can further comprise:

removing any remaining water-soluble complex from both the first supporting side and the opposing second supporting side of the substrate, and electrolessly plating the crosslinked water-insoluble complex on either or both of the first supporting side and the second opposing supporting side of the substrate using an electrically-conductive metal.

Such embodiments are particularly useful when the substrate is a continuous web of transparent polymeric film having an integrated transmittance of at least 80%.

The advantages of the present invention are provided using a unique reactive polymer that is water-soluble or water-dispersible and can be used to form a complex with either reducible silver ions or silver nanoparticles. Two essential features are present in the reactive polymer to provide the desired properties. The first essential feature is the presence of greater than about 1 mol % of recurring units comprising sulfonic acid or sulfonate groups. The second essential feature is the presence of at least 5 mol % of recurring units comprising a pendant group capable of crosslinking via [2+2] photocycloaddition group. A variety of other recurring units can be present in the reactive polymer, for example comprising pendant amide, hydroxyl, lactam, phosphonic acid, or carboxylic acid groups to provide additional properties. Hydrophobic ethylenically unsaturated polymerizable monomers such as styrene or acrylate esters can also be used in the polymerization processes to provide polymers with enhanced film forming and durability.

The presence of the sulfonic acid or sulfonate groups in the reactive polymers provide desired water solubility or water dispersibility for a broad range of uses, most importantly in the presence of reducible silver ions that can precipitate other less water-soluble polymers. The pendant groups that are capable [2+2] photocycloaddition provide a built-in crosslinking function that is only activated by exposure to the appropriate UV radiation and is extremely thermally stable.

The reducible silver ion or silver nanoparticle bearing polymeric complexes used in this invention have a broad range of capabilities or uses due to the reactivity of the complexed reducible silver ions or silver nanoparticles, high resolution patternability, and water-solubility or swellability after reactive polymer crosslinking. These reducible silver ion or silver nanoparticle containing polymer complexes can be used to form high resolution, electrically-conductive metal grid patterns because the silver nanoparticles can act as seed catalysts for electroless metal plating. For example, these complexes can be coated and exposed with a high resolution UV radiation and developed in water, or they can be printed by various methods including gravure or flexographic printing methods and then hardened with UV light before electroless plating.

These polymeric complexes containing reducible silver ions or silver nanoparticles can also be used on various surfaces (for example, of substrates) where they can be hardened or patterned with UV radiation to form silver ion loaded crosslinked hydrogels (containing reacted polymers) wherein water and ions can diffuse in and out. Such coatings can be used as antimicrobial coatings on various surfaces especially surfaces that are frequently exposed to water.

The high resolution patternability of the silver-containing polymeric complexes described herein can enable an enhanced form of antimicrobial surface based on recent learning about the efficacy of specifically designed high resolution patterns that show dramatic reduction in biofouling and microbial colony formation without the need for metals or other toxic substances (see for example, U.S. Patent Application Publication 2010/0226943A1 and U.S. Pat. No. 7,650,848 B2 and U.S. Pat. No. 7,143,709 B2 of Brennan et al.). Certain specifically designed surface patterns can be embossed or imprinted using a layer of a specific polymer. For example, some described patterns have minimum feature dimensions of about 2 μm and are designated as "Sharklet AF" pattern that has been shown to have best overall performance compared to simpler patterns with similar dimensions. The polymers used in such patterns are polydimethylsiloxane (PDMS) type polymers, although acrylic polymer hydrogels have also been demonstrated (see Magin et al., *Biomacromolecules* 2011, 12, 915-922).

The reducible silver ion or silver nanoparticle containing photopatternable polymeric complexes used in this invention provide the opportunity to combine both the inherent antimicrobial activity of silver with the advantages of the noted essential polymer features so that pattern formation is also enhanced, further improving the inhibition of microbial colonization and growth. In addition, the UV radiation patternability and water-solubility of the noted silver ion or silver nanoparticle containing polymer complexes facilitate patterning in a roll-to-roll manufacturing system using simple water-bath processing.

DETAILED DESCRIPTION OF THE INVENTION

The following discussion is directed to various embodiments of the present invention and while some embodiments can be desirable for specific uses, the disclosed embodiments should not be interpreted or otherwise considered be limit the scope of the present invention, as claimed below. In addition, one skilled in the art will understand that the following disclosure has broader application than is explicitly described and the discussion of any particular embodiment.

DEFINITIONS

As used herein to define various components of the silver-containing compositions, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, or layer. Unless otherwise indicated, the percentages can be the same for either a dry layer or pattern, or for the total solids of the formulation or composition.

The term "homopolymer" is meant to refer to polymeric materials that have the same repeating or recurring unit along a polymer backbone. The term "copolymer" refers to polymeric materials composed of two or more different repeating or recurring units that are arranged in any order (randomly or otherwise) along the reactive polymer backbone.

For the reactive polymers used in the present invention, the recurring units can be arranged randomly along the reactive polymer backbone, or there can be blocks of recurring units that occur naturally during the polymerization process.

Recurring units in the reactive polymers described herein can be generally derived from the corresponding ethylenically unsaturated polymerizable monomers used in a polymerization process, which ethylenically unsaturated polymerizable monomers have the desired functional and pendant groups. Alternatively, desired pendant groups can be incorporated within recurring units after polymerization of ethylenically unsaturated polymerizable monomers by reaction with requisite precursor pendant groups.

The term "polymerization" is used herein to mean the combining, for example by covalent bonding, of a large number of smaller molecules, such as monomers, to form very large molecules, that is, macromolecules or polymers. The monomers can be combined to form only linear macromolecules or they can be combined to form three-dimensional macromolecules that are commonly referred to as crosslinked polymers. One type of polymerization that can be carried out in the practice of this invention is free radical polymerization when free radically ethylenically unsaturated polymerizable monomers and suitable free radical generating initiators are present.

The term "reactive polymer" is used herein to refer to the copolymers described below that have the essential components and properties described and can be used in the compositions, articles, and methods described herein, and which copolymers are sensitive to ultraviolet radiation so that crosslinking occurs using the pendant groups noted below.

In reference to reactive polymers described herein, the term "water-soluble" is used to mean that the minimum solubility in water of a given reactive polymer is at least 0.1 weight % at 25° C. Some reactive polymers can be less water-solubility but still water-dispersible. The term "water-insoluble" is used to mean that a given reactive polymer is less than less than 0.1 weight % at 25° C.

The term "crosslinked reacted polymer" is used herein to refer to the crosslinked form of the corresponding reactive polymer.

The term "aqueous-based" refers to solutions, baths, or dispersions in which the predominant solvent, or at least 50 weight % of the solvents, is water.

Unless otherwise indicated, the term "mol %" when used in reference to recurring units in reactive polymers, refers to either the nominal (theoretical) amount of a recurring unit based on the molecular weight of ethylenically unsaturated polymerizable monomer used in the polymerization process, or to the actual amount of recurring unit in the resulting reactive polymer as determined using suitable analytical techniques and equipment.

Unless otherwise indicated, the term "group" particularly when used to define a substituent of a defined moiety, can itself be substituted or unsubstituted (for example and alkyl group" refers to a substituted or unsubstituted alkyl). Generally, unless otherwise specifically stated, substituents on any "groups" referenced herein or where something is stated to be possibly substituted, include the possibility of any groups, whether substituted or unsubstituted, which do not destroy properties necessary for the utility of the component or aqueous metal catalytic composition. It will also be understood for this application that reference to a compound of a particular general structure includes those compounds of other more specific formula that fall within the general structural definition. Examples of substituents on any of the mentioned groups can include known substituents such as: halogen (for example, chloro, fluoro, bromo, and iodo); cyano; nitro; amino; alkoxy particularly those with 1 to 12 carbon atoms (for example, methoxy and ethoxy); substituted or unsubstituted alkyl groups, particularly lower alkyl groups (for example, methyl and trifluoromethyl); alkenyl or thioalkyl (for example, methylthio and ethylthio), particularly either of those with 1 to 12 carbon atoms; substituted and unsubstituted aryl, particularly those having from 6 to 20 carbon atoms in the aromatic ring (for example, phenyl); and substituted or unsubstituted heteroaryl, particularly those having a 5- or 6-membered ring containing 1 to 3 heteroatoms selected from N, O, S or Se (for example, pyridyl, thienyl, furyl, pyrrolyl, and their corresponding benzo and naptho analogs); and other substituents that would be readily apparent in the art. Alkyl substituents particularly contain 1 to 12 carbon atoms and specifically include "lower alkyl" that is having from 1 to 6 carbon atoms, for example, methyl, ethyl, and t-butyl. Further, with regard to any alkyl group, alkylene group or alkenyl group, it will be understood that these can be branched or unbranched and include ring (cyclic) structures.

The term "UV radiation" is used herein to refer to electromagnetic radiation having a wavelength ($\lambda_{max}$) of at least 150 nm and up to and including 450 nm.

As used herein, all molecular weights are weight average molecular weights ($M_w$) that can be determined using known procedures and equipment if the values are not already known from the literature. For example, $M_w$ can be determined using Size Exclusion Chromatography (SEC) and values are reported herein as poly(methyl methacrylate) equivalent weights.

In defining various dimensions of features and nanoparticles, each dimension "average" is determined from at least 2 measurements of the specific dimension using appropriate measurement techniques and equipment that would be known to one skilled in the art. For example, the average dry thickness of layers described herein can be determined from the average of at least 2 separate measurements taken of a dry layer, for example, using electron microscopy. Similarly, the average dry thickness or width of lines, grid lines, or other pattern features described herein can be the average of at least 2 separate measurements taken, for example, using electron microscopy. The "average diameter" of silver nanoparticles can be determined by at least two measurements using light scattering or electron microscopy, such as transmission electron microscopy ("TEM").

The term "aspect ratio" is used to define the morphology of particles including the silver nanoparticles described herein. The term has the well understood meaning of the ratio of the largest dimension to the smallest dimensions of an anisotropic particle such as a platelet or rod. In some embodiments of the present invention, the silver nanoparticles in silver-containing compositions (B) and (D) described below is less than 2, or even less than 1.5 and such particles are generally considered to be low aspect ratio or near-spherical in morphology. In other embodiments, the silver nanoparticles in silver-containing compositions (B) and (D) have an aspect ratio of greater than or equal to 2 and have plate-like or platelet morphology.

In many embodiments of substrates and articles described herein, the transparent substrate and all accompanying layers or features on one or both supporting sides, are considered transparent meaning that its integrated transmittance over the noted visible region of the electromagnetic spectrum (for example from 410 nm to 700 nm) is 70% or more, or more likely at least 80% or even 90% or more, as measured for example using a spectrophotometer and known techniques.

Unless otherwise indicated herein, the term "metallic" refers to materials that are single pure metals, metal alloys, metallic oxides, metallic sulfides, and materials containing metallic particles such as micro-particles, nanoparticles, or grains.

Uses

The compositions, articles, and methods described or claimed herein include the use of reactive polymers that can be used to form water-soluble complexes containing either reducible silver ions or reduced silver nanoparticles. The resulting water-soluble complexes have a variety of applications.

In some embodiments, the water-soluble complexes containing the reactive polymers can be disposed on various substrates in a uniform or patterned manner for further chemical reactions such as providing catalytic silver nanoparticles that can then be used to form high resolution electrically-conductive metal patterns as described herein. Such electrically-conductive metal patterns can be incorporated into various devices including but not limited to touch screens or other display devices that can be used in numerous industrial, consumer, and commercial products. Thus, the water-soluble complexes can be incorporated into silver-containing compositions described below where efficient photopolymerization and metal pattern formation is needed in various articles or devices.

Touch screen technology can comprise different touch sensor configurations including capacitive and resistive touch sensors. Capacitive touch sensors can be used in electronic devices with touch-sensitive features. These electronic devices can include but are not limited to, televisions, monitors, and projectors that can be adapted to display images including text, graphics, video images, movies, still images, and presentations. The image devices that can be used for these display devices that can include cathode ray tubes (CRT), projectors, flat panel liquid crystal displays (LCD), light emitting diode (LED) systems, organic light emitting diode (OLED) systems, plasma systems, electroluminescent displays (ELD), and field emission displays (FED). For example, the present invention can be used to prepare capacitive touch sensors that can be incorporated into electronic devices with touch-sensitive features to provide computing devices, computer displays, portable media players including e-readers, mobile telephones and other communicating devices.

Systems and methods of fabricating flexible and optically compliant touch sensors in a high-volume roll-to-roll manufacturing process wherein micro electrically-conductive features can be created in a single pass are possible using the present invention. The water-soluble silver-containing compositions can be used in such systems and methods with multiple printing members (such as flexographic printing members) to form multiple high resolution electrically-conductive images from predetermined designs of patterns provided in those multiple printing members. Multiple patterns can be printed on one or both sides of a substrate. For example, one predetermined pattern can be printed on one side of the substrate and a different predetermined pattern can be printed on the opposing side of the substrate that can be a continuous web.

In other embodiments, the present invention can be used to provide silver-containing articles that can be used for anti-fouling or antimicrobial purposes in aquatic or marine environments, or in clothing or medical devices.

Reactive Polymers

In general, the reactive polymers useful in the practice of this invention have two essential features. They comprise pendant groups that are capable of crosslinking via [2+2] photocycloaddition (defined below) upon exposure to suitable radiation. In addition, the reactive polymers also comprise sulfonate or sulfonic acid groups that provide sufficient water-solubility or water-dispersibility as well as silver complexation properties. While the reactive polymers can be supplied as aqueous-based compositions, they are best used when complexed with either reducible silver ions or silver nanoparticles as described below on a substrate that can have a large or small surface, including the outer surfaces of inorganic or organic particles and then dried. Thus, the reactive polymers are reducible silver ion or silver metal complexing (as described below), water-soluble, and photocrosslinkable.

The reactive polymers can be either condensation or vinyl polymers as long as the requisite pendant crosslinkable and water-solubilizing sulfonate or sulfonic acid groups are connected to and arranged along the reactive polymer backbone. In most embodiments, the useful reactive polymers are vinyl polymers derived from appropriately selected ethylenically unsaturated polymerizable monomers using known free radical solution polymerization techniques and conditions, initiators, surfactants, catalysts, and solvents, all of which would be readily apparent to one skilled in the art from the teaching provided herein.

(a) Recurring Units Having Sulfonate or Sulfonic Acid Groups:

The reactive polymers used in the present invention comprise recurring units comprising sulfonic acid or sulfonate groups, or mixtures of both sulfonic acid and sulfonate groups. Such recurring units can be provided by polymerization of suitable ethylenically unsaturated polymerizable monomers containing such water-solubilizing groups such as vinyl sulfonic acid, styrene sulfonic acid, 2-acrylamido-2-methyl-1-propane sulfonic acid, 2-sulfoethyl methacrylate, 3-sulfopropyl methacrylate, styrene sulfonates, and 3-sulfopropyl acrylate. Partially or fully neutralized counterparts of such monomers are also often readily available and useful for certain polymer synthetic conditions.

Alternatively, such recurring units can be provided by polymerizing certain precursor ethylenically unsaturated polymerizable monomers that comprise pendant precursor groups that can in turn be reacted to provide the desired pendant sulfonic acid or sulfonate groups. For example, such monomers include but are not limited to, hydroxy or amino-containing compounds such as 2-hydroxyethyl acrylate, 2-hydroxyethyl methacrylate, 2-aminoethyl methacrylate, and 2-aminoethyl acrylate that can be reacted using a variety of sulfonating agents to provide the desired pendant sulfonic acid or sulfonate groups.

The recurring units described above having the sulfonic acid or sulfonate groups are present in the reactive polymers in an amount of at least 1 mol %, or more likely at least 5 mol % and up to and including 80 mol % or up to and including 95 mol %, all amounts based on the total recurring units in the reactive polymer.

Crosslinkable (b) Recurring Units:

The reactive polymers used in the present invention also comprise recurring units comprising a pendant group capable of crosslinking via [2+2] photocycloaddition when appropriately exposed to suitable radiation. While not limited to the following examples, such photosensitive crosslinkable groups can be chosen from one or more of the following classes of photosensitive crosslinkable groups, all of which can be connected to a recurring unit backbone that is derived from suitable ethylenically unsaturated polymerizable monomers:

(i) a photosensitive —C(=O)—CR=CR$^1$—Y group wherein R and R$^1$ are independently hydrogen or an alkyl group having 1 to 7 carbon atoms, a 5- to 6-membered cycloalkyl group, an alkoxy group having 1 to 7 carbon atoms, a phenyl group, or a phenoxy group, and Y is an aryl or heteroaryl group;

(ii) a photosensitive, non-aromatic unsaturated carbocyclic group;

(iii) a photosensitive, aromatic or non-aromatic heterocyclic group comprising a carbon-carbon double bond that is conjugated with an electron withdrawing group;

(iv) a photosensitive non-aromatic unsaturated heterocyclic group comprising one or more amide groups that are conjugated with a carbon-carbon double bond, which photosensitive non-aromatic unsaturated heterocyclic group is linked to the water-soluble backbone at an amide nitrogen atom, or (v) a photosensitive substituted or unsubstituted 1,2-diarylethylene group.

Multiple photosensitive crosslinkable groups can be present from the same or multiple different classes of the crosslinkable groups (i) through (v).

Upon exposure to suitable radiation having a $\lambda_{max}$ of at least 150 nm and up to and including 700 nm, or more likely exposure to radiation having a $\lambda_{max}$ of at least 150 nm and up to and including 450 nm, the noted photosensitive crosslinkable groups are electronically excited such that they can react with other pendant groups in the reactive polymer to form crosslinks for example as the product of photocycloaddition reactions.

The reactive polymers particularly become crosslinked among adjacent or proximate (molecularly near enough for [2+2] photocycloaddition crosslinking) crosslinkable groups during or after the noted irradiation. Thus, essential crosslinking can be accomplished using the reactive polymer without additional crosslinking agents. However, if desired, crosslinking can be further provided using distinct compounds that are dispersed as crosslinking agents within the compositions or layers comprising one or more reactive polymers. Such crosslinking agents react at either the crosslinkable groups or at other pendant groups such as carboxylic acid groups depending upon the chemical structure of crosslinking agent. For the pendant crosslinkable groups described herein, crosslinking is achieved by having at least two of such crosslinkable groups in proximity that can react with one another.

The crosslinkable [2+2] photocycloaddition groups incorporated into the reactive polymers can absorb photoexposing radiation as described above to form an electronically excited state that can undergo pericyclic ring formation to form stable covalent crosslinks. These crosslinks between the polymer chains cause the reactive polymer to become water-insoluble, although the water-insoluble reacted polymer can still absorb and transport water, ions, or other small molecules. The photoexposing radiation can be followed by additional curing or heating procedures (described below) to allow the excited [2+2] photocycloaddition groups to properly align with non-excited [2+2] photocycloaddition groups to form additional crosslinks. Curing can be shorted with higher temperatures.

The crosslinked, water-insoluble complex containing the crosslinked, water-insoluble reacted polymer can be crosslinked at a level that imparts water-insolubility and adhesion to a substrate, but still allows rapid diffusion of water, metal ions, and other small molecules. This type of water-compatible composition is sometimes referred to as a hydrogel. The diffusivity of the complex of crosslinked reacted polymer containing either reducible silver ions or silver nanoparticles can be controlled by the designing the level of crosslinking and the addition of hydrophobic recurring units such as the (c) and (d) recurring units described below.

The recurring units comprising the noted photosensitive crosslinkable [2+2] photocycloaddition groups can be present in the reactive polymers in an amount of at least 5 mol % or typically at least 5 mol % and up to and including 50 mol %, or even at least 10 mol % and up to and including 30 mol %, all amounts based on the total recurring units in the reactive polymer.

In the (i) class of pendant photosensitive, crosslinkable groups that can be present in recurring units arranged along the reactive polymer backbone can comprise —C(=O)—CR=CR$^1$—Y groups wherein R, R$^1$, and Y are defined as follows.

Specifically, R and R' can be independently hydrogen or substituted or unsubstituted alkyl groups having at least 1 to 7 carbon atoms (including substituted or unsubstituted methyl, ethyl, isopropyl, t-butyl, hexyl, and benzyl groups, and others that would be readily apparent to one skilled in the art), substituted or unsubstituted cycloalkyl group having 5 or 6 carbon atoms in the ring (such as cyclopentyl, cyclohexyl, 4-methylcyclohexyl, and others that would be readily apparent to one skilled in the art), substituted or unsubstituted phenyl groups (such as phenyl, tolyl, and xylyl groups, and others that would be readily apparent to one skilled in the art), substituted or unsubstituted alkoxy groups having 1 to 7 carbon atoms (such as methoxy, ethoxy, benzoxy, and others readily apparent to one skilled in the art), or substituted or unsubstituted phenoxy groups (such as phenoxy, 2,4-dimethylphenoxy, and others that would be readily apparent to one skilled in the art). In some embodiments, R and R$^1$ can also be nitro, cyano, or halogen groups.

More particularly, R and R$^1$ can be independently hydrogen or substituted or unsubstituted methyl, ethyl or phenyl groups, especially when Y is a substituted or unsubstituted phenyl group as described below.

Y can be a substituted or unsubstituted carbocyclic aryl group, or a substituted or unsubstituted heteroaryl group having one or more heteroatoms (oxygen, sulfur, or nitrogen) and sufficient carbon atoms to complete an aromatic heterocyclic ring. Such aromatic rings can have one or more substituents that do not adversely affect the desired behavior in the crosslinking reactions induced by the irradiation described herein.

Useful Y groups can be either heterocyclic or carbocyclic rings having desired aromaticity and any of these rings can be substituted with one or more substituents that do not adversely affect the function of the reactive polymer. Representative aromatic Y groups include but are not limited to, substituted or unsubstituted phenyl, naphthyl, anthracyl, 4-nitrophenyl, 2,4-dichlorophenyl, 4-ethylphenyl, tolyl, 4-dodecylphenyl, 2-nitro-3-chlorophenyl, 4-methoxyphenyl, 2-furyl, 2-thienyl, 3-indolyl, and 3-pyridyl rings. The substituted or unsubstituted phenyl rings are particularly useful including but not limited to phenyl, tolyl, xylyl, 4-methoxyphenyl, hydroxyphenyl, and chlorophenyl groups. Substituted or unsubstituted phenyl or 3-pyridyl groups are particularly useful Y groups.

The pendant groups comprising the crosslinkable and photosensitive —C(=O)—CR=CR$^1$—Y groups are therefore connected to the reactive polymer backbone by means of a single connecting bond or a linking group (R$^2$) as described below.

In particular, the essential recurring units comprising the noted crosslinkable groups can be derived from any ethylenically unsaturated polymerizable monomer having appropriate pendant groups comprising one or more crosslinkable —C(=O)—CR=CR$^1$—Y groups wherein R, R$^1$, and Y are as defined above.

More particularly, such recurring units can be further defined in reference to the following Structure (-A$_I$-) comprising crosslinkable groups:

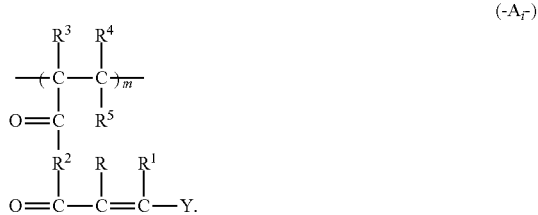

In Structure (-A$_I$-), R, R$^1$, and Y are as defined above. R$^2$ can be a divalent linking group including but are not limited to, substituted or unsubstituted alkylene (including haloalkylenes and cyanoalkylenes), alkyleneoxy, alkoxyalkylene, iminoalkylene, cycloalkylene, aralkylene, cycloalkylenealkylene, and aryloxyalkylene groups wherein the divalent hydrocarbon groups can comprise 1 to 20 carbon atoms (in either linear, branched, or cyclic form). A skilled worker in polymer chemistry would be able to design other useful linking groups using suitable number of carbon and hetero (oxygen, nitrogen, or sulfur) atoms in an order and arrangement that are chemically possible. Particularly useful $R^2$ divalent groups are substituted or unsubstituted alkylene groups such as substituted or unsubstituted ethylene or propylenes.

$R^3$, $R^4$, and $R^5$ can be independently hydrogen, a halogen, a substituted or unsubstituted alkyl group having 1 to 6 carbon atoms, a substituted or unsubstituted cyclohexyl group, or a substituted or unsubstituted phenyl group. In particular, $R^3$, $R^4$, and $R^5$ can be independently hydrogen, chloro, methyl, or ethyl groups.

Some particularly useful ethylenically unsaturated polymerizable monomers from which $-A_i-$ recurring units can be derived include:
2-cinnamoyl-ethyl methacrylate,
2-cinnamoyl-ethyl acrylate, and
2-[3-(3-pyridyl)acryloyl]ethyl methacrylate.

The $-A_i-$ recurring units can also be formed after formation of a water-soluble precursor reactive polymer having precursor $-A_i-$ recurring units. For example, a water-soluble precursor reactive polymer can be prepared with recurring units derived from vinyl alcohols or acrylate monomers having pendant hydroxyl groups, and the pendant hydroxyl groups can be reacted with cinnamoyl chloride (or similar substituted cinnamoyl-like chloride reactants) to form the desired $-A_i-$ (or similar) recurring units with pendant water-solubilizing sulfonic acid or sulfonate groups already present before the reaction to form the $-A_i-$recurring units.

(ii) Another class of useful photosensitive crosslinkable groups arranged along the reactive polymer backbone can comprise pendant photosensitive (crosslinkable), non-aromatic unsaturated carbocyclic groups including but not limited to, cyclopropene groups, cyclobutene groups, cyclopentadiene groups, cyclohexene groups, cyclohexadiene groups, cycloheptene groups, cycloheptadiene groups, cycloheptatriene groups, cyclooctene groups, indene groups, dihydronaphthalene groups, and norbornene groups. Any of these photosensitive groups can be substituted with one or more substituents that will not interfere with the desired properties of the reactive polymer. Where appropriate, such non-aromatic unsaturated carbocyclic groups can also contain one or more carbon-containing fused rings. The cyclopropene groups including the unsaturated cyclopropene groups can be particularly useful.

In general, such useful recurring units can be represented by the following Structure ($-A_{ii}-$):

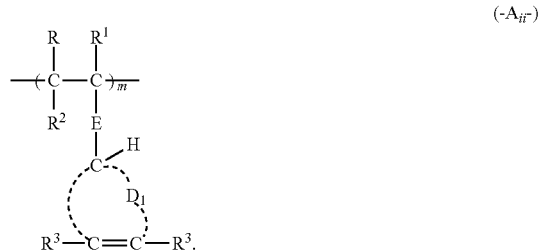

Specifically, R, $R^1$, and $R^2$ in Structure ($-A_{ii}-$) can be independently hydrogen or substituted or unsubstituted alkyl groups having at least 1 to 7 carbon atoms (including substituted or unsubstituted methyl, ethyl, isopropyl, t-butyl, hexyl, and benzyl groups, and others that would be readily apparent to one skilled in the art), substituted or unsubstituted cycloalkyl group having 5 or 6 carbon atoms in the ring (such as cyclopentyl, cyclohexyl, 4-methylcyclohexyl, and others that would be readily apparent to one skilled in the art), substituted or unsubstituted phenyl groups (such as phenyl, tolyl, and xylyl groups, and others that would be readily apparent to one skilled in the art), substituted or unsubstituted alkoxy groups having 1 to 7 carbon atoms (such as methoxy, ethoxy, benzoxy, and others readily apparent to one skilled in the art), or substituted or unsubstituted phenoxy groups (such as phenoxy, 2,4-dimethylphenoxy, and others that would be readily apparent to one skilled in the art). In some embodiments, R and $R^1$ can also be nitro, cyano, or halogen groups.

More particularly, R, $R^1$, and $R^2$ in Structure ($-A_{ii}-$) can be independently hydrogen or substituted or unsubstituted methyl, ethyl or phenyl groups, and more particularly, each of these groups is hydrogen or methyl.

E can be a divalent linking group including but not limited to, substituted or unsubstituted alkylene (including haloalkylenes and cyanoalkylenes), alkyleneoxy, alkoxyalkylene, iminoalkylene, cycloalkylene, aralkylene, cycloalkylenealkylene, aryloxyalkylene groups wherein the divalent hydrocarbon groups can comprise 1 to 20 carbon atoms (in either linear, branched, or cyclic form), carbonyloxy, oxycarbonyl, amido, keto, carbonate, carbamate, and urea. A skilled worker in polymer chemistry would be able to design other useful linking groups using suitable number of carbon and hetero (oxygen, nitrogen, or sulfur) atoms in an order and arrangement that are chemically possible. Particularly useful E divalent groups are substituted or unsubstituted alkylene groups such as substituted or unsubstituted ethylene or propylenes, or oxycarbonyl.

In Structure ($-A_{ii}-$), $D_1$ can represent the carbon atoms necessary to complete a three-membered to seven-membered non-aromatic unsaturated carbocyclic group (or ring), or particularly the carbon atoms necessary to complete a non-aromatic, unsaturated 3-membered to 7-membered carbocyclic group (or ring) such as a cyclopropene ring, a cyclobutene ring, a cyclopentene ring, a cyclohexene ring, or a cycloheptene ring. $D_1$ can also represent the saturated or unsaturated carbon atoms to provide an indene or dihydronaphthalene group, or polycyclic rings such as a norbornene group.

Moreover, in Structure ($-A_{ii}-$), $R^3$ can be hydrogen, a substituted or unsubstituted alkyl group having 1 to 12 carbon atoms (such as methyl, ethyl, isopropyl, amyl, hexyl, nonyl, decyl, and dodecyl), or a substituted or unsubstituted aryl group having 6 or 10 carbon atoms in the ring. Such groups can be substituted with one or more hydroxy, halogen, carbonyl, cyano, alkyl, or alkoxy groups.

In Structure ($-A_{ii}-$), m can represent the molar amounts of the recurring units that would satisfy the amounts described above for the water-soluble polymer.

Some particularly useful recurring units of this type represented by the following Structure ($-A_{ii2}-$) or ($-A_{ii3}-$):

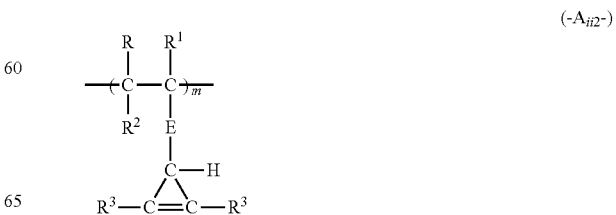

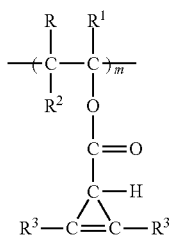

wherein R, $R^1$, $R^2$, $R^3$, and E are as defined above for Structure (-$A_i$-).

Some useful recurring units of this type can be derived from:
2-cyclopropene-1-carboxylic acid, 2,3-diphenyl-, 2-[(2-methyl-1-oxo-2-propen-1-yl)oxy]ethyl ester;
2-cyclopropene-1-carboxylic acid, 2,3-diphenyl-, 2-[(2-methyl-1-oxo-2-propen-1-yl)amino]ethyl ester;
4-(2,3-diphenyl-2-cyclopropene-1-carbonyloxy) styrene;
4-(2,3-diphenyl-2-cyclopropene-1-carbonylamino) styrene; and
4-(2,3-diphenyl-2-cyclopropene-1-carbonyloxy)ethane.

These recurring units can be derived from suitable ethylenically unsaturated polymerizable monomers that can then be polymerized under suitable conditions to provide useful reactive polymers.

Yet another class (iii) of photosensitive crosslinking groups in the reactive polymers comprise pendant photosensitive (crosslinkable), aromatic or non-aromatic heterocyclic groups, each of which comprises a carbon-carbon double bond (>C=C<) that is conjugated with one or more electron withdrawing groups. In many embodiments, the carbon-carbon double bond is conjugated with one or two of the same or different electron withdrawing groups, and in most embodiments, the carbon-carbon double bond is conjugated with only one electron withdrawing group.

It is to be understood that the pendant photosensitive, aromatic or non-aromatic heterocyclic groups can be single ring groups formed of carbon and hetero atoms (such as nitrogen, sulfur, and oxygen), or they can be fused ring groups with two or more fused rings formed from carbon and suitable heteroatoms.

Useful electron withdrawing groups that can be conjugated with the carbon-carbon double bond would be readily apparent to one skilled in the art as the term "electron withdrawing" in reference to a chemical group is well known in the art. However, it is particularly useful when such electron withdrawing groups include but are not limited to, carbonyl, ester, thioester, amide, imine, amidine, ether, thioether, and amine groups (or moieties). More generally, the photosensitive (crosslinkable) aromatic or non-aromatic heterocyclic group can be a cyclic group that comprises an α,β-unsaturated ketone, α,β-unsaturated lactone, α,β-unsaturated lactam, α,β-unsaturated ether, α,β-unsaturated thioether, or α,β-unsaturated amine group. Of these types of photosensitive (crosslinkable) aromatic or non-aromatic heterocyclic groups, those containing a carbonyl group are particularly useful.

For example, the reactive polymers can comprise pendant photosensitive, aromatic or non-aromatic heterocyclic groups selected from the group consisting of coumarin, thiocoumarin, quinone, benzoquinone, naphthoquinone, pyran, thiopyran, benzopyran, benzothiopyran, pyranone, thiopyranone, pyridinone, quinoline, and quinolinone groups. Of these photosensitive aromatic or non-aromatic heterocyclic groups, pendant photosensitive coumarin or quinolinone groups are useful and the pendant photosensitive coumarin groups are most useful because they can be readily prepared.

Any of the photosensitive aromatic or non-aromatic heterocyclic groups can be substituted with one or more substituents that will not interfere with the desired properties of the reactive polymer.

In general, useful recurring units can be represented by the following Structure (-$A_{iii}$-):

Specifically, in Structure (-$A_{iii}$-), R, $R^1$, and $R^2$ can be independently hydrogen or substituted or unsubstituted alkyl groups having at least 1 to 7 carbon atoms (including substituted or unsubstituted methyl, ethyl, isopropyl, t-butyl, hexyl, and benzyl groups, and others that would be readily apparent to one skilled in the art), substituted or unsubstituted cycloalkyl group having 5 or 6 carbon atoms in the ring (such as cyclopentyl, cyclohexyl, 4-methylcyclohexyl, and others that would be readily apparent to one skilled in the art), substituted or unsubstituted phenyl groups (such as phenyl, tolyl, and xylyl groups, and others that would be readily apparent to one skilled in the art), substituted or unsubstituted alkoxy groups having 1 to 7 carbon atoms (such as methoxy, ethoxy, benzoxy, and others readily apparent to one skilled in the art), or substituted or unsubstituted phenoxy groups (such as phenoxy, 2,4-dimethylphenoxy, and others that would be readily apparent to one skilled in the art). In some embodiments, R and $R^1$ can also be nitro, cyano, or halogen groups.

More particularly, R, $R^1$, and $R^2$ can be independently hydrogen or substituted or unsubstituted methyl, ethyl or phenyl groups, and more particularly, each of these groups can be hydrogen or methyl.

E in Structure (-$A_{iii}$-) can be a single bond or divalent linking group that can be connected to a carbon atom within $D_1$. Thus, while E appears to be connected directly to $D_1$, E can be connected to any carbon represented by $D_1$. For example, E can be a divalent linking group including but not limited to, substituted or unsubstituted alkylene (including haloalkylenes and cyanoalkylenes), alkyleneoxy, alkoxyalkylene, iminoalkylene, cycloalkylene, aralkylene, cycloalkylene-alkylene, aryloxyalkylene groups wherein the divalent hydrocarbon groups can comprise 1 to 20 carbon atoms (in either linear, branched, or cyclic form), carbonyloxy, oxycarbonyl, amido, keto, carbonate, carbamate, and urea. A skilled worker in polymer chemistry would be able to design other useful linking groups using suitable number of carbon and hetero (oxygen, nitrogen, or sulfur) atoms in an order and arrangement that are chemically possible. Particularly useful E divalent groups are substituted or unsubstituted alkylene groups such as substituted or unsubstituted ethylene or propylenes or oxycarbonyl.

In Structure (-$A_{iii}$-), $D_1$ represents the carbon and hetero (sulfur, oxygen, or nitrogen particularly) atoms necessary to complete a three-membered to fourteen-membered aromatic or non-aromatic heterocyclic group (or ring) that includes the carbon-carbon double bond shown in Structure (-A$_{iii}$-). However, it is essential that either D$_1$ or at least one of the R$^3$ groups (defined below) comprises at least one (and optionally more) electron withdrawing groups that are conjugated with the carbon-carbon double bond shown in Structure (-A$_{iii}$-).

D$_1$ can also represent the saturated or unsaturated carbon or hetero atoms to provide one or more fused rings such as naphthoquinone, benzopyran, benzothiopyran, benzopyran-2-one (coumarin), quinoline, and quinolinone polyrings. Other useful D$_1$ ring systems optionally comprising at least one electron withdrawing group that is conjugated with the carbon-carbon double bond would be readily apparent to one skilled in the art.

Moreover, in Structure (-A$_{iii}$-), R$^3$ is hydrogen, a substituted or unsubstituted alkyl group having 1 to 12 carbon atoms (such as methyl, ethyl, isopropyl, amyl, hexyl, nonyl, decyl, and dodecyl), a substituted or unsubstituted aryl group having 6 or 10 carbon atoms in the ring, a substituted or unsubstituted alkoxy group having 1 to 12 carbon atoms (such as methoxy, 2-ethoxy, t-butoxy, and n-hexoxy), substituted or unsubstituted aryloxy group having 6 or 10 carbon atoms in the ring (such as phenoxy and naphthoxy), cyano, halo, or carbonyl-containing group. Such carbonyl-containing groups include but are not limited to, aldehyde, ketone, carboxylic acid, ester, and amide groups. Such carbonyl-containing groups can be conjugated with the carbon-carbon double bond in Structure (-A$_{iii}$-)-.

In Structure (-A$_{iii}$-), m can represent the molar amounts of the noted recurring units as described above for the reactive polymers.

Some useful recurring units of this type can be derived from
7-(2-methacryloyloxyethoxy)-4-methylcoumarin,
7-(2-methacryloyloxyethoxy)-coumarin,
7-(3-methacryloyloxysulfopropyl)-4-methylcoumarin,
7-(methacryloyloxy)-4-methylcoumarin,
6-(methacryloyloxy)-4-methylcoumarin,
6-(2-methacryloyloxyethoxy)-4-methylcoumarin,
7-(2-methacryloyloxyethoxy)-quinoline-2-one,
7-(2-methacryloyloxyethoxy)-4-methylquinoline-2-one, and
5-(2-methacryloyloxyethoxy)-naphthoquinone.

The useful recurring units can be derived from suitable ethylenically unsaturated polymerizable monomers that can then be polymerized under suitable conditions to provide useful reactive polymers.

Yet another class (iv) comprises pendant photosensitive (crosslinkable), non-aromatic unsaturated heterocyclic groups, each of which non-aromatic unsaturated heterocyclic groups can comprise one or more amide groups [>N—C(=O)—], and each of the amide groups is arranged in the heterocyclic group (ring) in conjugation with a carbon-carbon double bond (>C=C<). In many embodiments, such heterocyclic groups have only one or two amide groups and the carbon-carbon double bond is conjugated with the one or two amide groups arranged within the non-aromatic unsaturated heterocyclic group (ring). In most embodiments, the carbon-carbon double bond is conjugated with the only one amide group in the non-aromatic unsaturated heterocyclic group (ring).

It is to be understood that the pendant photosensitive, non-aromatic unsaturated heterocyclic groups can be single ring groups formed of carbon and hetero atoms (such as nitrogen, sulfur, and oxygen), or they can be fused ring groups with two or more fused rings formed from carbon and suitable heteroatoms. In most embodiments, the photosensitive, non-aromatic unsaturated heterocyclic groups are single ring groups having 5 to 7 carbon and heteroatoms (usually nitrogen atoms) forming the ring. At least one, and likely two of the carbon atoms in the rings also form carbonyl (>C=O) groups.

Particularly useful reactive polymers can comprise pendant photosensitive, non-aromatic unsaturated heterocyclic groups selected from the group consisting of substituted or unsubstituted maleimide and thymine groups. Of these photosensitive non-aromatic unsaturated heterocyclic groups, the substituted maleimide groups are most useful because they can be readily prepared.

Any of the photosensitive non-aromatic unsaturated heterocyclic groups can be substituted with one or more substituents that will not interfere with the desired properties of the reactive polymer and the reactions necessary for cross-linking.

In general, useful recurring units can be represented by the following Structure (-A$_{iv}$-):

In Structure (-A$_{iv}$-), R, R', and R" can be independently hydrogen or substituted or unsubstituted alkyl groups having at least 1 to 7 carbon atoms (including substituted or unsubstituted methyl, ethyl, isopropyl, t-butyl, hexyl, and benzyl groups, and others that would be readily apparent to one skilled in the art), substituted or unsubstituted cycloalkyl group having 5 or 6 carbon atoms in the ring (such as cyclopentyl, cyclohexyl, 4-methylcyclohexyl, and others that would be readily apparent to one skilled in the art), substituted or unsubstituted phenyl groups (such as phenyl, tolyl, and xylyl groups, and others that would be readily apparent to one skilled in the art), substituted or unsubstituted alkoxy groups having 1 to 7 carbon atoms (such as methoxy, ethoxy, benzoxy, and others readily apparent to one skilled in the art), or substituted or unsubstituted phenoxy groups (such as phenoxy, 2,4-dimethylphenoxy, and others that would be readily apparent to one skilled in the art). In some embodiments, R, R', and R" can also be nitro, cyano, or halogen groups.

More particularly, R, R', and R" can be independently hydrogen or substituted or unsubstituted methyl, ethyl or phenyl groups, and more particularly, each of these groups can be hydrogen or methyl.

In Structure (-A$_{iv}$-), L can be a single bond or divalent linking group that can be connected to a nitrogen atom (as shown) within the photosensitive non-aromatic unsaturated heterocyclic group. For example, L can be a divalent hydrocarbon or aliphatic linking group that generally include 1 to 10 carbon, nitrogen, or oxygen atoms in the chain and can include but not limited to, substituted or unsubstituted alkylene (including haloalkylenes and cyanoalkylenes); alkyleneoxy; alkoxyalkylene; iminoalkylene; cycloalkylene;

aralkylene; cycloalkylene-alkylene; or aryloxyalkylene groups wherein the divalent hydrocarbon groups can comprise 1 to 20 carbon atoms (in either linear, branched, or cyclic form) and can be connected or interrupted with heteroatom-containing groups such as oxy, carbonyl, carbonyloxy, oxycarbonyl, amino, amido, carbonate, carbamate, and urea, or any combination thereof. A skilled worker in polymer chemistry would be able to design other useful linking groups using suitable number of carbon and hetero (oxygen, nitrogen, or sulfur) atoms in an order and arrangement that are chemically possible. Particularly useful L divalent groups are substituted or unsubstituted alkylene groups such as substituted or unsubstituted methylene, ethylene, or a propylene (any isomer), or such groups can be used in combination with an oxycarbonyl (such as from an acrylic acid ester group).

In Structure ($-A_{iv}-$), X represents the 1 to 3 carbon and heteroatoms (usually nitrogen atoms), which in combination with the remaining shown nitrogen and carbon atoms, complete a five- to seven-membered photosensitive non-aromatic unsaturated heterocyclic ring. In most embodiments, X represents at least one carbon atom (for example, a carbonyl carbon atom), or at least one carbon atom (for example, a carbonyl carbon atom) and at least one nitrogen atom such that the resulting amide group is conjugated with the shown carbon-carbon double bond.

In Structure ($-A_{iv}-$), $R^1$ and $R^2$ are independently hydrogen or a substituted or unsubstituted alkyl group having 1 to 10 carbon atoms (such as substituted or unsubstituted methyl, ethyl, isopropyl, amyl, hexyl, nonyl, and decyl groups), or a substituted or unsubstituted cycloalkyl group having 5 or 6 carbon atoms in the unsaturated carbocyclic ring (such as substituted cyclohexyl groups). $R^1$ and $R^2$ are likely to be the same group such as hydrogen, or unsubstituted methyl or unsubstituted ethyl groups.

Some particular useful representations of such recurring units are shown in the following Structures ($-A_{iv1}-$), ($-A_{iv2}-$), and ($-A_{iv3}-$)

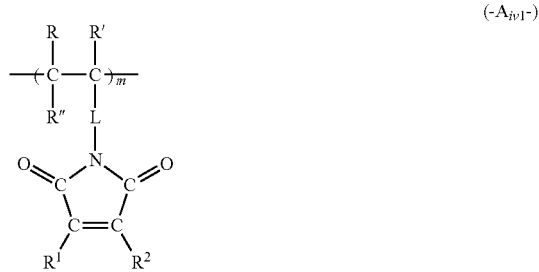

($-A_{iv1}-$)

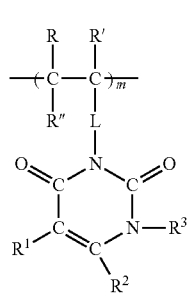

($-A_{iv2}-$)

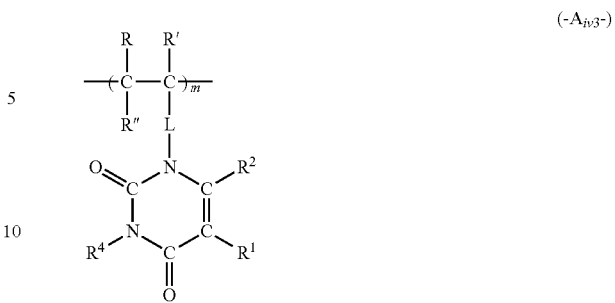

($-A_{iv3}-$)

wherein R, R', R", L, $R^1$, and $R^2$ are as defined above in Structure ($-A_{iv}-$) and m is defined below.

Moreover, in Structures ($-A_{iv2}-$) and ($-A_{iv3}-$), $R^3$ and $R^4$ are independently hydrogen, or substituted or unsubstituted alkyl groups or substituted or substituted cycloalkyl groups for example as used to define $R^1$ and $R^2$ shown above.

It should be understood that a reactive polymer used in this invention can comprise a variety of different photosensitive non-aromatic unsaturated heterocyclic groups in recurring units. For example, the reactive polymer can have recurring units represented by both Structures ($-A_{iv1}-$) and either ($-A_{iv2}-$) or ($-A_{iv3}-$). Alternatively, the reactive polymer can have recurring units represented by both Structures ($-A_{iv2}-$) and ($-A_{iv3}-$). Still again, the reactive polymer can have recurring units represented by all of Structure ($-A_{iv1}-$), ($-A_{iv2}-$), and ($-A_{iv3}-$).

Still another class (v) of useful photosensitive and crosslinkable pendant groups comprises photosensitive substituted or unsubstituted 1,2-diarylethylene groups. Such groups can be generally represented as —$Ar_1$-ethylene-$Ar_2$ wherein $Ar_1$ is a divalent, substituted or unsubstituted heterocyclic or carbocyclic aromatic group and $Ar_2$ is a monovalent, substituted or unsubstituted heterocyclic or carbocyclic aromatic group.

For example, some useful reactive polymers comprise pendant groups comprising photosensitive substituted or unsubstituted 1,2-diaryl ethylene groups selected from stilbene, styrylnaphthalene, styrylpyridine, styrylpyridinium, styrylquinoline, styrylquinolinium, styrylthiazole, styrylthiazolium, naphthrylphenyl (naphthylene-ethylene-phenyl), naphthrylpyridinium, naphthylthiazolium, 1-pyridyl-2-thiazolylethylene, and 1,2-pyridiylethylene groups. The pendant groups comprising photosensitive stilbene, styrylpyridinium, styrylquinoline, or styrylthiazolium groups are particularly useful.

Any of the photosensitive 1,2-diarylethylene groups can be substituted with one or more substituents that will not interfere with the desired properties of the reactive polymer and the reactions necessary for crosslinking.

In general, such useful recurring units can be represented by the following Structure ($-A_v-$) showing both reactive polymer backbone and pendant groups attached thereto:

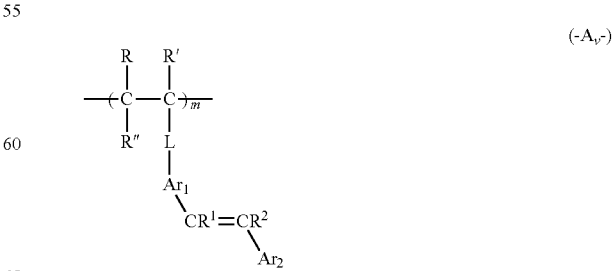

($-A_v-$)

In Structure ($-A_v-$), R, R', and R" can be independently hydrogen or substituted or unsubstituted alkyl groups having at least 1 to 7 carbon atoms (including substituted or unsubstituted methyl, ethyl, isopropyl, t-butyl, hexyl, and benzyl groups, and others that would be readily apparent to one skilled in the art), substituted or unsubstituted cycloalkyl group having 5 or 6 carbon atoms in the ring (such as cyclopentyl, cyclohexyl, 4-methylcyclohexyl, and others that would be readily apparent to one skilled in the art), substituted or unsubstituted phenyl groups (such as phenyl, tolyl, and xylyl groups, and others that would be readily apparent to one skilled in the art), substituted or unsubstituted alkoxy groups having 1 to 7 carbon atoms (such as methoxy, ethoxy, benzoxy, and others readily apparent to one skilled in the art), or substituted or unsubstituted phenoxy groups (such as phenoxy, 2,4-dimethylphenoxy, and others that would be readily apparent to one skilled in the art). In some embodiments, R, R', and R" can also be nitro, cyano, or halogen groups.

More particularly, R, R' and R" can be independently hydrogen or substituted or unsubstituted methyl, ethyl or phenyl groups, and more particularly, each of these groups can be hydrogen or substituted or unsubstituted methyl groups.

In Structure (-$A_v$-), L can be a single bond or divalent linking group that can be connected to a nitrogen atom (as shown) within the photosensitive non-aromatic unsaturated heterocyclic group. For example, L can be a divalent hydrocarbon or aliphatic linking group that generally include 1 to 10 carbon, nitrogen, or oxygen atoms in the chain and can include but not limited to, substituted or unsubstituted alkylene (including haloalkylenes and cyanoalkylenes); alkyleneoxy; alkoxyalkylene; iminoalkylene; cycloalkylene; aralkylene; cycloalkylene-alkylene; or aryloxyalkylene groups wherein the divalent hydrocarbon groups can comprise 1 to 20 carbon atoms (in either linear, branched, or cyclic form) and can be connected or interrupted with heteroatom-containing groups such as oxy, carbonyl, carbonyloxy, oxycarbonyl, amino, amido, carbonate, carbamate, and urea, or any combination thereof. A skilled worker in polymer chemistry would be able to design other useful linking groups using suitable number of carbon and hetero (oxygen, nitrogen, or sulfur) atoms in an order and arrangement that are chemically possible. Particularly useful L divalent groups can be substituted or unsubstituted alkylene groups such as substituted or unsubstituted methylene, ethylene, or a propylene (any isomer), or such groups can be used in combination with an oxycarbonyl (such as from an acrylic acid ester group), and aliphatic groups comprising a carbonyloxy group directly attached to the reactive polymer backbone.

Moreover, in Structure (-$A_v$-), $Ar_1$ is a divalent carbocyclic or heterocyclic aromatic group that can be substituted or unsubstituted. For example, $Ar_1$ can be substituted or unsubstituted phenylene, substituted or unsubstituted naphthylene, substituted or unsubstituted pyridinylene, substituted or unsubstituted quinolinylene, substituted or unsubstituted thiazolylene, substituted or unsubstituted pyridinium, substituted or unsubstituted quinolinium, or substituted or unsubstituted thiazolium. As would be understood by one skilled in the art, some of the useful $Ar_1$ groups can be quaternary aromatic rings wherein a nitrogen atom in the aromatic ring is optionally attached to L or is quaternized in a suitable manner, and suitable counterions can be present such as a trifluoromethylsulfonate counterion. When the $Ar_1$ rings are substituted, the one or more substituents can be any moiety that will not adversely affect the photosensitivity of the pendant group or any other properties intended for the reactive polymer. For example, useful substituents can include but are not limited to methyl groups and ethyl groups. Particularly useful $Ar_2$ groups are substituted or unsubstituted phenylene and pyridinium groups.

$Ar_2$ can be a substituted or unsubstituted carbocyclic or heterocyclic aromatic group as defined for $Ar_1$ except that $Ar_2$ is monovalent as shown in Structure (-$A_v$-). Particularly useful Are groups are substituted or unsubstituted phenyl, substituted or unsubstituted naphthalene, substituted or unsubstituted pyridine, substituted or unsubstituted pyridinium, substituted or unsubstituted quinoline, substituted or unsubstituted quinolinium, substituted or unsubstituted thiazole, and substituted or unsubstituted thiazolium groups, with substituted or unsubstituted phenyl, substituted or unsubstituted pyridinium, substituted or unsubstituted quinolinium groups, and substituted or unsubstituted thiazolium groups being particularly useful. Similarly to $Ar_1$, some of the $Ar_2$ aromatic rings can be quaternary aromatic rings having a positive nitrogen atom, and a suitable counterion, such as trifluoromethylsulfonate, is then present. A skilled worker in the art would readily know about other suitable counterions.

Moreover, In Structure (-$A_v$-), $R^1$ and $R^2$ are independently hydrogen or substituted or unsubstituted alkyl groups having 1 to 10 carbon atoms (such as substituted or unsubstituted methyl, ethyl, isopropyl, amyl, hexyl, nonyl, and decyl groups), or substituted or unsubstituted cycloalkyl groups having 5 or 6 carbon atoms in the unsaturated carbocyclic ring (such as substituted cyclohexyl groups). $R^1$ and $R^2$ are likely to be the same group such as hydrogen, or unsubstituted methyl or unsubstituted ethyl groups.

In some embodiments, the reactive polymer comprises recurring units represented by the following Structure (-$A_{v1}$-) also showing reactive polymer backbone to which pendant groups are attached:

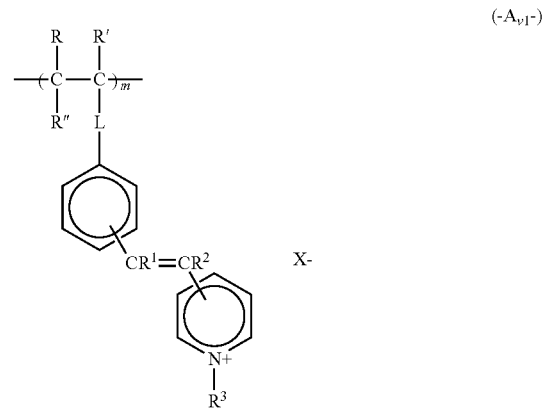

(-$A_{v1}$-)

wherein R, R', R" are as defined above and are particularly hydrogen or methyl, L is as described above and particularly comprises a carbonyloxy group directly attached to the backbone, $R^1$ and $R^2$ can be independently hydrogen, methyl, or ethyl, $R^3$ can be a suitable substituted or unsubstituted alkyl, substituted or unsubstituted cycloalkyl, or substituted or unsubstituted aryl group, $X^-$ can be a suitable counterion as described above, and m is as defined below.

In Structures (-$A_v$-) and (-$A_{v1}$-), m can represent the molar amounts of the recurring units as described above for the reactive polymers.

Some useful recurring units of this class can be derived from:

1-methyl-4-[2-(4-(2-methacryloxyethyl)-carbonyloxyphenyl)ethenyl]pyridinium trifluoromethylsulfonate;

1-methyl-4-[2-(4-(2-methacryloxyethyl)-carbonyloxyphenyl)ethenyl]quinolinium trifluoromethylsulfonate;

1-methyl-2-[2-(4-(2-methacryloxyethyl)-carbonyloxyphenyl)ethenyl]thiazolium trifluoromethylsulfonate;

4-[2-(4-(2-methacryloxyethyl)-carbonyloxyphenyl)ethenyl]pyridine; and 1-phenyl-2-[(4-(2-methacryloxyethyl)-carbonyloxyphenyl)]ethylene.

Such useful recurring units can be derived from suitable ethylenically unsaturated polymerizable monomers that can then be polymerized under suitable conditions to provide useful reactive polymers. More likely, such monomers are prepared by attaching a 1,2-diarylethylene group to a polymerizable acrylic group through a linking group by formation of an ester, amide or ether bond. For example 4-formylbenzoic acid can be easily condensed with 4-methylpyridine to form a styrylpyridine group with a carboxylic acid functionality suitable for attachment to a linking group on an acrylic monomer such as 2-hydroxyethylmethacrylate. The carboxylic acid and the hydroxyethyl groups can then be attached by a variety of ester forming reactions well known in the art including the known Mitsunobu reaction.

Optional (c) and (d) Recurring Units:

The reactive polymers used in the present invention can optionally comprise at least 1 mol % and up to and including 93 mol %, or typically at least 10 mol % and up to and including 70 mol %, of (c) recurring units comprising pendant amide, hydroxyl, lactam, phosphonic acid (or phosphonate), or carboxylic acid (or carboxylate) groups, all based on the total amount of recurring units in the reactive polymer. Recurring units comprising pendant hydroxyl, amide, or carboxylic acid groups are particularly useful. It is also useful to have (c) recurring units that comprise multiple different pendant groups from the noted list of pendant groups.

Useful pendant precursor groups include but are not limited to, anhydrides, alcohols, amines, lactam, lactone, amide, and ester groups that can be used to provide the various groups noted above for the (c) recurring units.

For example, useful (c) recurring units can be represented by the following Structure (-C-):

wherein B' represents a pendant amide, hydroxy, lactam, phosphonic acid, or carboxylic acid group or precursor groups that can be appropriately converted, which group can be directly attached to the reactive polymer backbone or it can be attached through a suitable divalent linking group.

For example, some useful ethylenically unsaturated polymerizable monomers from which the (c) recurring units can be derived include but are not limited to, (meth)acrylic acid, itaconic acid, maleic anhydride, fumaric acid, citraconic acid, vinyl benzoic acid, 2-carboxyethyl acrylate, 2-carboxyethyl methacrylate, (meth)acrylamide, N-vinyl pyrrolidone, 2-hydroxyethyl methacrylate, 2-aminoethyl methacrylate, vinyl phosphonic acid, N-isopropyl acrylamide, and dimethyl acrylamide.

In addition to the (a), (b), and (c) recurring units described above, the reactive polymers can optionally comprise one or more additional recurring units that are different from all (a), (b), and (c) recurring units, and herein identified as optional (d) recurring units, in an amount of less than 50 mol %, based on the total recurring units in the reactive polymer. Alternatively, (d) recurring units can be present with (a) and (b) recurring units but (c) recurring units are absent.

A skilled polymer chemist would understand how to choose such additional (d) recurring units, and for example, they can be derived from one or more ethylenically unsaturated polymerizable monomers selected from the group consisting of alkyl acrylates, alkyl methacrylates, styrene and styrene derivatives, vinyl ethers, vinyl benzoates, vinylidene halides, vinyl halides, vinyl imides, and other materials that a skilled worker in the art would understand could provide desirable properties to the reactive polymer. Such (d) recurring units can be represented by Structure (-D-) as follows:

wherein the pendant D groups in Structure (-D-) can be for example, hydrogen, substituted or unsubstituted alkyl groups, substituted or unsubstituted aryl groups, alkyl ester groups, aryl ester groups, halogens, or ether groups.

In addition, some (d) recurring units can comprise an epoxy (such as a glycidyl group) or epithiopropyl group derived for example from glycidyl methacrylate or glycidyl acrylate.

In the recurring units described above, R, R', and R" can be the same or different hydrogen, methyl, ethyl, or chloro groups and each type of recurring unit can have the same or different R, R', and R" groups along the reactive polymer backbone. In most embodiments, R, R', and R" are hydrogen or methyl, and R, R', and R" can be the same or different for the various (a), (b), (c), and (d) recurring units in a given reactive polymer.

In the Structures shown above, "m", "n", and "p" are used to represent the respective molar amounts of recurring units, based on the total recurring units in a given reactive polymer, so that the sum of m, n, and p equal 100 mol % in a given reactive polymer.

The mol % amounts of the various recurring units defined herein for the reactive polymers defined herein are meant to refer to the actual molar amounts present in the reactive polymers. It is understood by one skilled in the art that the actual mol % values may differ from those theoretically possible from the amount of ethylenically unsaturated polymerizable monomers that are used in the polymerization reaction solution. However, under most polymerization conditions that allow high polymer yield and optimal reaction of all monomers, the actual mol % of each monomer is generally within ±15 mol % of the theoretical amounts.

Some representative reactive polymer embodiments include but are not limited to, the following copolymers and terpolymers wherein the molar ratios are theoretical (nominal) amounts based on the actual molar ratio of ethylenically unsaturated polymerizable monomers used in the polymerization process. The actual molar amounts of recurring units can differ from the theoretical (nominal) amounts of monomers if the polymerization reactions are not carried out to completion.

Poly(3-sulfopropyl methacrylate potassium salt-co-2-cinnamoyl-ethyl methacrylate) (80:20 mol %);
Poly(3-sulfopropyl methacrylate potassium salt-co-2-cinnamoyl-ethyl methacrylate) (70:30 mol %);
Poly(3-sulfopropyl methacrylate potassium salt-co-2-cinnamoyl-ethyl methacrylate) (50:50 mol %);
Poly(3-sulfopropyl methacrylate potassium salt-co-methacrylic acid-co-2-cinnamoyl-ethyl methacrylate) (50:30:20 mol %);
Poly(3-sulfopropyl methacrylate-co-methacrylic acid-co-2-cinnamoyl-ethyl methacrylate) (30:50:20 mol %);
Poly(3-sulfopropyl methacrylate-co-methacrylic acid-co-2-cinnamoyl-ethyl methacrylate) (10:70:20 mol %);
Poly(3-sulfopropyl methacrylate-co-methacrylic acid-co-2-cinnamoyl-ethyl methacrylate) (5:75:20 mol %);
Poly(3-sulfopropyl methacrylate-co-methacrylic acid-co-2-cinnamoyl-ethyl methacrylate) (5:85:10 mol %);
Poly(3-sulfopropyl methacrylate-co-methacrylic acid-co-2-cinnamoyl-ethyl methacrylate) (5:90:5 mol %);
Poly(3-sulfopropyl methacrylate-co-methacrylic acid-co-2-cinnamoyl-ethyl methacrylate) (2:78:20 mol %);
Poly(3-sulfopropyl methacrylate-co-methyl methacrylate-co-2-cinnamoyl-ethyl methacrylate) (50:30:20 mol %);
Poly(3-sulfopropyl methacrylate-co-butyl methacrylate-co-2-cinnamoyl-ethyl methacrylate) (50:30:20 mol %);
Poly(3-sulfopropyl methacrylate-co-styrene-co-2-cinnamoyl-ethyl methacrylate) (70:10:20 mol %);
Poly(3-sulfopropyl methacrylate-co-methacrylic acid-co-butyl methacrylate-co-2-cinnamoyl-ethyl methacrylate) (10:60:10:20 mol %);
Poly(3-sulfopropyl methacrylate-co-methacrylic acid-co-styrene-co-2-cinnamoyl-ethyl methacrylate) (10:65:5:20 mol %);
Poly(3-sulfopropyl methacrylate potassium salt-co-acrylamide-co-2-cinnamoyl-ethyl methacrylate) (50:30:20 mol %);
Poly(3-sulfopropyl methacrylate potassium salt-co-acrylamide-co-2-cinnamoyl-ethyl methacrylate) (10:70:20 mol %);
Poly(3-sulfopropyl methacrylate potassium salt-co-2-hydroxyethyl metacrylate-co-2-cinnamoyl-ethyl methacrylate) (50:30:20 mol %);
Poly(3-sulfopropyl methacrylate potassium salt-co-2-hydroxyethyl metacrylate-co-2-cinnamoyl-ethyl methacrylate) (10:70:20 mol %);
Poly(3-sulfopropyl methacrylate potassium salt-co-maleic anhydride-co-2-cinnamoyl-ethyl methacrylate) (50:30:20 mol %);
Poly(3-sulfopropyl methacrylate potassium salt-co-maleic anhydride-co-2-cinnamoyl-ethyl methacrylate) (10:70:20 mol %);
Poly(3-sulfopropyl methacrylate potassium salt-co-N-vinyl-2-pyrrolidone-co-2-cinnamoyl-ethyl methacrylate) (50:30:20 mol %);
Poly(3-sulfopropyl methacrylate potassium salt-co-vinyl phosphonic acid-co-2-cinnamoyl-ethyl methacrylate) (50:30:20 mol %);
Poly(2-acylamide-2-methyl-1-propanesulfonic acid-co-2-cinnamoyl-ethyl methacrylate) (80:20 mol %);
Poly(2-acylamide-2-methyl-1-propanesulfonic acid-co-methacrylic acid-co-2-cinnamoyl-ethyl methacrylate) (50:30:20 mol %);
Poly(2-acylamide-2-methyl-1-propanesulfonic acid-co-methacrylic acid-co-2-cinnamoyl-ethyl methacrylate) (10:70:20 mol %);
Poly(2-acylamide-2-methyl-1-propanesulfonic acid-co-acrylamide-co-2-cinnamoyl-ethyl methacrylate) (50:30:20 mol %);
Poly(2-acylamide-2-methyl-1-propanesulfonic acid-co-2-hydroxyethyl methacrylate-co-2-cinnamoyl-ethyl methacrylate) (50:30:20 mol %);
Poly(2-acylamide-2-methyl-1-propanesulfonic acid-co-maleic anhydride-co-2-cinnamoyl-ethyl methacrylate) (50:30:20 mol %);
Poly(2-acylamide-2-methyl-1-propanesulfonic acid-co-N-vinyl-2-pyrrolidone-co-2-cinnamoyl-ethyl methacrylate) (50:30:20 mol %);
Poly(2-acylamide-2-methyl-1-propanesulfonic acid-co-vinyl phosphonic acid-co-2-cinnamoyl-ethyl methacrylate) (50:30:20 mol %);
Poly(styrene sulfonic acid sodium salt-co-2-cinnamoylethyl methacrylate) (80:20 mol %);
Poly(styrene sulfonic acid sodium salt-co-methacrylic acid-co-2-cinnamoylethyl methacrylate) (50:30:20 mol %);
Poly(3-sulfopropyl acrylate sodium salt-co-methacrylic acid-co-2-cinnamoylethyl methacrylate) (50:30:20 mol %);
Poly(2-sulfoethyl methacrylate sodium salt-co-methacrylic acid-co-2-cinnamoylethyl methacrylate) (50:30:20 mol %);
Poly(4-sulfobutyl methacrylate sodium salt-co-methacrylic acid-co-2-cinnamoylethyl methacrylate) (50:30:20 mol %);
Poly(3-sulfopropyl methacrylate potassium salt-co-7-(2-methacryloxyethoxy)-4-methylcoumarin) (80:20 mol %);
Poly(3-sulfopropyl methacrylate potassium salt-co-methacrylic acid-co-7-(2-methacryloxyethoxy)-4-methylcoumarin) (50:30:20 mol %);
Poly(3-sulfopropyl methacrylate potassium salt-co-methacrylic acid-co-7-(2-methacryloxyethoxy)-4-methylcoumarin) (30:50:20 mol %);
Poly(3-sulfopropyl methacrylate potassium salt-co-methacrylic acid-co-7-(2-methacryloxyethoxy)-4-methylcoumarin) (10:70:20 mol %);
Poly(3-sulfopropyl methacrylate potassium salt-co-acrylic acid-co-7-(2-methacryloxyethoxy)-4-methylcoumarin) (50:30:20 mol %);
Poly(3-sulfopropyl methacrylate potassium salt-co-acrylamide-co-7-(2-methacryloxyethoxy)-4-methylcoumarin) (50:30:20 mol %);
Poly(3-sulfopropyl methacrylate potassium salt-co-2-hydroxyethyl methacrylate-co-7-(2-methacryloxyethoxy)-4-methylcoumarin) (50:30:20 mol %);
Poly(3-sulfopropyl methacrylate potassium salt-co-maleic anhydride-co-7-(2-methacryloxyethoxy)-4-methylcoumarin) (50:30:20 mol %);
Poly(3-sulfopropyl methacrylate potassium salt-co-N-vinyl-2-pyrrolidone-co-7-(2-methacryloxyethoxy)-4-methylcoumarin) (50:30:20 mol %);
Poly(3-sulfopropyl methacrylate potassium salt-co-vinyl phosphonic acid-co-7-(2-methacryloxyethoxy)-4-methylcoumarin) (50:30:20 mol %);
Poly(3-sulfopropyl methacrylate potassium salt-co-N-vinyl-2-pyrrolidone-co-methacrylic acid-co-7-(2-methacryloxyethoxy)-4-methylcoumarin) (20:30:30:20 mol %);
Poly(styrene sulfonic acid sodium salt-co-7-(2-methacryloxyethoxy)-4-methylcoumarin) (80:20 mol %);

Poly(styrene sulfonic acid sodium salt-co-methacrylic acid-co-7-(2-methacryloxyethoxy)-4-methylcoumarin) (50:30:20 mol %);

Poly(2-acylamide-2-methyl-1-propanesulfonic acid-co-7-(2-methacryloxyethoxy)-4-methylcoumarin) (80:20 mol %);

Poly(2-acylamide-2-methyl-1-propanesulfonic acid-co-methacrylic acid-co-7-(2-methacryloxyethoxy)-4-methylcoumarin) (50:30:20 mol %);

Poly(3-sulfopropyl methacrylate-co-N-(2-(methacryloxy)ethyl) dimethylmaleimide-) (80:20 mol %);

Poly(3-sulfopropyl methacrylate-co-methacrylic acid-co-N-(2-(methacryloxy)ethyl) dimethylmaleimide-) (50:30:20 mol %);

Poly(3-sulfopropyl methacrylate-co-methacrylic acid-co-N-(2-(methacryloxy)ethyl) dimethylmaleimide-) (10:70:20 mol %);

Poly(styrene sulfonic acid sodium salt-co-methacrylic acid-co-N-(2-(methacryloxy)ethyl) dimethylmaleimide-) (50:30:20 mol %);

Poly (2-acylamide-2-methyl-1-propanesulfonic acid-co-methacrylic acid-co-N-(2-(methacryloxy)ethyl) dimethylmaleimide-) (50:30:20 mol %);

Poly [3-sulfopropyl methacrylate-co-3N-(2-(methacryloxy)ethylthymine] (80:20 mol %);

Poly [3-sulfopropyl methacrylate-co-methacrylic acid-co-3N-(2-(methacryloxy)ethyl-thymine] (50:30:20 mol %);

Poly(3-sulfopropyl methacrylate sodium salt-co-methacrylic acid-co-2-(2,3-diphenyl-2-cyclopropene-1-carbonyloxy) ethyl methacrylate) (50:30:20 mol %);

Poly(3-sulfopropyl methacrylate sodium salt-co-methacrylic acid-co-2-(2,3-diphenyl-2-cyclopropene-1-carbonyloxy) ethyl methacrylate) (10:70:20 mol %);

Poly(2-acrylamido-2-methyl-1-propanesulfonic acid -co-methacrylic acid-co-2-(2,3-diphenyl-2-cyclopropene-1-carbonyloxy) ethyl methacrylate) (10:70:20 mol %);

Poly(styrene sulfonic acid sodium salt-co-methacrylic acid-co-2-(2,3-diphenyl-2-cyclopropene-1-carbonyloxy) ethyl methacrylate) (10:70:20 mol %);

Poly[3-sulfopropyl methacrylate-co-1-methyl-4-[2-(4-(2-methacryloxyethyl)-carbonyloxyphenyl)ethenyl]pyridinium trifluoromethylsulfonate] (80:20 mol %);

Poly[3-sulfopropyl methacrylate-co-methacrylic acid-co-1-methyl-4-[2-(4-(2-methacryloxyethyl)-carbonyloxyphenyl)ethenyl]pyridinium trifluoromethylsulfonate] (10:70:20 mol %);

Poly[3-sulfopropyl methacrylate-co-methacrylic acid-co-1-methyl-4-[2-(4-(2-methacryloxyethyl)-carbonyloxyphenyl)ethenyl]quinolinium trifluoromethylsulfonate] (30:50:20 mol %);

Poly[3-sulfopropyl methacrylate-co-methacrylic acid-co-1-methyl-2-[2-(4-(2-methacryloxyethyl)-carbonyloxyphenyl)ethenyl]thiazolium trifluoromethylsulfonate-co-methacrylic acid] (20:60:20 mol %);

Poly[styrene sulfonic acid-co-methacrylic acid-co-1-methyl-4-[2-(4-(2-methacryloxyethyl)-carbonyloxyphenyl)ethenyl]pyridine] (50:30:20 mol %); and Poly[styrene sulfonic acid sodium salt-co-2-(4-(2-methacryloxyethyl)-carbonyloxyphenyl)ethenyl]phenyl] (80:20 mol %).

The reactive polymers useful in the invention generally have a molecular weight ($M_w$) of at least 20,000 and up to and including 1,000,000 as measured by gel permeation chromatography (GPC) or by size exclusion chromatography (SEC).

Preparation of the reactive polymers useful in the use of the present invention can be accomplished by free radical initiated polymerization in the appropriate reaction solvent combination. The proper choice of reaction solvents is desirable for successful polymerization because of the wide disparity in polarity between the various ethylenically unsaturated polymerizable monomers with the ethylenically unsaturated polymerizable monomers providing the (a) recurring units being very polar or negatively charged and water soluble and the ethylenically unsaturated polymerizable monomers that provide (b) recurring units being relatively non-polar and hydrophobic. It is typical to require up to three reaction solvents in combination to facilitate a well-controlled polymerization. Useful reaction solvents include but are not limited to, water, ketones such as methyl ethyl ketone, aprotic polar solvents such as N,N-dimethylacetamide, and alcohols such as isopropyl alcohol. Readily available free radical initiators such as 2,2'-azodi(2-methylbutyronitrile) (AMBN) or azobis(isobutyronitrile) (AIBN) generally work well in these preparations of the reaction polymers. The polymerization reaction is typically carried out at 60° C. to 75° C. for about 18 hours. Controlled or living radical polymerization methods (see for example, Qui et al., *Progress in Polymer Science* 26 (2001) 2083-2134) that can produce very narrow molecular weight distributions and highly controlled block copolymers could also be used.

Purification of useful reactive polymers is best accomplished by dialysis because of their high water solubility. Additional water can be added to the completed reaction mixture that is then placed in a dialysis bag with a typical retention of polymer chains with an $M_w$ of 3500 Daltons or more. The dialysis bag containing the crude reactive polymer is placed in a water washing bath for 1 to 2 days or longer if needed. After dialysis, the dilute reactive polymer solution can be concentrated by evaporation to about 10 to 20 weight % solids which is suitable for storage and dilution to desired coating concentrations.

Silver-Containing Compositions

The reactive polymers described herein can be incorporated into various silver-containing compositions described below. Such silver-containing compositions can be incorporated into the various articles described below or used in various methods as described below.

Each silver-containing composition described herein has only one essential component, that is, one or more reactive polymers (or crosslinked reacted polymers) as described above that are complexed with either reducible silver ions or reduced silver nanoparticles. The reactive polymers can be used to form crosslinked reacted polymers (rendered water-insoluble) upon exposure to radiation having $\lambda_{max}$ of at least 150 nm and up to and including 700 nm, or of at least 250 nm and up to and including 450 nm, as described below. While various other optional components can be included as described below, only the complex of reactive polymer and either reducible silver ions or silver nanoparticles is essential for providing the desired uses, articles, and methods.

Several embodiments of silver-containing compositions are provided for use in the present invention.

Silver-Containing Composition (A):

In one embodiment, a water-soluble, silver-containing composition comprises a water-soluble complex of a reactive polymer (as described above) with reducible silver ions. Such a silver-containing composition can also be considered a "silver precursor" composition that eventually can be used to provide silver metal (nanoparticles) within a polymeric complex.

One or more complexes of reactive polymers and reducible silver ions as described herein are generally present in silver-containing composition (A) (and in a resulting dry layer) in an amount of at least 10 weight % and up to and including 100 weight %, or typically at least 50 weight % and up to and including 100 weight %, based on the total solids in silver-containing composition (A).

The water-soluble complexes of silver ions (non-reduced silver) and reactive polymers for silver-containing composition (A) can be prepared by adding a highly soluble silver salt such as silver nitrate or silver acetate to an aqueous solution of a reactive polymer with stirring and for example, using controlled addition rates. The reducible silver ions will tend to bind with the sulfonate or sulfonic acid groups and optional carboxylic acid or carboxylate sites in the reactive polymer forming a silver-containing polymer complex or salt that is less soluble and more stable than the original nitrate salt but is still soluble in water. This unreduced form of the silver polymer complex is nearly colorless, and can be coated onto a suitable substrate and hardened or patterned using ultraviolet radiation. The silver ions in the uncoated solution or coatings can be reduced to form silver nanoparticles by contact (such as immersion) with a reducing agent as described below, or simply by exposure to UV or visible radiation and heat that can cause poor long-term stability. Oxidants such as iodate salts can be added to the formulation to reduce or eliminate the formation of reduced silver due to ambient light and heat. The spontaneous formation of silver nanoparticles using a reducing agent is observable because of the appearance of the strong yellow-orange color due to the surface plasmon resonance of the reduced silver nanoparticles in the resulting water-insoluble complex.

Silver-Containing Composition (B):

In another embodiment, a water-soluble silver-containing composition comprises a water-soluble complex of a reactive polymer (as described above) with silver nanoparticles. Such silver-containing compositions can be readily obtained, for example, by reducing the reducible silver ions in a silver-containing composition (A) described above. For example, this water-soluble composition can be obtained, for example, by reducing the silver ions in water-soluble, silver-containing composition (A) described above.

One or more complexes of reactive polymers and silver nanoparticles as described herein are generally present in silver-containing composition (B) (and in a resulting dry layer) in an amount of at least 10 weight % and up to and including 100 weight %, or typically at least 50 weight % and up to and including 100 weight %, based on the total solids in silver-containing composition (B).

As noted above, the water-soluble complexes of silver nanoparticles and reactive polymers for silver-containing composition (B) can be prepared by reducing the silver ions in silver-containing composition (A) containing the same reactive polymer. For example, starting with silver-containing composition (A), the rapid formation of a complex of reactive polymer and silver nanoparticles is easily accomplished by the careful addition of a silver ion reducing agent such as dimethylamine borane (DMAB) that is especially well suited to work at the inherent low pH of the polymer solutions. Other silver ion reducing agents are borohydrides (for example, sodium borohydride), hydrazine, hypophosphite (such as sodium hypophosphite), amines (such as tetramethylethylenediamine), aldehydes, and sugars can be used for this purpose if the pH of the composition is properly adjusted. Depending on the composition of the reactive polymer and formulation conditions, silver nanoparticles having an average diameter of at least 2 nm and up to and including 500 nm, or at least 5 nm and up to and including 300 nm can be formed and stably dispersed and complexed within the reactive polymer such that they can be filtered without removing the silver nanoparticles and the silver-containing composition (B) can be coated without forming particulate defects. The resulting complex of reactive polymer and silver nanoparticles can be strongly colored, especially for small particles with a narrow size distribution due to the strong surface plasmon resonance effect. The complex of reactive polymer and silver nanoparticles can again be dialyzed if necessary to remove any reaction products or salts produced as by-products during the formation of the complexes.

Alternatively, silver-containing composition (B) can be prepared by mixing silver nanoparticles from any commercial source in an aqueous solution of a reactive polymer with stirring until complexation occurs. The silver nanoparticles will tend to bind with the sulfonate or sulfonic acid groups and optional carboxylic acid or carboxylate sites in the reactive polymer forming a silver nanoparticle-polymer complex.

Silver-Containing Composition (C):

Yet another useful embodiment comprises a crosslinked water-insoluble silver-containing composition of a crosslinked reacted polymer with reducible silver ions. Such crosslinked reacted polymer can be derived from suitable photoexposure of a reactive polymer (as described above) that is complexed with reducible silver ions. Such silver-containing composition can be obtained, for example, by photoexposure of water-soluble, silver-containing composition (A) described above but before any appreciable silver ion reduction occurs. Alternatively, one can crosslink a reactive polymer as described herein and then imbibe or diffuse silver ions into it for complexation with the sulfonic acid and any carboxylic acid groups in the reacted polymer.

Silver-Containing Composition (D):

(D) Still another useful embodiment comprises a crosslinked silver-containing composition comprising a crosslinked water-insoluble complex of a crosslinked reacted polymer with silver nanoparticles. Such crosslinked reacted polymer can be derived from photoexposure as described herein of a reactive polymer (as described above) that is already complexed with silver nanoparticles (from appropriate reduction of reducible silver ions). This crosslinked composition can be derived for example, by photoexposure of silver-containing composition (B) described above; by both photoexposure and silver ion reduction, in any order, of composition (A) described above; or by silver ion reduction of silver-containing composition (C) described above. The resulting silver nanoparticles can have an average diameter of at least 2 nm and up to and including 500 nm, or at least 6 nm and up to and including 300 nm such that they can be formed and stably dispersed and complexed within the reactive polymer so that they can be filtered without removing the silver nanoparticles and the silver-containing composition (D) can be coated without forming particulate defects. Alternatively, one can diffuse a non-complexed solution of silver nanoparticles into the crosslinked reactive polymer where the silver nanoparticles will preferentially bind or complex with the sulfonic acid, carboxylic acid, or other groups.

Silver-containing compositions (A) through (D) generally do not include separate crosslinking agents or crosslinking agent precursors because the reactive polymer itself includes sufficient crosslinkable groups (described above). However, as noted above, if present, the (d) recurring units can also include additional crosslinking groups.

While not essential, it is sometimes desirable to enhance the sensitivity of some reactive polymers to longer wavelengths (for example, at least 250 nm and up to and including 700 nm, or at least 250 nm and up to and including 450 nm) by including one or more photosensitizers including triplet state photosensitizers. A variety of photosensitizers are known in the art such as benzothiazole and naphthothiazole compounds as described in U.S. Pat. No. 2,732,301 (Robertson et al.), aromatic ketones as described in U.S. Pat. No. 4,507,497 (Reilly, Jr.), and ketocoumarins, as described for example in U.S. Pat. No. 4,147,552 (Specht et al.) and U.S. Pat. No. 5,455,143 (Ali), the disclosures of all of which are incorporated herein by reference. Particularly useful photosensitizers for long UV and visible light sensitivity include but are not limited to, 2-[bis(2-furoyl)methylene]-1-methyl-naphtho[1,2-d]thiazoline, 2-benzoylmethylene-1-methyl-β-napthothiazoline, 3,3'-carbonylbis(5,7-diethoxycoumarin), 3-(7-methoxy-3-coumarinoyl)-1-methylpyridinium fluorosulfate, 3-(7-methoxy-3-coumarinoyl)-1-methylpyridinium 4-toluenesulfonic acid, and 3-(7-methoxy-3-coumarinoyl)-1-methylpyridinium tetrafluoroborate. Other useful compounds are described in Columns 6 and 7 of U.S. Pat. No. 4,147,552 (noted above) which compound disclosure is incorporated herein by reference. Thioxanthones are also particularly useful for sensitizing the type (iv) [2+2] photocycloaddition groups such as dimethylmaleide.

One or more photosensitizers can be present in a particular composition (and resulting dry layer) in an amount of at least 0.1 weight % and up to and including 10 weight %, or more likely at least 0.5 weight % and up to and including 5 weight %, based on the total solids in the silver-containing composition (or total dry weight of a layer of the silver-containing composition).

Silver-containing compositions (A) through (D) described herein can individually and optionally include one or more addenda such as film-forming compounds, surfactants, plasticizers, filter dyes, viscosity modifiers, and any other optional components that would be readily apparent to one skilled in the art, and such addenda can be present in amounts that would also be readily apparent to one skilled in the art.

The essential complexes of reactive polymer and either reducible silver ions or silver nanoparticles, and any optional compounds described above, are generally dissolved or dispersed in water or a mixture of water and water-miscible organic solvents to form a silver-containing composition that can be applied to a suitable substrate (described below) in a suitable manner. Useful water-miscible organic solvents include but are not limited to, alcohols such as methanol, ethanol, and isopropanol and polyols such as ethylene glycol, propylene glycol, and glycerol. The amounts of the complexes and any optional compounds in the aqueous-based silver-containing compositions can be readily determined by a skilled artisan for desired use in coating.

Inventive Articles

The reactive polymers and silver-containing compositions described above can be used to prepare a variety of articles that can be used for various purposes as described above, for example for antimicrobial purposes as well as for preparing electrically-conductive elements (or articles).

In all of these articles, a silver-containing composition can be disposed in a suitable manner onto one or multiple surfaces of a suitable substrate. For example, any of the silver-containing compositions described above can be applied to a suitable substrate using any suitable method including but not limited to, spin coating, bead coating, blade coating, curtain coating, or spray coating, from a suitable reservoir to form a polymeric layer. Useful substrates can be chosen for a particular use or method as long as the substrate material will not be degraded by the silver-containing composition or any treatments to which the resulting articles are subjected during the method of this invention. The silver-containing composition can be applied multiple times if desired to obtain a thicker coating, and dried between each coating or dried only after the last application. Water and any water-miscible organic solvents can be removed from the silver-containing composition using any suitable drying technique.

In general, the final dry coating of any silver-containing composition can have an average dry thickness of at least 10 nm and up to and including 1 mm, with a dry thickness of at least 0.1 µm and up to and including 100 µm being useful for various uses. Such coatings can be uniformly applied on a substrate surface or applied in a suitable patternwise fashion as described below.

Useful substrates can be composed of glass, quartz, and ceramics as well as a wide variety of flexible materials such as cellulosic papers and polymeric films composed of polyesters including poly(ethylene terephthalate) and poly(ethylene naphthalate), polycarbonates, polyamides, poly(meth)acrylates, or polyolefins. Useful polymeric substrates can be formed by casting or extrusion methods. Laminates of various substrate materials can also be put together to form a composite substrate. Any of the substrates can be treated to improve adhesion using for example corona discharge, oxygen plasma, ozone or chemical treatments using silane compounds such as aminopropyltriethoxysilane. The substrates can be of any suitable dry thickness including but not limited to at least 10 µm and up to and including 10 mm, depending upon the intended use of the resulting articles.

Particularly useful substrates are flexible substrates that are composed of poly(ethylene terephthalate) such as biaxially oriented poly(ethylene terephthalate) (PET) films. These PET films, ranging in dry thickness of at least 50 µm and up to and including 200 µm, can also comprise, on at least one supporting side, a polymeric primer layer (also known as a subbing layer, adhesive layer, or binder layer) that can be added prior to or after film stretching. Such polymeric primer layers can comprise poly(acrylonitrile-co-vinylidene chloride-co-acrylic acid), poly(methyl acrylate-co-vinylidene chloride-co-itaconic acid), poly(glycidyl methacrylate-co-butyl acrylate), or various water-dispersible polyesters, water-dispersible polyurethanes, or water-dispersible polyacrylics, as well as sub-micrometer silica particles. The dry thickness of the primer layer can be at least 0.1 µM and up to and including 1 µm.

In many embodiments of the present invention, each of the substrates can have an integrated transmittance of at least 80%, or at least 90% or even higher to provide articles that have excellent transparency. Such highly transparent substrates can be composed of glass (such as flexible glass) or polymeric films as described above.

The useful substrates can be in any suitable shape or size. They can be in the form of sheets, films, tubes, particles, or various 3-dimensional shapes depending upon the intended use. Some particularly useful substrates are in the form of continuous webs that can be unrolled from a stock roll, treated in some manner for example to apply a silver-containing composition followed by other treatments and then rolled up for shipment or later use in roll-to-roll manufacturing processes.

If a substrate is in the form of a sheet or roll, it typically has two opposing planar surfaces known herein as a "first supporting surface" and an "opposing second supporting surface". A silver-containing composition can be disposed in a suitable manner one or both supporting sides of the substrate such as only on the first supporting side, or the same or different silver-containing composition (such as silver-containing composition) can be disposed on both the first supporting side and the opposing second supporting side of the substrate.

In some embodiments, a precursor article can be prepared with a substrate and having a silver-containing composition [for example silver-containing composition (A) as described above] disposed on the substrate, for example on one or both supporting surfaces of a sheet or continuous web. This silver-containing composition can comprise a water-soluble complex of a reactive polymer (as described above) with reducible silver ions.

In other embodiments, a precursor silver ion-containing article can comprise a substrate and have disposed thereon (for example, in a patternwise fashion) a water-insoluble (crosslinked) silver-containing composition [for example, silver-containing composition (D) as described above], comprising a crosslinked water-insoluble complex of a crosslinked reacted polymer with reducible silver ions. Such crosslinked reacted polymer can be derived by photoexposure of a reactive polymer as described above. Such water-insoluble (crosslinked) silver-containing composition can be disposed on only the first supporting side of the substrate, but in other embodiments, the same or different water-insoluble complex can be disposed on both the first supporting side and the opposing second supporting side of the substrate. It still other embodiments, the same or different water-insoluble (crosslinked) silver-containing composition is disposed on both the first supporting side and the opposing second supporting side of the substrate in the same or different patternwise fashion (using means described below).

It is also possible to prepare precursor silver-containing articles that comprise a substrate and having disposed thereon a water-soluble silver-containing composition [for example, silver-containing composition (B) described above] comprising a water-soluble complex of a reactive polymer (described above) with silver nanoparticles. Such water-soluble silver-containing composition can be disposed on only the first supporting side of the substrate, but in other embodiments, the same or different water-insoluble complex can be disposed on both the first supporting side and the opposing second supporting side of the substrate. In still other embodiments, the same or different water-soluble complex is disposed on both the first supporting side and the opposing second supporting side of the substrate in the same or different patternwise fashion (using means described below). Such precursor silver-containing articles can also comprise a suitable photosensitizer (as described above) admixed with the water-soluble complex.

In still other embodiments, a silver-containing article can comprise a substrate and having disposed thereon a water-insoluble silver-containing composition [for example, the silver-containing composition (C) described above] comprising a crosslinked water-insoluble complex of a crosslinked reacted polymer with silver nanoparticles. This crosslinked reacted polymer can be derived from photoexposure of a reactive polymer as described above. Such water-insoluble (crosslinked) silver-containing composition can be disposed on only the first supporting side of the substrate, but in other embodiments, the same or different water-insoluble complex can be disposed on both the first supporting side and the opposing second supporting side of the substrate. It still other embodiments, the same or different water-insoluble (crosslinked) silver-containing composition is disposed on both the first supporting side and the opposing second supporting side of the substrate in the same or different patternwise fashion (using means described below).

As prepared using conditions described in more detail below, the silver-containing article can further comprise an electrically-conductive metal that has been electrolessly plated on the same or different crosslinked water-insoluble complex disposed on both the first supporting side and the opposing second supporting side of the substrate. This electrically-conductive metal is typically electrolessly plated on the crosslinked water-insoluble complex in which the silver nanoparticles serve as catalyst seed metal particles. For example, the electrolessly plated metal is typically copper, silver or other metals that can be catalyzed by silver nanoparticles.

The crosslinked water-insoluble complex can be disposed on the substrate in a patternwise fashion, and the silver-containing article can further comprise an electrically-conductive metal that has been electrolessly plated on the crosslinked water-insoluble complex in the same patternwise fashion so that only the pattern of the water-insoluble complex is electrolessly plated.

Methods for Making and Using Articles

The present invention provides various methods for providing articles as described above. For example, precursor articles described above can be prepared by disposing a silver-containing composition on a suitable substrate (as described above). The silver-containing composition comprises a water-soluble complex of a reactive polymer (as described above) with reducible silver ions. The silver-containing composition can be disposed in any suitable manner as described above, such as by using a flexographic printing member described below, in a uniform manner (over the entire supportive side or surface of the substrate) or in a patternwise fashion to provide any desired predetermined or random pattern on the supporting side. If the substrate has a planar shape, it will generally include two supporting sides opposite each other (for example, a first supportive side and an opposing second supporting side), and the silver-containing composition can be disposed in a suitable manner on one or both supporting sides (patternwise or uniformly).

It may also be possible to use the present invention to provide certain specifically designed patterns for optimal non-toxic bioadhesion control so that marine organisms are less likely to foul or adhere to the resulting article in which the reducible silver ions have been reduced to silver nanoparticles. Some of such patterns are sometimes identified as Sharklet™ patterns as described in U.S. Patent Application Publication 2010/0226943A1 identified above and the disclosure of which is incorporated herein by reference.

In other embodiments of the present invention, a method is used to provide an article comprising silver nanoparticles. This method comprises, firstly disposing a silver-containing composition (as described above) onto either or both supporting sides of a suitable substrate (as described above). Either immediately before or immediately after disposing the silver-containing composition onto the substrate, the reducible silver ions in the water-soluble complex are reduced (using chemistry described below) to form silver nanoparticles (average diameter described above, for example at least 2 nm and up to and including 500 nm) in the water-soluble complex. For example, the reducible silver ions can be reduced using an aqueous solution of dimethylborane, a borohydride, a hypophosphite, an amine, an aldehyde, or a sugar.

The resulting article can be stored for later use if desired, but in many embodiments, the water-soluble complex containing the silver nanoparticles is photoexposed using conditions described below (for example, using ultraviolet radiation having a $\lambda_{max}$ of at least 150 nm) to form a crosslinked, water-insoluble complex comprising the silver nanoparticles on one or both supporting sides of the substrate. For example, the water-soluble complex containing the silver nanoparticles can be photoexposed in a patternwise fashion on either or both supporting sides of the substrate. Alternative, the water-soluble complex containing the silver nanoparticles can be blanketwise (uniformly) photoexposed.

In some embodiments, this method further comprises, after photoexposing the water-soluble complex to form the crosslinked water-insoluble complex containing silver nanoparticles, heating the crosslinked water-insoluble complex containing silver nanoparticles at a temperature sufficient to further crosslink the crosslinked water-insoluble complex containing the silver nanoparticles. Conditions for this heating treatment are described below.

In addition, after photoexposing the water-soluble complex to form the crosslinked water-insoluble complex containing silver nanoparticles, the method can include removing any remaining non-photoexposed water-soluble complex from the substrate, for example, by washing with water or another aqueous solution for a sufficient time to remove at least 90 weight % of the non-photoexposed water-soluble complex.

With or without this removal of non-photoexposed water-soluble complex from the substrate, the crosslinked, water-insoluble complex containing silver nanoparticles, on either or both supporting sides of the substrate, can be electrolessly plated using an electrically-conductive metal using solutions and conditions as described in more detail below.

Thus, in some useful embodiments, the method can comprise:

patternwise photoexposing the water-soluble complex comprising silver nanoparticles to form a pattern of crosslinked water-insoluble complex comprising the silver nanoparticles, removing any remaining water-soluble complex from the substrate, and electrolessly plating the pattern of crosslinked water-insoluble complex comprising the silver nanoparticles using an electrically-conductive metal.

For example, in such methods, the silver-containing composition can be disposed on one or both supporting sides of the substrate in a patternwise fashion using a flexographic printing member.

In some particularly useful embodiments, the present invention can be used to prepare electrically-conductive patterns on both sides of a flexible continuous web, such as a continuous (roll) of polymeric substrate, for example in a roll-to-roll manufacturing operation. Thus, in such embodiments, the method for providing a "dual-sided" article, comprising disposing a silver-containing composition (as described above) onto a first supporting side of a suitable substrate (such as a continuous web). Either immediately before or immediately after disposing the silver-containing composition onto the first supporting side of the substrate, the reducible silver ions in the water-soluble complex can be reduced to form silver nanoparticles in the water-soluble complex on the first supporting side of the substrate using the reducing conditions and solutions described below. The same or different silver-containing composition can then be disposed in a suitable fashion onto an opposing second supporting side of the same substrate. Either immediately before or immediately after disposing the silver-containing composition onto the opposing second supporting side of the substrate, the reducible silver ions in the water-soluble complex can be reduced to form silver nanoparticles in the water-soluble complex on the opposing second supporting side of the substrate. Following these features, the water-soluble complex containing the silver nanoparticles on either or both of the first supporting side and opposing second supporting side of the substrate is photoexposed to form a crosslinked water-insoluble complex comprising the silver nanoparticles on either or both of the first supporting side and opposing supporting side of the substrate. It is also possible to remove any remaining water-soluble complex from both the first supporting side and the opposing second supporting side of the substrate.

In many of such embodiments, the method further comprises:

removing any remaining water-soluble complex from both the first supporting side and the opposing second supporting side of the substrate (for example, using a rinse with an aqueous solution), and electrolessly plating the crosslinked water-insoluble complex on either or both of the first supporting side and the second opposing supporting side of the substrate using an electrically-conductive metal (using electrolessly plating solutions and conditions described below).

In such embodiments, the method can also comprise:

photoexposing the water-soluble complex containing the silver nanoparticles on either or both of the first supporting side and the opposing second supporting side in a patternwise fashion on the substrate.

The photoexposing the water-soluble complex containing the silver nanoparticles on either or both of the first supporting side and the opposing second supporting side of the substrate can be blanketwise (uniformly), or in a patternwise fashion. The photoexposing can be carried out using ultraviolet radiation having a $\lambda_{max}$ of at least 150 nm.

After such features, the method can further comprise, after photoexposing the water-soluble complex on either or both of the first supporting side and the opposing second supporting side of the substrate to form the crosslinked water-insoluble complex containing silver nanoparticles, and optionally heating the crosslinked water-insoluble complex containing silver nanoparticles on either or both of the first supporting side and the opposing second supporting side of the substrate at a temperature sufficient to further crosslink the crosslinked water-insoluble complex containing the silver nanoparticles. The heating conditions are described in more detailed.

In other embodiments, the method can further comprise, after photoexposing the water-soluble complex on either or both of the first supporting side and the opposing second supporting side of the substrate to form the crosslinked water-insoluble complex containing silver nanoparticles, removing any remaining water-soluble complex from both of the first supporting side and opposing second supporting sides of the substrate, using water or another aqueous solution.

The reducing feature can be carried out on both supporting sides of the substrate using an aqueous solution of dimethylamine borane, a borohydride, a hypophosphite, an amine, an aldehyde, or a sugar.

The following discussion provides some details about representative electroless plating methods for use in the present invention.

In electroless plating methods, each aqueous-based "processing" solution, dispersion, or bath (for example, solutions containing electroless seed metal ions, reducing agent solutions, and solutions for electroless plating, as well as rinsing solutions) used at various points can be specifically designed with essential components as well as optional addenda readily apparent to one skilled in the art. For example, one or more of those aqueous-based processing solutions can include such addenda as surfactants, anti-coagulants, anti-corrosion agents, anti-foamants, buffers, pH modifiers, biocides, fungicides, and preservatives. The aqueous-based reducing solutions can also include suitable antioxidants.

Uniform or patternwise exposure can be carried out using radiation having a $\lambda_{max}$ of at least 150 nm and up to and including 700 nm or to radiation having a $\lambda_{max}$ of at least 250 nm and up to and including 450 nm. This exposure can be provided with any suitable exposing source or device that provides the desired radiation including but not limited to, various arc lamps and LED sources. The particular exposing source can be chosen depending upon the absorption characteristics of the composition used. The exposing radiation can be projected through lenses and mirrors or through a lens or mask element that can be in physical contact or in proximity with a water-soluble complex. Exposure time can range from a fraction (0.1) of a second and up to and including 10 minutes depending upon the intensity of the radiation source and the water-soluble silver-containing composition. Suitable masks can be obtained by known methods including but not limited to photolithographic methods, flexographic methods, or vacuum deposition of a chrome mask onto a suitable substrate such as quartz or high quality optical glass followed by photolithographic patterning.

It is optional but desirable to heat or bake an article simultaneously with or after the exposure but generally before removing the water-soluble silver-containing composition as described below, at a temperature sufficient to further crosslink the at least partially crosslinked water-soluble polymer. In most embodiments, this heating is carried out at least after the patternwise exposure, but it can be carried out both during and after the patternwise exposure. Such heating can be accomplished on a hot plate with vacuum suction to hold the article in close contact with the heating surface. Alternatively, the heating device can be a convection oven. The duration of the heating procedure is generally less than 10 minutes with heating for at least 10 seconds and up to and including 5 minutes being most likely. The optimal heating time and temperature can be readily determined with routine experimentation.

After the imagewise exposure and optional heating procedures, the water-insoluble complex comprising the reactive polymer and either reducible silver ions or silver nanoparticles can be removed from the substrate so that there is essentially none (less than 20%, and particularly less than 10%, by weight of the original amount) remaining on the substrate. This can be done by washing, spraying, or immersing the article in water, aqueous alkaline solution, or another aqueous solution for a suitable time and temperature to remove most or all water-soluble complex from the substrate. Contact with the aqueous solution can be carried out for a suitable time and temperature so that water-soluble complex is desirably removed in the non-exposed regions but little removal occurs in the exposed regions containing the crosslinked water-soluble complex. For example, the contact time can be at least 10 seconds and up to and including 10 minutes, and the contact temperature can be at room temperature (about 20° C.) and up to and including 95° C.

Reduction of the reducible silver ions at a suitable time can be done by contacting the complex containing such silver ions with a suitable reducing agent for the silver ions, for example by immersion within an aqueous-based reducing solution containing one or more reducing agents for a suitable time to cause sufficient silver ion reduction to silver nanoparticles. Alternatively, an aqueous-based reducing solution comprising the reducing agent can be sprayed or rolled uniformly onto a layer containing the reducible silver ions.

Useful reducing agents include but are not limited to, an organic borane, an aldehyde such as formaldehyde, aldehyde sugar, hydroquinone, or sugar (or polysaccharide) such as ascorbic acid, and metal ions such as tin(II). These reducing agents can be used individually or in combination, and the total amount in the aqueous-based reducing solution used for the reducing procedure can be at least 0.01 weight % and up to and including 20 weight % based on the total reducing solution weight. The amount of reducing agent to be used will depend upon the reducing agent to be used and this can be readily optimized using routine experimentation. The time and temperature for the reduction can also be readily optimized in the same manner. Generally, the reducing temperature is at least room temperature (about 20° C.) and up to and including 95° C. and the reducing time can be for at least 1 second and up to and including 30 minutes.

For example, some embodiments of the present invention can be carried out using an immersion bath comprising 1 reducing solution weight % of an organic borane such as dimethylamine borane (DMAB) at room temperature for up to 3 minutes. Longer or shorter times at higher temperatures are possible if needed.

After a reducing procedure, the complex containing the silver nanoparticles can be washed using distilled water or deionized water or another aqueous-based solution at a suitable temperature for a suitable time.

The resulting article can be immediately immersed in an aqueous-based electroless metal plating bath or solution, or the article can be stored with just the catalytic pattern comprising the silver nanoparticles as electroless seed metal particles for use at a later time.

For example, the article containing the silver nanoparticles in the crosslinked, water-insoluble complex can be contacted with an electroless plating metal that is the same as or different from the electroless seed silver nanoparticles. In most embodiments, the electroless plating metal is a different metal from the electroless seed silver nanoparticles.

Any metal that will likely electrolessly "plate" on the electroless seed silver nanoparticles can be used at this point, but in most embodiments, the electroless plating metal can be for example copper(II), silver(I), gold(IV), palladium(II), platinum(II), nickel(II), chromium(II), and combinations thereof. Copper(II), silver(I), and nickel(II) are particularly useful electroless plating metals.

The one or more electroless plating metals can be present in the aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure, the resulting product article can be removed from the aqueous-based electroless plating bath or solution and can again be washed using distilled water or deionized water or another aqueous-based solution to remove any residual electroless plating chemistry.

To change the surface of the electroless plated metal for visual or durability reasons, it is possible that a variety of post-treatments can be employed including surface plating of still at least another (third or more) metal such as nickel or silver on the electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, it may be desirable to treat the electrolessly plated metal with a seed metal catalyst in an aqueous-based seed metal catalyst solution to facilitate deposition of additional metals.

As one skilled in the art should appreciate, the individual treatment features or steps described above for these methods can be carried out two or more times before proceeding to the next procedure or step. For example, multiple treatments with an aqueous-based reducing solution or aqueous-based electroless metal plating solution can be carried out in sequence, using the same or different conditions. Sequential washing or rinsing steps can also be carried out where appropriate.

The present invention provides at least the following embodiments and combinations thereof, but other combinations of features are considered to be within the present invention as a skilled artisan would appreciate from the teaching of this disclosure:

1. A method for providing a silver-containing article, the method comprising:

disposing a silver-containing composition onto a first supporting side of a substrate, the silver-containing composition comprising a water-soluble complex of a reactive polymer with reducible silver ions, the reactive polymer comprising: (a) greater than 1 mol % of recurring units comprising sulfonic acid or sultanate groups, (b) at least 5 mol % of recurring units comprising a pendant group capable of crosslinking via [2+2] photocycloaddition, and optionally (c) at least 1 mol % of recurring units comprising a pendant amide, hydroxyl, lactam, phosphonic acid, or carboxylic acid group, all amounts based on the total recurring units in the reactive polymer.

2. The method of embodiment 1, wherein the reactive polymer comprises at least 5 mol % of the recurring units comprising sulfonic acid or sultanate groups based on the total amounts of recurring units in the reactive polymer.

3. The method of embodiment 1 or 2, wherein the reactive polymer comprises at least 5 mol % and up to and including 50 mol % of the recurring units comprising a pendant group capable of crosslinking via [2+2] photocycloaddition based on the total recurring units in the reactive polymer.

4. The method of any of embodiments 1 to 3, wherein the reactive polymer comprises at least 1 mol % and up to and including 93 mol % of recurring units comprising a pendant hydroxyl, amide, or carboxylic acid group, based on the total recurring units in the reactive polymer.

5. The method of any of embodiments 1 to 4, wherein the recurring units comprising a pendant group capable of crosslinking via [2+2] photocycloaddition comprise:

(i) a photosensitive —C(=O)—CR=CR$^1$—Y group wherein R and R' are independently hydrogen or an alkyl group having 1 to 7 carbon atoms, a 5- to 6-membered cycloalkyl group, an alkoxy group having 1 to 7 carbon atoms, a phenyl group, or a phenoxy group, and Y is an aryl or heteroaryl group;

(ii) a photosensitive, aromatic or non-aromatic unsaturated carbocyclic group;

(iii) a photosensitive, non-aromatic heterocyclic group comprising a carbon-carbon double bond that is conjugated with an electron withdrawing group;

(iv) a photosensitive non-aromatic unsaturated heterocyclic group comprising one or more amide groups that are conjugated with a carbon-carbon double bond, which photosensitive non-aromatic unsaturated heterocyclic group is linked to the water-soluble backbone at an amide nitrogen atom, or (v) a photosensitive substituted or unsubstituted 1,2-diarylethylene group.

6. The method of any of embodiments 1 to 5, wherein the reactive polymer is one of the following:

poly(3-sulfopropyl methacrylate potassium salt-co-2-cinnamoyl-ethyl methacrylate) (80:20 mol %);

poly(3-sulfopropyl methacrylate-co-methacrylic acid-co-2-cinnamoyl-ethyl methacrylate) (2:78:20 mol %);

poly(3-sulfopropyl methacrylate-co-methacrylic acid-co-2-cinnamoyl-ethyl methacrylate) (5:75:20 mol %);

poly(3-sulfopropyl methacrylate-co-methacrylic acid-co-2-cinnamoyl-ethyl methacrylate) (10:70:20 mol %);

poly(3-sulfopropyl methacrylate-co-methacrylic acid-co-2-cinnamoyl-ethyl methacrylate) (30:50:20 mol %);

poly(3-sulfopropyl methacrylate potassium salt-co-methacrylic acid-co-2-cinnamoyl-ethyl methacrylate) (50:30:20 mol %);

poly(3-sulfopropyl methacrylate potassium salt-co-2-hydroxyethyl methacrylate acid-co-2-cinnamoyl-ethyl methacrylate) (50:30:20 mol %);

poly(3-sulfopropyl methacrylate potassium salt-co-acrylamide-co-2-cinnamoyl-ethyl methacrylate) (50:30:20 mol %);

poly(3-sulfopropyl methacrylate potassium salt-co-N-vinyl-2-pyrrolidone-co-2-cinnamoyl-ethyl methacrylate) (50:30:20 mal %);

poly(3-sulfopropyl methacrylate potassium salt-co-maleic anhydride-co-2-cinnamoyl-ethyl methacrylate) (50:30:20 mol %);

poly(3-sulfopropyl methacrylate potassium salt-co-vinyl phosphonic acid-co-2-cinnamoyl-ethyl methacrylate) (50:30:20 mol %);

poly(2-acylamido-2-methyl-1-propanesulfonic acid-co-2-cinnamoyl-ethyl methacrylate) (80:20 mol %);

poly(2-acylamido-2-methyl-1-propanesulfonic acid-co-methacrylic acid-co-2-cinnamoyl-ethyl methacrylate) (50:30:20 mol %);

poly(2-acylamido-2-methyl-1-propanesulfonic acid-co-methacrylic acid-co-2-cinnamoyl-ethyl methacrylate) (10:70:20 mol %);

poly(styrene sulfonic acid sodium salt-co-2-cinnamoyl-ethyl methacrylate) (80:20 mol %);

poly(styrene sulfonic acid sodium salt-co-methacrylic acid-co-2-cinnamoyl-ethyl methacrylate) (50:30:20 mol %);

poly(3-sulfopropyl methacrylate potassium salt-co-7-(2-methacryloxyethoxy)-4-methylcoumarin) (80:20 mol %);

poly(3-sulfopropyl methacrylate potassium salt-co-methacrylic acid-co-7-(2-methacryloxyethoxy)-4-methylcoumarin) (50:30:20 mol %);

poly(3-sulfopropyl methacrylate potassium salt-co-methacrylic acid-co-7-(2-methacryloxyethoxy)-4-methylcoumarin) (10:70:20 mol %);

poly(styrene sulfonic acid sodium salt-co-7-(2-methacryloxyethoxy)-4-methylcoumarin) (80:20 mol %);

poly(styrene sulfonic acid sodium salt-co-methacrylic acid-co-7-(2-methacryloxyethoxy)-4-methylcoumarin) (50:30:20 mol %);

poly(2-acylamido-2-methyl-1-propanesulfonic acid-co-7-(2-methacryloxyethoxy)-4-methylcoumarin) (80:20 mol %);

poly(2-acylamido-2-methyl-1-propanesulfonic acid-co-methacrylic acid-co-7-(2-methacryloxyethoxy)-4-methylcoumarin) (50:30:20 mol %);

poly(2-acylamido-2-methyl-1-propanesulfonic acid-co-methacrylic acid-co-7-(2-methacryloxyethoxy)-4-methylcoumarin) (10:70:20 mol %);

poly(3-sulfopropyl methacrylate potassium salt-co-acrylamide-co-7-(2-methacryloxyethoxy)-4-methylcoumarin) (50:30:20 mol %);

poly(3-sulfopropyl methacrylate potassium salt-co-2-hydroxyethyl methacrylate-co-7-(2-methacryloxyethoxy)-4-methylcoumarin) (50:30:20 mol %);

poly(3-sulfopropyl methacrylate potassium salt-co-maleic anhydride-co-7-(2-methacryloxyethoxy)-4-methylcoumarin) (50:30:20 mol %);

poly(3-sulfopropyl methacrylate potassium salt-co-N-vinyl-2-pyrrolidone-co-7-(2-methacryloxyethoxy)-4-methylcoumarin) (50:30:20 mol %);

poly(3-sulfopropyl methacrylate potassium salt-co-N-vinyl-2-pyrrolidone-co-methacrylic acid-co-7-(2-methacryloxyethoxy)-4-methylcoumarin) (20:30:30:20 mol %);

poly (3-sulfopropyl methacrylate-co-N-(2-(methacryloxy)ethyl) dimethylmaleimide) (20:80 mol %);

poly (3-sulfopropyl methacrylate-co-methacrylic acid-co-N-(2-(methacryloxy)ethyl) dimethylmaleimide) (50:30:20 mol %);

poly (3-sulfopropyl methacrylate-co-methacrylic acid-co-N-(2-(methacryloxy)ethyl) dimethylmaleimide) (10:70:20 mol %);

poly (styrene sulfonic acid sodium salt-co-methacrylic acid-co-N-(2-(methacryloxy)ethyl) dimethylmaleimide) (50:30:20 mol %);

poly (styrene sulfonic acid sodium salt-co-methacrylic acid-co-N-(2-(methacryloxy)ethyl) dimethylmaleimide) (10:70:20 mol %);

poly (2-acylamido-2-methyl-1-propanesulfonic acid-co-methacrylic acid-co-N-(2-(methacryloxy)ethyl) dimethylmaleimide) (50:30:20 mol %);

poly (2-acylamido-2-methyl-1-propanesulfonic acid-co-methacrylic acid-co-N-(2-(methacryloxy)ethyl) dimethylmaleimide) (10:70:20 mol %);

poly(3-sulfopropyl methacrylate sodium salt-co-methacrylic acid-co-2-(2,3-diphenyl-2-cyclopropene-1-carbonyloxy) ethyl methacrylate) (10:70:20 mol %);

poly(styrene sulfonic acid sodium salt-co-methacrylic acid-co-2-(2,3-diphenyl-2-cyclopropene-1-carbonyloxy) ethyl methacrylate) (10:70:20 mol %); and poly(2-acrylamido-2-methyl-1-propanesulfonic acid-co-methacrylic acid-co-2-(2,3-diphenyl-2-cyclopropene-1-carbonyloxy) ethyl methacrylate) (10:70:20 mol %).

7. The method of any of embodiments 1 to 6, wherein the silver-containing composition further comprises a photosensitizer.

8. The method of any of embodiments 1 to 7, wherein the substrate has an integrated transmittance of at least 90%.

9. The method of any of embodiments 1 to 8, comprising disposing the silver-containing composition onto a supporting side of the substrate in a patternwise fashion.

10. The method of embodiment 9, comprising disposing the silver-containing composition onto a supporting side of the substrate in a patternwise fashion using a flexographic printing member.

11. The method of any of embodiments 1 to 8, comprising disposing the silver-containing composition onto a supporting side of the substrate in a uniform fashion.

12. The method of any of embodiments 1 to 11, further comprising:
either immediately before or immediately after disposing the silver-containing composition onto the substrate, reducing the reducible silver ions in the water-soluble complex to form silver nanoparticles in the water-soluble complex.

13. The method of embodiment 12, further comprising:
after reducing the reducible silver ions, photoexposing the water-soluble complex containing the silver nanoparticles to form a crosslinked water-insoluble complex comprising the silver nanoparticles.

14. The method of any of embodiments 1 to 13, comprising:
photoexposing the water-soluble complex containing the silver nanoparticles in a patternwise fashion on the substrate.

15. The method of any of embodiments 1 to 14, comprising:
reducing the silver ions in the water-soluble complex to form silver nanoparticles having an average diameter of at least 2 nm and up to and including 500 nm.

16. The method of any of embodiments 14 or 15, further comprising:
after photoexposing the water-soluble complex to form the crosslinked water-insoluble complex containing silver nanoparticles,
heating the crosslinked water-insoluble complex containing silver nanoparticles at a temperature sufficient to further crosslink the crosslinked water-insoluble complex containing the silver nanoparticles.

17. The method of any of embodiments 14 to 16, further comprising, after photoexposing the water-soluble complex to form the crosslinked water-insoluble complex containing silver nanoparticles,
removing any remaining water-soluble complex from the substrate.

18. The method of any of embodiments 12 to 17, comprising reducing the reducible silver ions in the water-soluble complex using an aqueous solution of dimethyl borane, a borohydride, a hypophosphite, an amine, an aldehyde, or a sugar.

19. The method of any of embodiments 12 to 18, further comprising:
   electrolessly plating the crosslinked water-insoluble complex using an electrically-conductive metal.

20. The method of any of embodiments 1 to 19, comprising:
   disposing the silver-containing composition onto the first supporting side of a substrate,
   either immediately before or immediately after disposing the silver-containing composition onto the first supporting side of the substrate, reducing the reducible silver ions in the water-soluble complex to form silver nanoparticles in the water-soluble complex on the first supporting side of the substrate,
   disposing the same or different silver-containing composition onto an opposing second supporting side of the substrate,
   either immediately before or immediately after disposing the silver-containing composition onto the opposing second supporting side of the substrate, reducing the reducible silver ions in the water-soluble complex to form silver nanoparticles in the water-soluble complex on the opposing second supporting side of the substrate, and
   photoexposing the water-soluble complex containing the silver nanoparticles on either or both of the first supporting side and opposing second supporting side of the substrate, to form a crosslinked water-insoluble complex comprising the silver nanoparticles on either or both of the first supporting side and opposing supporting side of the substrate, and
   optionally, removing any remaining water-soluble complex from both the first supporting side and the opposing second supporting side of the substrate.

21. The method of embodiment 20 further comprising:
   removing any remaining water-soluble complex from both the first supporting side and the opposing second supporting side of the substrate, and
   electrolessly plating the crosslinked water-insoluble complex on either or both of the first supporting side and the second opposing supporting side of the substrate using an electrically-conductive metal.

22. The method of embodiment 20 or 21, comprising:
   photoexposing the water-soluble complex containing the silver nanoparticles on either or both of the first supporting side and the opposing second supporting side in a pattern-wise fashion on the substrate.

23. The method of any of embodiments 20 to 22, comprising:
   reducing the silver ions in the water-soluble complex on either or both the first supporting side and the opposing second supporting side to form silver nanoparticles having an average diameter of at least 2 nm and up to and including 500 nm.

24. The method of any of embodiments 1 to 23, wherein the substrate is a continuous web of transparent polymeric film having an integrated transmittance of at least 80%.

The following Examples are provided to illustrate the practice of this invention and are not meant to be limiting in any manner.

Synthesis of
7-(2-Methacryloyloxyethoxy)-4-methylcoumarin 5.44 g of 4-Methylumbelliferone (7-hydroxy-4-methyl-coumarin) was suspended in 150 ml of tetrahydrofuran (THF) and 4.42 g of 2-hydroxyethyl methacrylate were added, followed by 8.42 g of triphenylphosphine. The solids slowly dissolved with stirring at room temperature under nitrogen. Then, 6.37 g of diisopropyl azodicarboxylate were added drop-wise while the temperature was kept below 25° C. The reaction solution was stirred overnight at room temperature.

Most of the solvent was evaporated and then ether was added to precipitate a white solid that was put into a freezer for a few hours. The solid was collected by filtration and rinsed with ether, and dried on the filter to obtain 12.14 g of a white solid that was purified by chromatography (silica gel: 50/50 ethyl acetate/methylene chloride). This procedure provided a white solid that was slurried with heptane and filtered and dried on the filter to provide a total of 6.77 g of the desired monomer.

Alternative Synthesis of
7-(2-Methacryloyloxyethoxy)-4-methylcoumarin
Monomer 15.3 g of 4-methylumbelliferone (7-hydroxy-4-methyl-coumarin) was dissolved in about 300 ml of dimethylacet-amide (DMA) in a 3-neck 1 liter flask with an overhead stirrer. 48 g of potassium carbonate, 20.8 g of 2-((methyl-sulfonyl)oxy)ethyl methacrylate prepared from 2-hydroxy-ethyl methacrylate using standard procedures, and 1.66 g of potassium iodide were then added and the mixture was heated in an oil bath at 70° C. about 18 hours. Thin layer chromatography was used to determine that the reaction was complete. The reaction solution was cooled and poured into about 1 liter of water, stirred for about an hour, and the precipitate was filtered. The precipitate was rinsed with another 1 liter of water then heptane and dried on the filter. The desired product was confirmed by NMR. A portion of the product was further purified by silica gel chromatography with ethyl acetate. The ethyl acetate was removed by evaporation and the product was crystallized from heptane to obtain a white powder.

Synthesis of 2-Cinnamoyl-ethyl Methacrylate
Monomer

To a 500 ml, 3 neck round-bottomed flask equipped with a condenser and magnetic stir bar, 2-hydroxyethyl methacrylate, (11.30 g, 0.0868 mole) (Mw=130.14 g/mole), dichloromethane (DCM) (60 g), and triethylamine (Mw=101.19 g/mole) (8.50 g, 0.084 mole) were added. This solution was stirred until it was homogenous and then it was placed in an ice bath. A solution of cinnamoyl chloride (Mw=166.6 g/mole) (13.33 g, 0.080 mole) dissolved in 30 g of DCM was added slowly dropwise over 15 minutes. After this addition, the reaction solution was allowed to come to room temperature and then placed in oil bath at 40° C. and refluxed for 60 minutes to complete the reaction. The solution was then cooled and removed from the oil bath and the resulting amine hydrochloride precipitate was filtered off. Additional DCM was added and the solution was placed in a separatory funnel, the filtered solution was washed twice with sodium bicarbonate, then twice with distilled water, once with dilute hydrochloric acid solution, and then twice with distilled water. The organic layer was place over magnesium sulfate for 30 minutes and filtered. The DCM was removed and the remaining product was placed under high vacuum at room temperature overnight to remove any residual DCM. The final product was a clear oil with a yellow tint with an Mw of 260.29 g/mole. The product purity was verified by NMR.

Synthesis of 2-(2,3-diphenyl-2-cyclopropene-1-carboxyl)ethyl Methacrylate Monomer Crude 2,3-diphenylcyclopropene-1-carboxylic acid was purified by recrystallization (hot filtered) using acetone. The carboxylic acid (8.0 g, 0.034 moles) was suspended in about 100 ml of dichloromethane in a 250 ml single-neck round-bottom flask equipped with a condenser and stirred magnetically under nitrogen. A 2 molar solution (21 ml) of oxalyl chloride in dichloromethane (5.37 g, 0.042 moles) was added dropwise at room temperature and then a few drops of N,N-dimethylformamide were added to help promote the reaction (gas evolution of HCl, CO, and $CO_2$ began). The reaction solution was stirred at room temperature for about 5 hours while the reaction was monitored by thin layer chromatography (the solid slowly dissolved while reacting). The reaction solution became a clear yellow in color when all solid had dissolved. The solvent(s) was evaporated and the residue was re-crystallized in hexane with a small amount of ethyl acetate (hot filtered) in the freezer overnight and 6.90 g (80% yield) of off-white crystals of diphenylcyclopropene carboxylic acid chloride were collected.

The resulting diphenylcyclopropene carboxylic acid chloride (6.90 g, 0.027 mole) was dissolved in 30 ml of dichloromethane and the solution was added dropwise at room temperature to a solution of 2-hydroxyethyl methacrylate (3.88 g, 0.030 mole) and triethylamine (2.88 g, 0.028 mole) dissolved in 50 ml of dichloromethane in a 250 ml single-neck flask. The resulting reaction solution was stirred at room temperature under nitrogen overnight. Water was then added to the reaction solution and extracted three times with dichloromethane. The combined organics were washed twice with water, dried over magnesium sulfate, and evaporated to dryness. Methanol was then added to the oil that remained and the solution was set in a freezer overnight to crystallize after which 6.45 g (68%) of beige crystals were collected and another 1.07 g was obtained from the filtrate for a total yield of 7.52 g (80%). The combined solid was purified by chromatography (silica gel: 95/5 dichloromethane/methanol) and 4.35 g (46%) of off-white crystals of the expected ethylenically unsaturated polymerizable monomer were collected and kept frozen until used for preparation of a reactive polymer.

Synthesis of N-(2-(methacryloxy)ethyl) dimethylmaleimide Monomer

N-(2-hydroxyethyl)maleimide was prepared in toluene from dimethylmaleic anhydride and ethanolamine using conventional methods. N-(2-hydroxyethyl)maleimide (10.15 g) and 6.68 g of triethylamine were dissolved in 100 ml of dichloromethane (DCM). Methacryloyl chloride (7 ml) diluted with DCM was added slowly with stirring to avoid heating. The triethylamine hydrochloride precipitate formed and the reaction solution was held for an additional 6 hours. The reaction solution was washed twice with 200 ml aliquots of dilute sodium bicarbonate, then 2 additional washings were carried out using distilled water and then the phases were allowed to separate. The DCM phase was dried over anhydrous magnesium sulfate. The DCM was evaporated to obtain a clear liquid suitable for polymerization. The expected ethylenically unsaturated monomer structure was confirmed by NMR.

COMPARATIVE EXAMPLES

Preparation of Comparative Polymer A from Methacrylic acid and 2-Cinnamoyl-ethyl Methacrylate (80:20 mol % Ratio)

5.17 g of methacrylic acid, 3.90 g of 2-cinnamoyl-ethyl methacrylate, and 0.09 g of AMBN polymerization initiator were weighed out into a 100 ml single-neck round bottom flask and suspended in 36.3 g of N,N-dimethyl acetamide (DMA) and purged with nitrogen for 30 minutes. The flask was capped with a septum and set into a preheated oil bath at 75° C. overnight with magnetic stirring. After about 18 hours, the reaction mixture had become clear, colorless, and viscous. It was cooled and the contents of the flask were added to about 500 ml of ethyl acetate with overhead stirring. The solid was collected by filtration, dried in a 40° C. oven, redissolved in DMA at about 25 weight % solids, and precipitated again in ethyl acetate. The precipitate was filtered and then dried in a vacuum oven. A 13 weight % aqueous solution was prepared by neutralizing 50 mol % of the methacrylic acid with a 2 weight % sodium hydroxide solution. The weight average molecular weight ($M_w$) of the resulting polymer was 262,000 as determined by size exclusion chromatography (SEC).

Preparation of Comparative Polymeric Silver Ion Complex A

A 5.0 g solution of a silver ion complex of Comparative Polymer A (containing no sulfonate groups) was prepared as follows:

3.27 g of the 13 weight % Comparative Polymer A solution was combined with 0.71 g of distilled water followed by the addition of 0.614 g of 2 molar silver nitrate added slowly with stirring forming a clear solution. A solid gel formed, demonstrating that a soluble polymer-silver ion complex could not be prepared using Comparative Polymer A.

Preparation of Comparative Polymer B from 3-Sulfopropyl

Methacrylate, Methacrylic acid, and 2-Cinnamoyl-ethyl Methacrylate (1:79:20 mol % Ratio)

2.55 g of methacrylic acid, 0.09 g of 3-sulfopropyl methacrylate, 1.95 g of 2-cinnamoyl-ethyl methacrylate, and 0.046 g of AMBN polymerization initiator were weighed out into a 100 ml single-neck round bottom flask and suspended in a solvent mixture of 6.12 g of water, 6.12 g of methyl ethyl ketone, and 6.12 g of isopropyl alcohol. The resulting reaction mixture was purged with nitrogen for 30 minutes and the flask was capped with a septum and set in a preheated oil bath at 70° C. overnight with magnetic stirring. The reaction solution was cooled, additional water was added, and the contents of the flask were placed in a dialysis bag and dialyzed for 3 days. A gel-like precipitate formed during dialysis. A 2 weight % sodium hydroxide solution was added to neutralize 50 mol % of the available acid groups and a clear solution formed that was concentrated to 7.75 weight % solids by evaporation. The weight average molecular weight ($M_w$) of the resulting polymer was 567,000 as determined by size exclusion chromatography (SEC). The precipitation of this polymer during dialysis indicates that the 1 mol % of 3-sulfopropyl methacrylate recurring units was not adequate to maintain the solubility of the resulting polymer without neutralizing some of the acid groups.

Preparation of Comparative Polymeric Silver Ion Complex B

A 5.0 g solution of the silver ion complex of Comparative Polymer B containing 1 mol % of sulfopropyl recurring units was prepared as follows:

4.125 g of the 7.76 weight % solution were placed in a vial with a magenta stir bar and 0.463 g of 2 molar silver nitrate were added slowly with stirring. A very soft clumpy gel was formed, demonstrating that the level of sulfonate groups in the polymer was insufficient to form a water-soluble polymer-silver ion complex.

Preparation of Comparative Polymer C Using Methacrylic acid and 7-(2-Methacryloyloxyethoxy)-4-methylcoumarin (80:20 mol % Ratio)

4.0 g of methacrylic acid, 3.35 g of 7-(2-methacryloyloxyethoxy)-4-methylcoumarin, and 0.07 g of AMBN polymerization initiator were weighed out into a 100 ml single-neck round-bottom flask, suspended in 29.68 g of N,N-dimethyl acetamide (DMA), and purged with nitrogen for 30 minutes. The flask was capped with a septum and set in a preheated oil bath at 65° C. overnight with magnetic stirring. After about 18 hours, the reaction solution had become clear, colorless, and viscous. The reaction solution was then cooled and the contents of the flask were added to about 500 ml of acetone with overhead stirring. The solid was collected by filtration, any large chunks were crushed using a mortar and pestle and then redissolved in DMA at about 20 weight % solids. The solution was precipitated in about 1.6 liters of water and the precipitate was filtered and dried in a vacuum oven. About 5.33 g of a white solid was collected and the desired polymer structure was verified by NMR. The weight average molecular weight (Mw) of the resulting polymer was 231,000 as determined by size exclusion chromatography (SEC). A prepared 17.1 weight % solids aqueous solution of the polymer was neutralized at 75 mol % using dimethylethanolamine (DMEA).

Preparation of Comparative Polymeric Silver Ion Complex from Comparative Polymer C A 5.0 g solution of the silver ion complex of Comparative Polymer C derived from only methacrylic acid and 7-(2-methacryloyloxyethoxy)-4-methylcoumarin monomers and no sulfonate-bearing monomer units was prepared as described for the silver ion complex Comparative Polymer A. A solid gel formed that demonstrates that a carboxylate based polymer will not form a soluble silver ion complex when the polymer contains recurring units derived from 7-(2-methacryloyloxyethoxy)-4-methylcoumarin to provide crosslinking and patterning capability.

Preparation of Comparative Polymer D Using 3-Sulfopropylmethacrylate and Methacrylic Acid (10:90 mol % Ratio)

1.50 g of 3-sulfopropyl methacrylate was dissolved in 28 g of distilled water in a 250 ml round bottom flask followed by addition of 4.72 g of methacrylic acid and 28 g of isopropyl alcohol and 0.12 g of AMBN initiator. The reaction mixture was purged with nitrogen for 30 minutes, capped with a septum and set in a preheated oil bath at 70° C. overnight with magnetic stirring. The reaction mixture was cooled and additional water was added and the contents of the flask were placed in a dialysis bag with MWCO of 3500 and dialyzed for about 18 hours. The resulting clear solution was concentrated to 12.41 weight % solids by evaporation. The weight average molecular weight (Mw) of the resulting polymer was 294,000 as determined by size exclusion chromatography (SEC).

Preparation of Comparative Polymer E Using 3-Sulfopropyl Methacrylate and Methacrylic Acid (50:50 mol % Ratio)

3.75 g of 3-sulfopropyl methacrylate were dissolved in 23 g of distilled water in a 250 ml round-bottom flask followed by addition of 1.30 g of methacrylic acid, 23 g of isopropyl alcohol, and 0.10 g of AMBN initiator. The reaction mixture was purged with nitrogen for 30 minutes, capped with a septum, and set in a preheated oil bath at 70° C. overnight with magnetic stirring. The reaction mixture was cooled and additional water was added and the contents of the flask were placed in a dialysis bag with MWCO of 3500 and dialyzed for about 18 hours. The resulting clear solution was concentrated to 13.04 weight % solids by evaporation. The weight average molecular weight ($M_w$) of the resulting polymer was 113,000 as determined by size exclusion chromatography (SEC).

Preparation of Comparative Polymeric Silver Ion Complexes from Comparative Polymers D and E 0.49 g of a 2 molar silver nitrate solution was added slowly with stirring to a quantity of each of Comparative Polymers D and E to prepare 8.5 weight % polymer solutions. Clear solutions were formed and 0.5 weight % of TERGITOL® 15-S-9 surfactant was added to each clear solution to aid coating. Each of the resulting solutions was filtered with a 1 µm glass filter, coated on a substrate, and photoexposed as described below.

Preparation of Comparative Polymeric Silver Nanoparticle Complexes from Comparative Polymers D and E 0.49 g of a 2 molar silver nitrate solution was added slowly with stirring to a quantity of each of Comparative Polymers D and E to prepare 8.5 weight % polymer solutions. To each solution, 0.126 g of a 4 weight % dimethylamine borane (DMAB) solution was added with good stirring. Each solution immediately turned a deep yellow-orange color, indicative of the surface plasmon resonance absorption from silver nanoparticles of approximately 10 to 40 nm in average diameter. Then, 0.5 weight % TERGITOL® 15-S-9 surfactant was added to aid coating and each solution was filtered with a 1 µm glass filter, coated onto a substrate, and photoexposed as described below.

Coating and Patterning of Comparative Polymers D and E

A coatable formulation of each of Comparative Polymers D and E was prepared by diluting each Comparative Polymer to 8.5 weight % solids with distilled water and then 0.5 weight % TERGITOL® 15-S-5 surfactant. Each of the formulations was spin coated at 3000 rpm onto an acrylic layer-subbed poly(ethylene terephthalate) substrate. Samples of each coated formulation was allowed to age for 30 minutes, then photoexposed through a chrome-on-quartz mask with lines and features down to 1 μm line-width with a broad band UV lamp with a 260 to 320 nm dichroic bandpass filter for various times ranging from 2 to 120 seconds. Samples of each photoexposed coating was then allowed to age at room temperature for about 30 minutes and were then heated for 1 minute on a 60° C. vacuum hotplate. Each aged coating was then immersed in agitated distilled water bath for 2 minutes to remove the non-exposed polymer from the substrate. No pattern was observed on any of the photoexposed coatings of all formulations because all of the coated polymer, whether photoexposed or non-exposed was removed from the substrate during the 2 minute distilled water washing, indicating that no significant crosslinking occurred in these polymers during photoexposure. These Comparative Examples show that since the Comparative Polymers do not contain [2+2] photocycloaddition groups such as 2-cinnamoyl-ethyl methacrylate, 7-(2-methacryloyloxyethoxy)-4-methylcoumarin, and others described above 1.0 cannot form water-insoluble polymeric patterns when exposed to UV light.

Coating and Patterning of Silver Ion and Silver Nanoparticle Complexes of Comparative Copolymers D and E The polymeric silver ion and silver nanoparticle complexes described above were coated and exposed identically to the polymer-only formulations described above. All of the silver-containing polymeric complexes, whether photoexposed or non-exposed were washed off the substrate and did not form any pattern, again indicating that it is an essential requirement that the polymers in the silver-containing complexes contain recurring units having crosslinkable pendant groups that can undergo [2+2] photocycloaddition upon exposure to UV light.

Preparation of Comparative Polymer F Using Vinyl Phosphonic Acid with 7-(2-Methacryloyloxyethoxy)-4-methylcoumarin (80:20 mol % Ratio)

3.0 g of vinyl phosphonic acid, 2.0 g of 7-(2-methacryloyloxyethoxy)-4-methylcoumarin, and 0.05 g of AMBN initiator were weighed out in a 100 ml single-neck round-bottom flask, dissolved in 23 g of N—N-dimethylacetamide (DMA), purged with nitrogen for 30 minutes, capped with a septum, and set in a preheated oil bath at 75° C. overnight with magnetic stirring. After about 18 hours, the reaction mixture was clear, colorless, and viscous. The reaction mixture was cooled and additional water was added and the contents of the flask were placed in a dialysis bag with MWCO of 3500 and dialyzed for about 18 hours. The resulting polymer precipitated during dialysis. The precipitate was filtered and the solid was dried in a vacuum oven. An attempt was made to solubilize the precipitate by neutralizing the phosphonic acid groups with sodium hydroxide, but the resulting dispersion was unstable and settled out. The weight average molecular weight (Mw) of the polymer was 13,700 as determined by size exclusion chromatography (SEC).

Preparation of Comparative Polymer G Using Vinyl Phosphonic Acid and 2-Cinnamoyl-ethyl Methacrylate (80:20 mol % Ratio)

2.16 g of vinyl phosphonic acid was placed in a 100 ml single-neck round-bottom flask with 6.53 g of distilled water, 6.53 g of MEK, and 6.53 g of IPA followed by 0.034 g of AMBN initiator and 1.30 g of 2-cinnamoyl-ethyl methacrylate. The reaction mixture was then purged with nitrogen for 30 minutes, capped with a septum, and set in a preheated oil bath at 70° C. overnight with magnetic stirring. After about 18 hours, the reaction mixture was clear, colorless, and viscous. The reaction mixture was cooled and the contents of the flask were placed in a dialysis bag with MWCO of 3500 and dialyzed for about 18 hours. The resulting polymer precipitated during dialysis. The precipitate was filtered and the solid was dried in a vacuum oven. The precipitate was soluble in dimethyl formamide (DMF) but was not soluble in a sodium hydroxide solution.

The poor solubility of Comparative Polymers F and G show that phosphonic acid groups do not impart adequate solubility to the polymers and therefore the pendant sulfonic acid or sulfonate groups described above are critical to the formation of stable aqueous solutions of the reactive polymers according to this invention that contain suitable pending crosslinking groups as described above.

Preparation of Comparative Polymer 11 Using Vinyl Phosphonic Acid, Methacrylic Acid, and 7-(2-Methacryloyloxyethoxy)-4-methylcoumarin (50:30:20 mol % Ratio)

2.0 g of vinyl phosphonic acid, 0.96 g of methacrylic acid, 2.13 g of 7-(2-methacryloyloxyethoxy)-4-methylcoumarin, and 0.05 g of AMBN initiator were weighed out into a 250 ml single-neck round-bottom flask and dissolved in 23 g of N—N-dimethyl acetamide (DMA), then purged with nitrogen for 30 minutes, capped with a septum, and set in a preheated oil bath at 75° C. overnight with magnetic stirring. After about 18 hours, the reaction mixture was clear, colorless, and viscous. As the reaction mixture was cooled, the polymer precipitated in water, and was filtered and dried in a vacuum oven. An 11% aqueous solution was made by addition of a 5 weight % sodium hydroxide solution adequate to neutralize the phosphonic acid monomer units. The weight average molecular weight ($M_w$) of the resulting polymer was 61,700 as determined by size exclusion chromatography (SEC).

Preparation of Comparative Polymer I Using Vinyl Phosphonic Acid, Methacrylic Acid, and 2-Cinnamoyl-Ethyl Methacrylate (50:30:20 Mol % Ratio)

2.7 g of vinyl phosphonic acid, 1.3 g of methacrylic acid, 2.60 g of 2-cinnamoylethyl methacrylate, and 0.066 g of AMBN initiator were placed in a 100 ml single-neck round-bottom flask with 8.80 g of distilled water, 8.80 g of MEK, and 8.80 g of isopropyl alcohol. The reaction solution was then purged with nitrogen for 30 minutes, capped with a septum, and set in a preheated oil bath at 70° C. overnight with magnetic stirring. After about 18 hours, the reaction mixture was clear, colorless, and viscous. The reaction mixture was cooled and the contents of the flask were placed in a dialysis bag with MWCO of 3500 and dialyzed for about 18 hours. The resulting polymer precipitated during dialysis. The precipitate was filtered and the solid was dried in a vacuum oven. An aqueous solution at 13.5 weight % polymer was prepared by adding enough 45% KOH to neutralize both the pendant methacrylic acid and the phosphonic acid groups. The weight average molecular weight (Mw) of the resulting polymer was 111,000 as determined by size exclusion chromatography (SEC).

Preparation of Comparative Polymeric Silver Ion Complexes from Comparative Polymers H and I A silver ion complex of each of Comparative Polymers H and I containing recurring units derived from vinyl phosphonic acid in place of recurring units derived from sulfonic acid according to the present invention were prepared as described above for the silver ion complex of Comparative Polymer A. A non-filterable sticky precipitate was formed using each of Comparative Polymers H and I, demonstrating that the pendant phosphonic acid groups, even when combined with pendant neutralized carboxylic acid groups do not provide water soluble silver ion complexes and therefore cannot be used according to the present invention to provide stable water-soluble polymeric silver ion complexes.

Preparation of Comparative Polymer J from N-vinyl-2-pyrrolidone and 7-(2-Methacryloyloxyethoxy)-4-methylcoumarin (80:20 mol % Ratio)

3.0 g of N-vinyl-2-pyrrolidone, 1.95 g of 7-(2-methacryloyloxyethoxy)-4-methylcoumarin, and 0.05 g of AMBN polymerization initiator were weighed out into a 100 ml single-neck round bottom flask, suspended in 17 ml of tetrahydrofuran (THF), and purged with nitrogen for 30 minutes. The flask was capped with a septum and set in a preheated oil bath at 65° C. overnight with magnetic stirring. After about 18 hours, the reaction mixture was clear, colorless, and viscous. The reaction mixture was cooled and the contents of the flask were added to about 500 ml of heptanes to precipitate the polymer. The polymer was collected by filtration and dried in a vacuum oven. About 4.5 g of solid was collected that was not soluble in water, dichloromethane (DCM), or N,N-dimethylacetamide (DMA).

Preparation of Comparative Polymer K from N-vinyl-2-pyrrolidone, Methacrylic acid, and 7-(2-Methacryloyloxyethoxy)-4-methylcoumarin (50:30:20 mol % Ratio)

2.0 g of N-vinyl-2-pyrrolidone, 0.93 g of methacrylic acid, 2.08 g of 7-(2-methacryloyloxyethoxy)-4-methylcoumarin, and 0.05 g of AMBN polymerization initiator were weighed out into a 100 ml single neck round bottom flask, suspended in 17 ml of tetrahydrofuran (THF), and purged with nitrogen for 30 minutes. The flask was capped with a septum and set in a preheated oil bath at 65° C. overnight with magnetic stirring. After about 18 hours the reaction mixture was clear, colorless, and viscous. The reaction solution was cooled and the contents of the flask were added to about 500 ml of heptane to precipitate the polymer that was collected by filtration and dried in a vacuum oven. The resulting solid was not soluble in water, 20 weight % potassium hydroxide solution, cyclopentanone, ethyl acetate, diethyl ether, methanol, dichloromethane (DCM), or N,N-dimethylacetamide (DMA).

While poly(vinyl pyrrolidone) polymers such as Comparative Polymers J and K are generally soluble in water, the presence of crosslinkable recurring units containing pendant [2+2] photocycloaddition groups will cause the polymers to become insoluble in water. It is thus critical as shown below that the incorporation of pendant sulfonic acid and sulfonate groups in the polymers impart water-solubility and coatability while the noted crosslinkable groups and silver ions or silver nanoparticles that can dramatically reduce water-solubility of the polymers.

Preparation of Comparative Polymer L using Acrylamide and 2-Cinnamoyl-ethyl methacrylate (80:20 mol % Ratio)

2.16 g of acrylamide, 1.98 g of 2-cinnamoyl-ethyl methacrylate, and 0.088 g of AMBN initiator were placed in a 250 ml single-neck round-bottom flask with 12.54 g of distilled water, 12.54 g of MEK, and 12.54 g of isopropyl alcohol. The reaction mixture was then purged with nitrogen for 30 minutes, capped with a septum, and set in a preheated oil bath at 70° C. overnight with magnetic stirring. After about 18 hours, the reaction mixture was cloudy. The reaction mixture was cooled and the contents of the flask were placed in a dialysis bag with MWCO of 3500 and dialyzed for about 18 hours. The resulting polymer precipitated during dialysis and the precipitate was not soluble in water.

Preparation of Comparative Polymer M using Acrylamide, Methacrylic acid, and 2-Cinnamoylethyl Methacrylate (70:10:20 mol % Ratio)

0.32 g of methacrylic acid, 1.87 g of acrylamide, 1.95 g of 2-cinnamoylethyl methacrylate, and 0.041 g of AMBN initiator were placed in a 250 ml single-neck round-bottom flask with 7.82 g of distilled water, 7.82 g of MEK, and 7.82 g of isopropyl alcohol. The reaction mixture was then purged with nitrogen for 30 minutes, capped with a septum, and set in a preheated oil bath at 70° C. overnight with magnetic stirring. After about 18 hours, the reaction mixture was clear and viscous. The reaction mixture was cooled and water was added to the contents causing the polymer to precipitate. Addition of base adequate to neutralize the pendant carboxylic acid groups was not able to solubilize the polymer.

The water-insolubility of Comparative Polymers L and M demonstrate that although polymers containing recurring units derived from acrylamide are generally soluble in water, the presence of the recurring units containing crosslinkable [2+2] photocycloaddition groups as described above makes the polymers water-insoluble. Therefore, it is demonstrated below that it is essential to include at least some pendant sulfonic acid or sulfonate groups in the polymers to maintain water solubility and coatability in the presence of both the [2+2] photocycloaddition groups and the complexed metal ions or metal nanoparticles that all can dramatically reduce the water solubility of the polymer.

The following identifiers of ethylenically unsaturated polymerizable monomers are used below in TABLES I and II.

TABLE I summaries properties of the Comparative Polymers described above that are outside the present invention in that they do not contain the essential pendant [2+2] photocycloaddition groups or they contain 1 mol % or less of pendant sulfonic acid or sulfonate groups. Thus, these Comparative Polymers will either not suitably crosslink upon photoexposure or they will not have suitable water-solubility as a polymer or in the resulting silver ion polymeric complexes. Thus, they cannot be used for coating and patterning as described for the present invention.

Water-Soluble Monomers:
Methacrylic Acid (MA)
Acrylamide (AA)
N-vinyl pyrrolidone (VP)
Vinyl phosphonic acid (VPH)
3-Sulfopropyl methacrylate (SPMA)
Styrene sulfonic acid (SS)
2-Acrylamido-2-methyl-1-propanesulfonic acid (AMPS)
2-Hydroxyethyl methacrylate (HEM)
Maleic anhydride (MD)
Monomers with [2+2] Photocycloaddition Groups:
2-Cinnamoyl-ethyl methacrylate (CIN)
7-(2-Methacryloyloxyethoxy)-4-methylcoumarin (COUM)
2-(2,3-Diphenyl-2-cyclopropene-1-carboxyl)-ethyl methacrylate (DPCP)
N-(2-(methacryloxy)ethyl) dimethylmaleimide (DMMI)

TABLE I

Summary of Performance for Comparative Polymers

| Polymer | Water-soluble Monomer(s) | Cross-linkable Monomer | Monomer ratios | Polymer Properties |
|---|---|---|---|---|
| Comparative A | MA | CIN | 80:20 | Water-insoluble polymeric silver ion complex |
| Comparative B | SPMA, MA | CIN | 1:79:20 | Water-insoluble polymeric silver ion complex |
| Comparative C | MA | COUM | 80:20 | Water-insoluble polymeric silver ion complex |
| Comparative D | SPMA, MA | none | 10:90 | Not patternable; no crosslinking |
| Comparative E | SPMA, MA | none | 50:50 | Not patternable; no crosslinking |
| Comparative F | VPH | COUM | 80:20 | Water-insoluble polymer |
| Comparative G | VPH | CIN | 80:20 | Water-insoluble polymer |
| Comparative H | VPH, MA | COUM | 50:30:20 | Water-insoluble polymeric silver ion complex |
| Comparative I | VPH, MA | CIN | 50:30:20 | Water-insoluble polymeric silver ion complex |
| Comparative J | VP | COUM | 80:20 | Water-insoluble polymer |
| Comparative K | VP, MA | COUM | 50:30:20 | Water-insoluble polymer |
| Comparative L | AA | CIN | 80:20 | Water-insoluble polymer |
| Comparative M | AA, MA | CIN | 70:10:20 | Water-insoluble polymer |

Inventive Examples

Preparation of Inventive Reactive Polymer a Using 3-Sulfopropyl Methacrylate, Methacrylic Acid, and 2-Cinnamoyl-ethyl Methacrylate (2:78:20 mol % Ratio)

2.52 g of methacrylic acid, 0.18 g of 3-sulfopropyl methacrylate, 1.95 g of 2-cinnamoyl-ethyl methacrylate, and 0.047 g of AMBN polymerization initiator were weighed out into a 100 ml single-neck round-bottom flask and suspended in a solvent mixture of 6.2 g of water, 6.2 g of methyl ethyl ketone, and 6.2 g of isopropyl alcohol. The reaction solution was purged with nitrogen for 30 minutes. The flask was capped with a septum and set into a preheated oil bath at 70° C. overnight with magnetic stirring. The reaction solution was then cooled, additional water was added, and the contents of the flask were placed in a dialysis bag with MWCO (Molecular Weight Cut Off) of 3500 and dialyzed for about 18 hours. The resulting clear solution was concentrated to 12.99 weight % solids by evaporation. The weight average molecular weight (Mw) of the resulting Inventive reactive polymer was 1,110,000 as determined by size exclusion chromatography (SEC).

Preparation of Inventive Reactive Polymer B Using 3-Sulfopropyl Methacrylate, Methacrylic Acid, and 2-Cinnamoyl-ethyl Methacrylate (5:75:20 mol % Ratio)

2.42 g of methacrylic acid, 0.46 g of 3-sulfopropyl methacrylate, 1.95 g of 2-cinnamoyl-ethyl methacrylate, and 0.048 g of AMBN polymerization initiator were weighed out into a 100 ml single-neck round-bottom flask and suspended in a solvent mixture of 6.44 g of water, 6.44 g of methyl ethyl ketone, and 6.44 g of isopropyl alcohol. The reaction solution was purged with nitrogen for 30 minutes. The flask was capped with a septum and set into a preheated oil bath at 70° C. overnight with magnetic stirring. The reaction solution was cooled, additional water was added, and the contents of the flask were placed in a dialysis bag with MWCO of 3500 and dialyzed for about 18 hours. The resulting clear solution was concentrated to 14.33 weight % solids by evaporation. The weight average molecular weight (Mw) of the resulting Inventive reactive polymer was 631,000 as determined by size exclusion chromatography (SEC).

Preparation of Inventive Reactive Polymer C Using 3-Sulfopropyl Methacrylate Potassium Salt, Methacrylic Acid, and 2-Cinnamoyl-ethyl Methacrylate (10:70:20 mol % Ratio)

In a 100 ml single-neck round bottom flask, 0.92 g of 3-sulfopropyl methacrylate potassium salt, 2.26 g of methacrylic acid, 1.95 g of 2-cinnamoyl-ethyl methacrylate, and 51 mg of AMBN polymerization initiator were dissolved in a solvent mixture of 6.84 g of water, 6.84 g of methyl ethyl ketone (MEK), and 6.84 g of isopropyl alcohol (IPA). The reaction solution was purged with nitrogen and the flask was capped with a septum and set into a preheated oil bath at 75° C. overnight. The reaction mixture was then cooled and placed in a dialysis bag with MWCO of 3500 and dialyzed until the bag was fully swollen. The contents were then evaporated to a concentration of 12.76 weight % solids. The weight average molecular weight (Mw) of the resulting Inventive reactive polymer was 219,000 as determined by size exclusion chromatography (SEC).

Preparation of Inventive Reactive Polymer D from 3-Sulfopropyl Methacrylate Potassium Salt, Methacrylic Acid, and 2-Cinnamoyl-ethyl Methacrylate (30:50:20 mol % Ratio)

In a 100 ml single-neck round bottom flask 2.77 g of 3-sulfopropyl methacrylate potassium salt, 1.61 g of methacrylic acid, 1.95 g of 2-cinnamoyl-ethyl methacrylate, and 63 mg of AMBN polymerization initiator were dissolved in a solvent mixture consisting of 17.94 g of water, 6.10 g of methyl ethyl ketone (MEK), and 11.84 g of isopropyl alcohol (IPA). The reaction solution was purged with nitrogen and the flask was capped with a septum and set into a preheated oil bath at 70° C. overnight. The reaction mixture was then cooled and placed in a dialysis bag with MWCO of 3500 and dialyzed until the bag was fully swollen. The contents were then evaporated to a concentration of 19.07 weight % solids. The weight average molecular weight ($M_w$) of the resulting Inventive reactive polymer was 180,000 as determined by size exclusion chromatography (SEC).

Preparation of Inventive Reactive Polymer E from 3-Sulfopropyl Methacrylate potassium salt, Methacrylic Acid, and 2-Cinnamoyl-ethyl Methacrylate (50:30:20 mol % Ratio)

In a 100 ml single-neck round bottom flask 3.08 g of 3-sulfopropyl methacrylate potassium salt, 0.65 g of methacrylic acid, 1.30 g of 2-cinnamoyl-ethyl methacrylate, and 61 mg of AMBN polymerization initiator were dissolved in a solvent mixture of 14.25 g of water, 4.85 g of methyl ethyl ketone (MEK), and 9.41 g of isopropyl alcohol (IPA). The reaction solution was purged with nitrogen and the flask was capped with a septum and set into a preheated oil bath at 70° C. overnight. The reaction solution was cooled and placed in a dialysis bag with MWCO of 3500 and dialyzed until the bag was fully swollen. The contents were then evaporated to a concentration of 18.9 weight % solids. The weight average molecular weight ($M_w$) of the resulting Inventive reactive polymer was 160,000 as determined by size exclusion chromatography (SEC).

Preparation of Inventive Reactive Polymer F from 3-Sulfopropyl Methacrylate Potassium Salt and 2-Cinnamoyl-ethyl Methacrylate (80:20 mol % Ratio)

4.93 g of 3-sulfopropyl methacrylate potassium salt were dissolved in 8.25 g of water in a 100 ml single-neck round bottom flask followed by addition of 8.25 g of dimethylacetamide (DMA), 8.42 g of isopropyl alcohol (IPA), 61 mg of AMBN polymerization initiator, and 1.30 g of 2-cinnamoyl-ethyl methacrylate. The resulting reaction solution was purged with nitrogen and the flask was capped with a septum and set in a preheated oil bath at 75° C. overnight. The reaction solution was cooled and placed in a dialysis bag with MWCO of 3500 and dialyzed until the bag was fully swollen. The contents were then evaporated to a concentration of 19.8 weight % solids. The average molecular weight (Mw) of the resulting Inventive reactive polymer was determined to be 138,000 by size exclusion chromatography (SEC).

Preparation of Inventive Reactive Polymer G using 3-Sulfopropyl Methacrylate Potassium Salt, Methacrylic acid, and 7-(2-Methacryloyloxyethoxy)-4-methylcoumarin (10:70:20 mol % Ratio)

3.65 g of 3-sulfopropyl methacrylate potassium salt, 2.15 g of methacrylic acid and 2.88 g of 7-(2-methacryloyloxyethoxy)-4-methylcoumarin monomers were weighed out into a 250 ml single-neck round-bottom flask dissolved in a solvent mixture of 14 g water, 14 g of dimethylacetamide (DMA), and 5.3 g of isopropyl alcohol. 0.09 g of AMBN polymerization initiator was added and nitrogen was bubbled through the slurry for 60 minutes before heating in an oil bath at 65° C. for about 18 hours. The solution reaction was cooled and diluted with water to form a clear solution. The reaction solution was then dialyzed for about 18 hours and then concentrated to a 15.05 weight % solids solution that was suitable for coating. The weight average molecular weight ($M_w$) of the resulting Inventive reactive polymer was 422,000 as determined by size exclusion chromatography (SEC).

Preparation of Inventive Reactive Polymer H Using 3-Sulfopropyl Methacrylate Potassium Salt, Methacrylic Acid, and 7-(2-Methacryloyloxyethoxy)-4-methylcoumarin (30:50:20 mol % Ratio)

1.43 g of 3-sulfopropyl methacrylate potassium salt, 3.50 g of methacrylic acid, and 3.35 g of 7-(2-methacryloyloxyethoxy)-4-methylcoumarin monomers were weighed out into a 100 ml single-neck round-bottom flask dissolved in a solvent mixture of 11 g water, 11 g of dimethylacetamide (DMA), and 8.25 g of isopropyl alcohol. 0.08 g of AMBN polymerization initiator was added and nitrogen was bubbled through the slurry for 30 minutes before heating it in an oil bath at 65° C. for about 18 hours. The reaction solution was cooled and diluted with water to form a clear solution. The reaction solution was dialyzed for about 60 hours and then concentrated to an 11.4 weight % solids solution that was suitable for coating. The weight average molecular weight ($M_w$) of the resulting Inventive reactive polymer was 800,000 as determined by size exclusion chromatography (SEC).

Preparation of Inventive Reactive Polymer I Using 3-Sulfopropyl Methacrylate Potassium Salt, Methacrylic Acid, and 7-(2-Methacryloyloxyethoxy)-4-methylcoumarin (50:30:20 mol % Ratio)

4.93 g of 3-sulfopropyl methacrylate potassium salt, 1.03 g of methacrylic acid, and 2.31 g of 7-(2-methacryloyloxyethoxy)-4-methylcoumarin monomers were weighed out in a 250 ml single-neck round-bottom flask dissolved in a solvent mixture of 11 g water, 11 g of dimethylacetamide (DMA), and 8.25 g of isopropyl alcohol. 0.08 g of AMBN polymerization initiator was added and nitrogen was bubbled through the slurry for 60 minutes before heating it in an oil bath at 65° C. for about 18 hours. The reaction solution was cooled and diluted with water to form a clear solution. The reaction solution was then dialyzed for about 60 hours and then concentrated to a 12.17 weight % solids solution that was suitable for coating. The weight average molecular weight (Mw) of the resulting Inventive reactive polymer was 414,000 as determined by size exclusion chromatography (SEC).

Preparation of Inventive Reactive Polymer J from 3-Sulfopropyl Methacrylate Potassium Salt and 7-(2-Methacryloyloxyethoxy)-4-methylcoumarin (80:20 mol % Ratio)

10.0 g of 3-sulfopropyl methacrylate potassium salt and 2.93 g of 7-(2-methacryloyloxyethoxy)-4-methylcoumarin were weighed out into a 250 ml single-neck round-bottom flask and dissolved in a solvent mixture of 22 g of water, 22 g of dimethylacetamide (DMA), and 11 g of isopropyl alcohol. The reaction solution was purged with nitrogen, 0.13 g of AMBN polymerization initiator was added, and nitrogen was bubbled through the slurry for 60 minutes before heating it in an oil bath at 67° C. for about 18 hours. The reaction solution was cooled and diluted with water to form a clear solution. The reaction solution was then dialyzed for about 18 hours, cooled, and concentrated to 14.8 weight % solids solution that was slightly hazy but suitable for coating. The weight average molecular weight ($M_w$) of the resulting Inventive reactive polymer was determined to be 469,000 by size exclusion chromatography (SEC).

Preparation of Inventive Reactive Polymer K Using Styrene Sulfonic Acid Sodium Salt and 7-(2-Methacryloyloxyethoxy)-4-methylcoumarin (80:20 mol % Ratio)

6.15 g of styrene sulfonic acid sodium salt and 2.15 g of 7-(2-methacryloyloxyethoxy)-4-methylcoumarin were weighed out into a 100 ml single-neck round bottom flask and dissolved in a solvent mixture of 11 g water, 11 g of dimethylacetamide (DMA), and 8.25 g of isopropyl alcohol. The reaction solution was purged with nitrogen, and 0.08 g of AMBN polymerization initiator was added and nitrogen was bubbled through the slurry for 60 minutes before heating it in an oil bath at 67° C. for about 18 hours. The reaction solution was cooled and diluted with water to form a clear solution. The reaction solution was dialyzed for about 60 hours and then concentrated to a 13.06 weight % solids solution that was suitable for coating. The weight average molecular weight (Mw) of the resulting Inventive reactive polymer was 258,000 as determined by size exclusion chromatography (SEC).

Preparation of Inventive Reactive Polymer L Using Styrene Sulfonic Acid Sodium Salt, Methacrylic Acid, and 7-(2-Methacryloyloxyethoxy)-4-methylcoumarin (50:30:20 mol % Ratio)

4.50 g of styrene sulfonic acid sodium salt, 1.13 g of methacrylic acid, and 2.52 g of 7-(2-methacryloyloxy-ethoxy)-4-methylcoumarin were weighed out in a 250 ml single-neck round-bottom flask dissolved in a solvent mixture of 12 g of water, 12 g of dimethylacetamide (DMA), and 4.15 g of isopropyl alcohol. 0.08 g of AMBN polymerization initiator was added and nitrogen was bubbled through the slurry for 30 minutes before heating in an oil bath at 65° C. for about 18 hours. The reaction mixture was cooled and diluted with water to form a clear solution. The reaction solution was dialyzed for about 18 hours and then concentrated to a 15.53 weight % solids solution that was suitable for coating. The weight average molecular weight ($M_w$) of the resulting Inventive reactive polymer was 437,000 as determined by size exclusion chromatography (SEC).

Preparation of Inventive Reactive Polymer M Using 2-Acrylamido-2-methyl-1-propanesulfonic Acid and 7-(2-Methacryloyloxyethoxy)-4-methylcoumarin (80:20 mol % Ratio)

6.15 g of 2-acrylamido-2-methyl-1-propanesulfonic acid and 2.14 g of 7-(2-methacryloyloxyethoxy)-4-methylcoumarin were weighed out into a 100 ml single neck round bottom flask and dissolved in a solvent mixture of 11 g water, 11 g of dimethylacetamide (DMA), and 8.25 g of isopropyl alcohol. The reaction solution was purged with nitrogen, 0.08 g of AMBN polymerization initiator were added, and nitrogen was bubbled through the slurry for 60 minutes before heating it in an oil bath at 67° C. for about 18 hours. The reaction solution was cooled and diluted with water to form a clear solution that was dialyzed for about 60 hours and then concentrated to a 15.68 weight % solids solution that was suitable for coating. The weight average molecular weight (Mw) of the resulting Inventive reactive polymer was 48,900 as determined by size exclusion chromatography (SEC).

Preparation of Inventive Reactive Polymer N Using 2-Acrylamido-2-methyl-1-propanesulfonic acid, Methacrylic Acid, and 7-(2-Methacryloyloxy-ethoxy)-4-methylcoumarin (50:30:20 mol % Ratio)

4.50 g of 2-acrylamido-2-methyl-1-propanesulfonic acid, 1.12 g of methacrylic acid, and 2.5 g of 7-(2-methacryloyloxyethoxy)-4-methylcoumarin monomers were weighed out in a 250 ml single-neck round-bottom flask dissolved in a solvent mixture of 11 g of water, 11 g of dimethylacetamide (DMA), and 4.5 g of isopropyl alcohol. The reaction mixture was purged with nitrogen, 0.08 g of AMBN polymerization initiator was added, and nitrogen was bubbled through the slurry for 30 minutes before heating in an oil bath at 65° C. for about 18 hours. The reaction solution was cooled and diluted with water to form a clear solution. The reaction solution was dialyzed for about 18 hours and then concentrated to a 14.41 weight % solids solution that was suitable for coating. The weight average molecular weight ($M_w$) of the resulting Inventive reactive polymer was 322,000 as determined by size exclusion chromatography (SEC).

Preparation of Inventive Reactive Polymer 0 Using 2-Acrylamido-2-methyl-1-propanesulfonic acid and 2-Cinnamoyl-ethyl methacrylate (80:20 mol % Ratio)

4.15 g of 2-acrylamido-2-methyl-1-propanesulfonic acid, 1.30 g of 2-cinnamoyl-ethyl methacrylate monomer, and 0.027 g of AMBN polymerization initiator were weighed out in a 100 ml single-neck round-bottom flask and dissolved in a solvent mixture of 5.45 g of water, 5.45 g of methyl ethyl ketone (MEK), and 4.45 g of isopropyl alcohol. Nitrogen was bubbled through the reaction solution for 30 minutes before heating in an oil bath at 70° C. for about 18 hours. The reaction solution was cooled and diluted with water to forming a cloudy solution. The reaction solution was dialyzed for about 18 hours and then concentrated to a 15.98 weight % solids solution that was suitable for coating. The weight average molecular weight ($M_w$) of the Inventive reactive polymer was 51,800 as determined by size exclusion chromatography (SEC).

Preparation of Inventive Reactive Polymer P Using 2-Acrylamido-2-methyl-1-propanesulfonic acid, Methacrylic Acid, and 2-Cinnamoyl-ethyl methacrylate (50:30:20 mol % Ratio)

2.59 g of 2-acrylamido-2-methyl-1-propanesulfonic acid, 0.65 g of methacrylic acid, 1.30 g of 2-cinnamoyl-ethyl methacrylate monomer, and 0.045 g of AMBN polymerization initiator were weighed out in a 100 ml single-neck round-bottom flask and dissolved in a solvent mixture of 8.58 g of water, 8.58 g of methyl ethyl ketone (MEK), and 8.58 g of isopropyl alcohol. Nitrogen was bubbled through the reaction solution for 30 minutes before heating it in an oil bath at 70° C. for about 18 hours. The reaction solution was cooled and diluted with water to forming a clear solution. The reaction solution was then dialyzed for about 18 hours and concentrated to an 18.64 weight % solids solution that was suitable for coating. The weight average molecular weight (Mw) of the Inventive reactive polymer was 62,200 as determined by size exclusion chromatography (SEC).

Preparation of Inventive Polymer Q Using 3-Sulfopropyl Methacrylate Potassium Salt, N-vinyl-2-pyrrolidone, and 7-(2-Methacryloyloxyethoxy)-4-methylcoumarin (50:30:20 mol % Ratio)

4.93 g of 3-sulfopropyl methacrylate potassium salt, 1.33 g of N-vinyl-2-pyrrolidone, and 2.31 g of 7-(2-methacryloyloxyethoxy)-4-methylcoumarin were weighed out in a 250 ml single-neck round-bottom flask and dissolved in a solvent mixture of 11 g of water, 11 g of dimethyl acetamide (DMA), and 8.25 g of isopropyl alcohol. Then, 0.09 g of AMBN polymerization initiator was added and nitrogen was bubbled through the slurry for 60 minutes before heating it in an oil bath at 65° C. for about 18 hours. The reaction solution was cooled and diluted with water to form a clear solution that was dialyzed for about 24 hours and then concentrated to a 12.56 weight % solids solution that was suitable for coating. The weight average molecular weight ($M_w$) of the resulting Inventive reactive polymer was 112,000 as determined by size exclusion chromatography (SEC).

Preparation of Inventive Polymer R Using 3-Sulfopropyl Methacrylate Potassium Salt, N-vinyl-2-pyrrolidone, Methacrylic Acid, and 7-(2-Methacryloyloxyethoxy)-4-methylcoumarin (20:30:30:20 mol % Ratio)

1.04 g of 3-sulfopropyl methacrylate potassium salt, 0.70 g of N-vinyl-2-pyrrolidone, 0.55 g of methacrylic acid, and 1.22 g of 7-(2-methacryloyloxyethoxy)-4-methylcoumarin were weighed out into a 250 ml single-neck round-bottom flask and dissolved in a solvent mixture of 4.5 g of water, 5.5 g of dimethyl acetamide (DMA), and 4.13 g of isopropyl alcohol. Then, 0.04 g of AMBN polymerization initiator was added and nitrogen was bubbled through the slurry for 60 minutes before heating it in an oil bath at 65° C. for about 18 hours. The reaction solution was cooled and diluted with water to form a clear solution that was dialyzed for about 24 hours and then concentrated to an 11.46 weight % solids solution that was suitable for coating. The weight average molecular weight (Mw) of the resulting Inventive reactive polymer was 608,000 as determined by size exclusion chromatography (SEC).

Preparation of Inventive Reactive Polymer S Using 3-Sulfopropyl Methacrylate Potassium Salt, 2-Hydroxyethyl Methacrylate, and 7-(2-Methacryloyloxyethoxy)-4-methylcoumarin (50:30:20 mol % Ratio)

4.00 g of 3-sulfopropyl methacrylate potassium salt was dissolved in 10 g of distilled water in a 250 ml single-neck round-bottom flask, followed by addition of 1.27 g of 2-hydroxyethyl methacrylate and 10 g of isopropyl alcohol. Then, 1.87 g of 7-(2-methacryloyloxyethoxy)-4-methylcoumarin monomer and 10 g of dimethylacetamide (DMA) were added, followed by 0.07 g of AMBN polymerization initiator. Nitrogen was bubbled through the slurry for 30 minutes before heating it in an oil bath at 65° C. for about 18 hours. The reaction solution was cooled and diluted with water to form a clear solution. The reaction solution was then dialyzed for about 18 hours in distilled water and concentrated to a 14.94 weight % solids solution that was suitable for coating. The weight average molecular weight ($M_w$) of the resulting Inventive reactive polymer was 269,000 as determined by size exclusion chromatography (SEC).

Preparation of Inventive Reactive Polymer T Using 3-Sulfopropyl Methacrylate Potassium Salt, 2-Hydroxyethyl Methacrylate, and 7-(2-Methacryloyloxyethoxy)-4-methylcoumarin (10:70:20 mol % Ratio)

1.00 g of 3-sulfopropyl methacrylate potassium salt was dissolved in 10 g of distilled water in a 250 ml single-neck round-bottom flask, followed by addition of 3.7 g of 2-hydroxyethyl methacrylate, 10 g of isopropyl alcohol, 2.34 g of 7-(2-methacryloyloxyethoxy)-4-methylcoumarin monomer, 10 g of dimethylacetamide (DMA), and 0.07 g of AMBN polymerization initiator. Nitrogen was bubbled through the slurry for 30 minutes before heating it in an oil bath at 65° C. for about 18 hours. The reaction solution was cooled and diluted with water to form a clear solution. The reaction solution was then dialyzed for about 18 hours in distilled water and then concentrated to a 13.76 weight % solids solution that was suitable for coating. The weight average molecular weight (Mw) of the resulting Inventive reactive polymer was 127,000 as determined by size exclusion chromatography (SEC).

Preparation of Inventive Reactive Polymer U Using 3-Sulfopropyl Methacrylate Potassium Salt, Maleic Anhydride, and 7-(2-Methacryloyloxyethoxy)-4-methylcoumarin (50:30:20 mol % Ratio)

4.00 g of 3-sulfopropyl methacrylate potassium salt was dissolved in 10 g of distilled water in a 250 ml single-neck round-bottom flask, followed by addition of 0.96 g of maleic anhydride, 10 g of isopropyl alcohol, 1.87 g of 7-(2-methacryloyloxyethoxy)-4-methylcoumarin monomer, 10 g of dimethylacetamide (DMA), and 0.07 g of AMBN polymerization initiator. Nitrogen was bubbled through the slurry for 30 minutes before heating it in an oil bath at 65° C. for about 18 hours. The reaction solution was cooled and diluted with water to form a clear solution. The reaction solution was then dialyzed for about 18 hours in distilled water and then concentrated to a 13.87 weight % solids solution that was suitable for coating. The weight average molecular weight ($M_w$) of the resulting Inventive reactive polymer was 100,000 as determined by size exclusion chromatography (SEC).

Preparation of Inventive Reactive Polymer V Using 3-Sulfopropyl Methacrylate Potassium Salt, Acrylamide, and 2-Cinnamoyl-ethyl methacrylate (50:30:20 mol % Ratio)

In a 100 ml single-neck round-bottom flask, 4.26 g of 3-sulfopropyl methacrylate potassium salt, 0.80 g of acrylamide, 1.95 g of 2-cinnamoyl-ethyl methacrylate, and 147 mg of AMBN polymerization initiator were dissolved in a solvent mixture of 33.17 g of water and 33.17 g of isopropyl alcohol (IPA). The reaction mixture was purged with nitrogen, capped with a septum, and set in a preheated oil bath at 70° C. overnight. The reaction mixture was then cooled and placed in a dialysis bag with MWCO of 3500 and dialyzed for about 18 hours, forming a gel-like product that dissolved upon addition of 0.47 g of a 45 weight % potassium hydroxide solution. The composition was then evaporated to a concentration of 11.07 weight % solids. The weight average molecular weight ($M_w$) of the resulting Inventive reactive polymer was 181,000 as determined by size exclusion chromatography (SEC).

Preparation of Inventive Reactive Polymer W Using 3-Sulfopropyl Methacrylate Potassium Salt, Acrylamide, and 2-Cinnamoyl-ethyl methacrylate (10:70:20 mol % Ratio)

In a 100 ml single-neck round-bottom flask, 0.92 g of 3-sulfopropyl methacrylate potassium salt, 1.87 g of acrylamide, 1.95 g of 2-cinnamoyl-ethyl methacrylate, and 95 mg of AMBN polymerization initiator were dissolved in a solvent mixture of 21.33 g of water and 21.33 g of isopropyl alcohol (IPA). The reaction mixture was purged with nitrogen, capped with a septum, and set into a preheated oil bath at 70° C. overnight. The reaction mixture was then cooled and placed in a dialysis bag with MWCO of 3500 and dialyzed for about 18 hours, forming a cloudy but stable dispersion. The composition was then evaporated to a concentration of 13.24 weight % solids.

Preparation of Inventive Reactive Polymer X Using 3-Sulfopropyl Methacrylate Potassium Salt, 2-Hydroxyethyl Methacrylate, and 2-Cinnamoyl-ethyl methacrylate (50:30:20 mol % Ratio)

In a 100 ml single-neck round-bottom flask, 3.08 g of 3-sulfopropyl methacrylate potassium salt, 0.98 g of 2-hydroxyethyl methacrylate, 1.30 g of 2-cinnamoyl-ethyl methacrylate, and 54 mg of AMBN polymerization initiator were dissolved in a solvent mixture of 7.15 g of water, 7.15 g of methyl ethyl ketone (MEK), and 7.15 g of isopropyl alcohol (IPA). The reaction mixture was capped with a septum, purged with nitrogen for 30 minutes, and set in a preheated oil bath at 70° C. for about 18 hours. The reaction mixture was cooled and placed in a dialysis bag with MWCO of 3500 and dialyzed in distilled water for about 18 hours. The composition was then evaporated to a concentration of 13.78 weight % solids. The weight average molecular weight (Mw) of the resulting Inventive reactive polymer was 69,300 as determined by size exclusion chromatography (SEC).

Preparation of Inventive Reactive Polymer Y Using 3-Sulfopropyl Methacrylate Potassium Salt, 2-Hydroxyethyl Methacrylate, and 2-Cinnamoyl-ethyl methacrylate (10:70:20 mol % Ratio)

In a 100 ml single-neck round-bottom flask, 0.92 g of 3-sulfopropyl methacrylate potassium salt, 3.42 g of 2-hydroxyethyl methacrylate, 1.95 g of 2-cinnamoyl-ethyl methacrylate, and 63 mg of AMBN polymerization initiator were dissolved in a solvent mixture of 8.39 g of water, 8.39 g of methyl ethyl ketone (MEK), and 8.39 g of isopropyl alcohol (IPA). The reaction mixture was capped with a septum, purged with nitrogen for 30 minutes, and set in a preheated oil bath at 70° C. for about 18 hours. The reaction mixture was then cooled and placed in a dialysis bag with MWCO of 3500 and dialyzed in distilled water for about 18 hours. The composition was then evaporated to a concentration of 12.85 weight % solids. The weight average molecular weight (Mw) of the resulting Inventive reactive polymer was 542,000 as determined by size exclusion chromatography (SEC).

Preparation of Inventive Reactive Polymer Z Using 3-Sulfopropyl Methacrylate Potassium Salt, Maleic Anhydride, and 2-Cinnamoylethyl Methacrylate (50:30:20 mol % Ratio)

In a 100 ml single-neck round-bottom flask, 3.08 g of 3-sulfopropyl methacrylate potassium salt, 0.74 g of maleic anhydride, 1.30 g of 2-cinnamoyl-ethyl methacrylate, and 51 mg of AMBN polymerization initiator were dissolved in a solvent mixture consisting of 6.83 g of water, 6.83 g of methyl ethyl ketone (MEK), and 6.83 g of isopropyl alcohol (IPA). The reaction mixture was capped with a septum, purged with nitrogen for 30 minutes, and set in a preheated oil bath at 70° C. for about 18 hours. The reaction mixture was then cooled and placed in a dialysis bag with MWCO of 3500 and dialyzed in distilled water for about 18 hours. The composition was then evaporated to a concentration of 14.20 weight % solids. The weight average molecular weight ($M_w$) of the resulting Inventive reactive polymer was 68,500 as determined by size exclusion chromatography (SEC).

Preparation of Inventive Reactive Polymer AA Using 3-Sulfopropyl Methacrylate Potassium Salt, Maleic Anhydride, and 2-Cinnamoylethyl Methacrylate (10:70:20 mol % Ratio)

In a 100 ml single-neck round-bottom flask, 0.92 g of 3-sulfopropyl methacrylate potassium salt, 2.57 g of maleic anhydride, 1.95 g of 2-cinnamoyl-ethyl methacrylate, and 54 mg of AMBN polymerization initiator were dissolved in a solvent mixture consisting of 7.25 g of water, 7.25 g of methyl ethyl ketone (MEK), and 7.25 g of isopropyl alcohol (IPA). The reaction mixture was capped with a septum, purged with nitrogen for 30 minutes, and set in a preheated oil bath at 70° C. for about 18 hours. The reaction mixture was then cooled and placed in a dialysis bag with MWCO of 3500 and dialyzed in distilled water for about 18 hours. The composition was then evaporated to a concentration of 13.21 weight % solids. The weight average molecular weight ($M_w$) of the resulting Inventive reactive polymer was 50,500 as determined by size exclusion chromatography (SEC).

Preparation of Inventive Reactive Polymer AB Using 3-Sulfopropyl Methacrylate Potassium Salt, Vinyl Phosphonic Acid, and 2-Cinnamoylethyl methacrylate (50:30:20 mol % Ratio)

In a 100 ml single-neck round-bottom flask, 1.85 g of 3-sulfopropyl methacrylate potassium salt, 1.35 g of vinyl phosphonic acid, 1.30 g of 2-cinnamoyl-ethyl methacrylate, and 45 mg of AMBN polymerization initiator were dissolved in a solvent mixture consisting of 8.50 g of water, 8.50 g of methyl ethyl ketone (MEK), and 8.50 g of isopropyl alcohol (IPA). The reaction mixture was capped with a septum, purged with nitrogen for 30 minutes, and set in a preheated oil bath at 70° C. for about 18 hours. The reaction mixture was cooled and placed in a dialysis bag with MWCO of 3500 and dialyzed in distilled water for about 18 hours. The composition was then evaporated to a concentration of 18.33 weight % solids. The weight average molecular weight ($M_w$) of the resulting Inventive reactive polymer was 26,600 as determined by size exclusion chromatography (SEC).

Preparation of Inventive Reactive Polymer AC
Using 3-Sulfopropyl Methacrylate Potassium Salt,
Methacrylic Acid, and 2-(2,3-Diphenyl-2-cyclopropene-1-carboxyl)-ethyl methacrylate (50:30:20 mol % Ratio)

3.0 g of 3-sulfopropyl methacrylate potassium salt was dissolved in 16 g of distilled water in a 250 ml single-neck round-bottom flask followed by addition of a solution of 1.70 g of 2-(2,3-diphenyl-2-cyclopropene-1-carboxyl)-ethyl methacrylate dissolved in 16 g of MEK to form a two-phase mixture. A solution of 0.63 g of methacrylic acid dissolved in 16 g of isopropyl alcohol was then added and the solution became a single phase, followed by addition of 0.11 g of AMBN polymerization initiator. The reaction solution was capped with a septum, purged with nitrogen for 30 minutes, and then set in a preheated oil bath at 70° C. for about 18 hours. The reaction solution was cooled and diluted with water to form a clear solution. The solution was dialyzed for about 18 hours and then concentrated to an 11.76 weight % solids solution that was suitable for coating.

Preparation of Inventive Reaction Polymer AD
Using 3-Sulfopropyl Methacrylate Potassium Salt,
Methacrylic Acid, and 2-(2,3-Diphenyl-2-cyclopropene-1-carboxyl)-ethyl methacrylate (10:70:20 mol % Ratio)

0.53 g of 3-sulfopropyl methacrylate potassium salt was dissolved in 10 g of distilled water in a 250 ml single-neck round-bottom flask followed by addition of a solution of 1.50 g of 2-(2,3-diphenyl-2-cyclopropene-1-carboxyl)-ethyl methacrylate monomer dissolved in 10 g of MEK to form a two-phase mixture. A solution of 1.30 g of methacrylic acid dissolved in 10 g of isopropyl alcohol was then added and the solution became a single phase, followed by addition of 0.07 g of AMBN polymerization initiator. The solution was capped with a septum, purged with nitrogen for 30 minutes, and set in a preheated oil bath at 70° C. for about 18 hours. The reaction solution was cooled and diluted with water to form a clear solution that was dialyzed for about 18 hours and then concentrated to a 12.64 weight % solids solution that was suitable for coating. The weight average molecular weight (Mw) of the resulting Inventive reactive polymer was 61,800 as determined by size exclusion chromatography (SEC).

Preparation of Invention Reactive Polymer AE
Using 3-Sulfopropyl Methacrylate Potassium Salt
and N-(2-(methacryloxy)ethyl) Dimethylmaleimide (80:20 mol % Ratio)

In a 100 ml single neck round bottom flask, 4.93 g of 3-sulfopropyl methacrylate potassium salt, 1.19 g of N-(2-(methacryloxy)ethyl) dimethylmaleimide, and 61 mg of AMBN were dissolved in a solvent mixture consisting of 8.16 g of water, 8.16 g of methyl ethyl ketone (MEK), and 8.16 g of isopropyl alcohol (IPA). The reaction mixture was capped with a septum, purged with nitrogen for 30 minutes, and set in a preheated oil bath at 70° C. for about 18 hours. The reaction mixture was cooled and placed in a dialysis bag with MWCO of 3500 and dialyzed in distilled water for about 18 hours. The contents were then evaporated to a concentration of 16.84 weight % solids. The weight average molecular weight (Mw) of the resulting Invention Reactive Polymer AE was 110,000 as determined by size exclusion chromatography (SEC).

Preparation of Inventive Reactive Polymer AF
Using 3-Sulfopropyl Methacrylate Potassium Salt,
Methacrylic Acid, and N-(2-(methacryloxy)ethyl) Dimethylmaleimide (50:30:20 mol % Ratio)

In a 100 ml single neck round bottom flask, 3.08 g of 3-sulfopropyl methacrylate potassium salt, 0.65 g of methacrylic acid, 1.19 g of N-(2-(methacryloxy)ethyl) dimethylmaleimide, and 49 mg of AMBN were dissolved in a solvent mixture consisting of 6.56 g of water, 6.56 g of methyl ethyl ketone (MEK), and 6.56 g of isopropyl alcohol (IPA). The reaction mixture was capped with a septum, purged with nitrogen for 30 minutes, and set in a preheated oil bath at 70° C. for about 18 hours. The reaction mixture was cooled and placed in a dialysis bag with MWCO of 3500 and dialyzed in distilled water for about 18 hours. The contents were then evaporated to a concentration of 15.36 weight % solids. The weight average molecular weight (Mw) of the resulting Invention Reactive Polymer AF was 93,300 as determined by size exclusion chromatography (SEC).

Preparation of Inventive Reactive Polymer AG
Using 3-Sulfopropyl Methacrylate Potassium Salt,
Methacrylic Acid, and N-(2-(methacryloxy)ethyl) Dimethylmaleimide (10:70:20 mol % Ratio)

In a 100 ml single neck round bottom flask, 0.92 g of 3-sulfopropyl methacrylate potassium salt, 2.26 g of methacrylic acid, 1.78 g of N-(2-(methacryloxy)ethyl) dimethylmaleimide, and 50 mg of AMBN were dissolved in a solvent mixture consisting of 6.61 g of water, 6.61 g of methyl ethyl ketone (MEK), and 6.61 g of isopropyl alcohol (IPA). The reaction mixture was capped with a septum, purged with nitrogen for 30 minutes, and set in a preheated oil bath at 70° C. for about 18 hours. The reaction mixture was cooled and placed in a dialysis bag with MWCO of 3500 and dialyzed in distilled water for about 18 hours. The contents were then evaporated to a concentration of 11.46 weight % solids. The weight average molecular weight ($M_w$) of the resulting Inventive reactive Polymer AG was 254,000 as determined by size exclusion chromatography (SEC).

Preparation of Polymeric Silver Ion Complexes

For the inventive polymers described above, a water soluble and water-coatable polymer silver ion complex was formed as follows:

A quantity of Inventive reactive polymer solution sufficient to provide 5.0 g of 8.5 weight % of reactive polymer was added to a clear glass vessel, followed by any additional make-up water. With vigorous stirring, 0.614 g of 2.0 molar silver nitrate solution was added dropwise. A stable colorless solution was formed that was generally clear, but could have some turbidity depending on the type of reactive polymer. A surfactant such as Dupont Capstone FS-35 or TERGITOL® 15-S-9 was added at between 0.05 and 0.5 weight % as a coating aid. Each resulting solution was easily filtered through a 1 μm glass syringe filter to provide a coating-ready water-soluble formulation (that is, a silver-containing composition).

Preparation of Polymeric Silver Nanoparticle Complexes

A general procedure to from a water-soluble and a water-coatable silver nanoparticle complex with each Inventive reactive polymer described above is as follows:

A quantity of polymer solution sufficient to provide 5.0 g of 8.5 weight % reactive polymer was added to a clear glass vessel, followed by any additional make-up water. With vigorous stirring, 0.614 g of 2.0 molar silver nitrate solution was added dropwise. A stable colorless solution was formed that was generally clear, but could have some turbidity depending on the type of reactive polymer. With continued stirring, 0.157 g of a freshly prepared 4 weight % dimethylamine borane solution was added dropwise. The initially colorless solution immediately became deeply colored due to the strong surface plasmon resonance absorption of the newly formed silver nanoparticles. The color of the resulting polymeric silver nanoparticle complex can vary according to the size of the silver nanoparticles that were formed. Silver nanoparticles in such complexes with an average diameter size of less than 30 nm had a strong orange to brilliant yellow coloration when prepared by this method of the present invention. Larger sized silver nanoparticles in such complexes ranging from 300 nm to 500 nm had much less brilliant coloration, tending toward muted green and grey colors as the silver nanoparticles take on the neutral grey appearance of larger silver nanoparticles approaching 1 µm in average diameter. A description of the observed surface plasmon resonance colors are described below in TABLE II.

Preparation of Polymeric Silver Nanoparticle Complexes with High Aspect Ratio Nanoparticles The general procedure described above to form a water-soluble and water-coatable polymeric silver nanoparticle complex can be modified as follows to produce high aspect ratio platelet silver nanoparticles with a very strong violet to blue surface plasmon resonance absorption.

A quantity of polymer solution sufficient to provide 5.0 g of reactive polymer was added to a clear glass vessel, followed by any additional make-up water. With vigorous stirring, 0.470 g of a freshly prepared 4 weight % dimethylamine borane solution was added dropwise. Some foaming could occur and a colorless solution was formed. With continued stirring, 0.614 g of 2.0 molar silver nitrate solution was then added dropwise. The initially colorless solution immediately became deeply colored due to the strong surface plasmon resonance absorption of the newly formed silver nanoparticles. The surface plasmon resonance color indicative of high aspect ratio or platelet shaped silver nanoparticles is an intense blue, violet or magenta coloration. Transmission electron microscopy TEM) analysis shows that a typical platelet silver nanoparticle with an average diameter of 10 nm to 30 nm and a thickness of 3 nm to 6 nm. Descriptions of the observed surface plasmon resonance colors are described below in TABLE II.

Coating and Patterning the Polymeric Silver Ion and Silver Nanoparticle Complexes The water-soluble polymeric silver ion and polymeric silver nanoparticle complexes described above and listed below in TABLE II were coated and patterned using ultraviolet (UV) light as follows:

A surfactant such as Dupont Capstone FS-35 or TERGITOL® 15-S-9 was added to each water-soluble complex at a concentration of between 0.05 weight % and 0.5 weight % and the resulting formulation was passed through a 1 µm glass syringe filter. Each of the formulations was then spin coated at between 2000 and 3000 RPM onto a poly(ethylene terephthalate) (PET) film pre-coated before stretching with a layer of poly(glycidyl methacrylate-co-butyl acrylate) to provide a substrate. Each coating was then allowed to dry and age for between 30 and 60 minutes.

Each dried coating was then exposed through a predetermined contact mask to a broadband high pressure UV lamp that was collimated and filtered with a dichroic mirror with a bandpass of 350 nm to 450 nm. Other dichroic mirrors with a bandpass of 260 nm to 320 nm or 220 nm to 260 nm can be used if shorter wavelength UV light is desired. The exposing masks are made of evaporated chrome on quartz with the high resolution patterns made with conventional photolithographic methods capable of sub 1 µm resolution. The photo-patternability of each dried complex was evaluated with a high resolution contact exposure mask with a series of features down to 1 µm.

Following UV exposure, each dried coating was then again allowed to age for 15 to 60 minutes and then baked for 1 minute on a 60° C. hotplate with vacuum suction. Each sample was then processed for 2 minutes in an agitated bath of distilled water at room temperature to remove any unexposed polymer complex. After removal from the agitated distilled water bath, each dried coating was rinsed twice for approximately 5 seconds in distilled water to further remove any residual non-exposed complex. Optical microscopy was used to evaluate the resolved line-widths and overall quality of the resulting pattern.

Dried coatings that were exposed through a plain quartz mask to harden and insolubilize (crosslink) the polymer complex were also prepared for evaluation of their antimicrobial behavior.

TABLE II

Description of Inventive Polymeric Silver Ion Complexes and Polymeric Silver Nanoparticle Complexes

| Polymer | Water-soluble Monomer(s) | Cross-linkable Monomer | Monomer Mol % Ratios | Polymer Molecular Weight | Appearance of Silver Ion Complex | Silver ion Complex Patterning with UV light | Appearance of Silver Nanoparticle Complex | Silver Average Nanoparticle size (nm) by light scattering | Patterning with UV Radiation | Appearance of High Aspect Ratio Silver Nanoparticles |
|---|---|---|---|---|---|---|---|---|---|---|
| Inventive A | SPMA, MA | CIN | 2:78:20 | 1,110,000 | turbid | | beige | | N/A | |
| Inventive B | SPMA, MA | CIN | 5:75:20 | 631,000 | slightly turbid | | yellow-orange | 6 nm | 3 µm lines | dark brown |
| Inventive C | SPMA, MA | CIN | 10:70:20 | 219,000 | turbid | | yellow-orange | 7 nm | 2 µm lines | purple |
| Inventive D | SPMA, MA | CIN | 30:50:20 | 113,000 | turbid | | yellow-orange | 10 nm | 2 µm lines | purple |
| Inventive E | SPMA, MA | CIN | 50:30:20 | 82,000 | turbid | | yellow-orange | 12 nm | 2 µm lines | blue |

TABLE II-continued

Description of Inventive Polymeric Silver Ion Complexes and Polymeric Silver Nanoparticle Complexes

| Polymer | Water-soluble Monomer(s) | Cross-linkable Monomer | Monomer Mol % Ratios | Polymer Molecular Weight | Appearance of Silver Ion Complex | Silver ion Complex Patterning with UV light | Appearance of Silver Nanoparticle Complex | Silver Average Nanoparticle size (nm) by light scattering | Patterning with UV Radiation | Appearance of High Aspect Ratio Silver Nanoparticles |
|---|---|---|---|---|---|---|---|---|---|---|
| Inventive F | SPMA | CIN | 80:20 | 282,000 | turbid | 3 μm lines | yellow-orange | | 2 μm lines | dull blue |
| Inventive G | SPMA, MA | COUM | 10:70:20 | 422,000 | slightly turbid | | orange | 32 nm | 3 μm lines | |
| Inventive H | SPMA, MA | COUM | 30:50:20 | 800,000 | slightly turbid | | orange | | 3 μm lines | |
| Inventive I | SPMA, MA | COUM | 50:30:20 | 557,000 | clear | 3 μm lines | olive green | 334 nm | 4 μm lines | dark purple |
| Inventive J | SPMA | COUM | 80:20 | 287,000 | clear | | grey-beige | | 3 μm lines | bright blue |
| Inventive K | SS | COUM | 80:20 | 258,000 | clear | 3 μm lines | beige | 310 nm | 3 μm lines | purple |
| Inventive L | SS, MA | COUM | 50:30:20 | 437,000 | clear | | grey-beige | 335 nm | 3 μm lines | purple |
| Inventive M | AMPS | COUM | 80:20 | 49,000 | slightly turbid | 2 μm lines | grey-beige | 135 nm | 3 μm lines | dull blue |
| Inventive N | AMPS, MA | COUM | 50:30:20 | 322,000 | slightly turbid | | grey-beige | 298 nm | 3 μm lines | purple |
| Inventive O | AMPS | CIN | 80:20 | 52,000 | turbid | | dull orange | | 4 μm lines | light orange* |
| Inventive P | AMPS, MA | CIN | 50:30:20 | 62,000 | slightly turbid | | orange | | 4 μm lines | light orange* |
| Inventive Q | SPMA,VP | COUM | 50:30:20 | 112,000 | clear | 2 μm lines | dull yellow | 152 nm | 2 μm lines | dark green |
| Inventive R | SPMA, MA,VP | COUM | 20:30:30:20 | 608,000 | clear | | grey-beige | 375 μm | 4 μm lines | dark brown |
| Inventive S | SPMA, HEM | COUM | 50:30:20 | 269,000 | clear | | beige | | 4 μm lines | deep blue |
| Inventive T | SPMA, HEM | COUM | 10:70:20 | 127,000 | slightly turbid | | grey-beige | | 4 μm lines | dark purple |
| Inventive U | SPMA, MD | COUM | 50:30:20 | 100,000 | slightly turbid | | grey | 50 nm | 5 μm lines | red-orange |
| Inventive V | SPMA, AA | CIN | 50:30:20 | 181,000 | very turbid | | bright yellow | 26 nm | 2 μm lines | bright yellow* |
| Inventive W | SPMA, AA | CIN | 10:70:20 | N/A | very turbid | | dull green | | N/A | |
| Inventive X | SPMA, HEM | CIN | 50:30:20 | 69,000 | turbid | | dull green | | 2 μm lines | blue |
| Inventive Y | SPMA, HEM | CIN | 10:70:20 | 542,000 | Clear | | olive green | | 4 μm lines | dark purple |
| Inventive Z | SPMA, MD | CIN | 50:30:20 | 69,000 | slightly turbid | | grey | | 2 μm lines | purple |
| Inventive AA | SPMA, MD | CIN | 10:70:20 | 51,000 | clear | 2 μm lines | dull yellow | | 5 μm lines | red |
| Inventive AB | SPMA, VPH | CIN | 30:50:20 | 27,000 | turbid | | brown-orange | 2 nm | 2 μm lines | bright yellow* |
| Inventive AC | SPMA, MA | DPCP | 50:30:20 | N/A | turbid | | grey | | 4 μm lines | |
| Inventive AD | SPMA, MA | DPCP | 10:70:20 | 62,000 | clear | | grey | | 2 μm lines | |
| Inventive AE | SPMA | DMMI | 80:20 | | | 2 μm lines | | | 2 μm lines | purple |
| Inventive AF | SPMA, MA | DMMI | 30:50:20 | | | 2 μm lines | | | 2 μm lines | purple |
| Inventive AG | SPMA, MA | DMMI | 10:70:20 | | | 2 μm lines | | | 2 μm lines | bright yellow |

* Indicates that platelet morphologies were nor formed
** Coating formulations included 0.85 weight % thioxanthone as a long UV photosensitizer Electroless Copper Plating of Patterned Polymeric Silver Nanoparticle Complexes:

Preparation of the Electroless Copper Plating Bath:

The following components were dissolved in a glass container that had been cleaned with concentrated nitric acid followed by a thorough rinse with distilled water to eliminate any trace of metal on the glass. Then, 1.8 g of copper (II) sulfate pentahydrate, 6.25 g of tetrasodium EDTA (ethylenediaminetetraacetic acid) tetrahydrate, 0.005 g of potassium ferrocyanide trihydrate, 2.25 g of 37 weight % formaldehyde solution, 80 g of distilled water, and 2 to 3 g of 45 weight % sodium hydroxide solution were mixed to provide an aqueous solution having a pH of 12.8.

In some instances, the catalytic activity of an Inventive polymeric silver nanoparticle complex was evaluated by immersing the dried patterned coating in an electroless copper plating bath prepared above for 6 to 10 minutes. All inventive polymeric silver nanoparticle complex coatings showed very strong copper plating on all the patterned surfaces, indicating the presence of highly catalytic amounts of silver ion or silver nanoparticles in the patterns. Conductive copper wires with line widths of less than 5 μm were typically produced.

Antimicrobial Surface Challenge Testing:

A Self-Sanitizing Surface Efficacy Test based on ASTM WK42235 was conducted using *E. coli* with a 2 hour dry exposure on 1 inch×1 inch (2.54 cm×2.54 cm) squares of the PET support coated with the silver ion complex and silver nanoparticle complex of Inventive reactive polymer F. The dried coatings were exposed for 30 seconds each to collimated broadband UV light filtered with a 350 nm to 450 nm bandpass dichroic filter. A 1 to 2 log reduction in colony forming units (CFU) per carrier was observed for the coatings of both the polymeric silver ion complex and the polymeric silver nanoparticle complex of Inventive reactive polymer F relative to a coating of Inventive reactive polymer F containing no silver. These results indicate a significant antimicrobial response from both the complexes containing ionic silver or silver nanoparticles in the patterned and crosslinked coatings prepared using Inventive reactive polymer F.

High Resolution Patterning to Form Antimicrobial Surfaces with Resistance to Microbial Colonization and Biofilm Formation:

High resolution chrome-on-quartz masks where prepared to produce SHARKLET™ AF patterns with 1.5 to 2 μm lines and spaces as described in U.S. Patent Application Publication 2010/0226943A1 and U.S. Pat. No. 7,650,848B2 (Brennan et al.) and U.S. Pat. No. 7,143,709B2 (Brennan et al.). Inventive polymeric silver ion and polymeric silver nanoparticle complexes containing Inventive reactive polymers E and V were prepared and coated on the primed PET substrate described above for general patterning procedures. Each dried coating was exposed through the SHARKLET™ AF mask with collimated broadband UV light filtered with a 350 nm to 450 nm bandpass dichroic filter and processed with an agitated distilled water bath as described above for the general photopatterning procedure.

Both the Invention polymeric silver ion and polymeric silver nanoparticle complexes were successfully used to reproduce the approximately 1.5 to 2 μm line-width features of the SHARKLET™ AF mask.

The invention has been described in detail with particular reference to certain preferred embodiments thereof, but it will be understood that variations and modifications can be effected within the spirit and scope of the invention.

The invention claimed is:

1. A method for providing a silver-containing article, the method comprising:
   disposing a silver-containing composition onto a first supporting side of a substrate, the silver-containing composition comprising a water-soluble complex of a reactive polymer with reducible silver ions, the reactive polymer comprising: (a) greater than 1 mol % of recurring units comprising sulfonic acid or sulfonate groups, (b) at least 5 mol % of recurring units comprising a pendant group capable of crosslinking via [2+2] photocycloaddition, and optionally (c) at least 1 mol % of recurring units comprising a pendant amide, hydroxyl, lactam, phosphonic acid, or carboxylic acid group, all amounts based on the total recurring units in the reactive polymer.

2. The method of claim 1, wherein the reactive polymer comprises at least 5 mol % of the recurring units comprising sulfonic acid or sulfonate groups based on the total amounts of recurring units in the reactive polymer.

3. The method of claim 1, wherein the reactive polymer comprises at least 5 mol % and up to and including 50 mol % of the recurring units comprising a pendant group capable of crosslinking via [2+2] photocycloaddition based on the total recurring units in the reactive polymer.

4. The method of claim 1, wherein the reactive polymer comprises at least 1 mol % and up to and including 93 mol % of recurring units comprising a pendant hydroxyl, amide, or carboxylic acid group, based on the total recurring units in the reactive polymer.

5. The method of claim 1, wherein the recurring units comprising a pendant group capable of crosslinking via [2+2] photocycloaddition comprise:
   (i) a photosensitive —C(═O)—CR═CR$^1$—Y group wherein R and R$^1$ are independently hydrogen or an alkyl group having 1 to 7 carbon atoms, a 5- to 6-membered cycloalkyl group, an alkoxy group having 1 to 7 carbon atoms, a phenyl group, or a phenoxy group, and Y is an aryl or heteroaryl group;
   (ii) a photosensitive, non-aromatic unsaturated carbocyclic group;
   (iii) a photosensitive, aromatic or non-aromatic heterocyclic group comprising a carbon-carbon double bond that is conjugated with an electron withdrawing group;
   (iv) a photosensitive non-aromatic unsaturated heterocyclic group comprising one or more amide groups that are conjugated with a carbon-carbon double bond, which photosensitive non-aromatic unsaturated heterocyclic group is linked to the water-soluble backbone at an amide nitrogen atom, or
   (v) a photosensitive substituted or unsubstituted 1,2-diarylethylene group.

6. The method of claim 1, wherein the reactive polymer is one of the following:
   poly(3-sulfopropyl methacrylate potassium salt-co-2-cinnamoyl-ethyl methacrylate) (80:20 mol %);
   poly(3-sulfopropyl methacrylate-co-methacrylic acid-co-2-cinnamoyl-ethyl methacrylate) (2:78:20 mol %);
   poly(3-sulfopropyl methacrylate-co-methacrylic acid-co-2-cinnamoyl-ethyl methacrylate) (5:75:20 mol %);
   poly(3-sulfopropyl methacrylate-co-methacrylic acid-co-2-cinnamoyl-ethyl methacrylate) (10:70:20 mol %);
   poly(3-sulfopropyl methacrylate-co-methacrylic acid-co-2-cinnamoyl-ethyl methacrylate) (30:50:20 mol %);
   poly(3-sulfopropyl methacrylate potassium salt-co-methacrylic acid-co-2-cinnamoyl-ethyl methacrylate) (50:30:20 mol %);
   poly(3-sulfopropyl methacrylate potassium salt-co-2-hydroxyethyl methacrylate acid-co-2-cinnamoyl-ethyl methacrylate) (50:30:20 mol %);
   poly(3-sulfopropyl methacrylate potassium salt-co-acrylamide-co-2-cinnamoyl-ethyl methacrylate) (50:30:20 mol %);
   poly(3-sulfopropyl methacrylate potassium salt-co-N-vinyl-2-pyrrolidone-co-2-cinnamoyl-ethyl methacrylate) (50:30:20 mol %);
   poly(3-sulfopropyl methacrylate potassium salt-co-maleic anhydride-co-2-cinnamoyl-ethyl methacrylate) (50:30:20 mol %);
   poly(3-sulfopropyl methacrylate potassium salt-co-vinyl phosphonic acid-co-2-cinnamoyl-ethyl methacrylate) (50:30:20 mol %);
   poly(2-acylamido-2-methyl-1-propanesulfonic acid-co-2-cinnamoyl-ethyl methacrylate) (80:20 mol %);
   poly(2-acylamido-2-methyl-1-propanesulfonic acid-co-methacrylic acid-co-2-cinnamoyl-ethyl methacrylate) (50:30:20 mol %);
   poly(2-acylamido-2-methyl-1-propanesulfonic acid-co-methacrylic acid-co-2-cinnamoyl-ethyl methacrylate) (10:70:20 mol %);
   poly(styrene sulfonic acid sodium salt-co-2-cinnamoyl-ethyl methacrylate) (80:20 mol %);
   poly(styrene sulfonic acid sodium salt-co-methacrylic acid-co-2-cinnamoyl-ethyl methacrylate) (50:30:20 mol %);

poly(3-sulfopropyl methacrylate potassium salt-co-7-(2-methacryloxyethoxy)-4-methylcoumarin) (80:20 mol %);

poly(3-sulfopropyl methacrylate potassium salt-co-methacrylic acid-co-7-(2-methacryloxyethoxy)-4-methylcoumarin) (50:30:20 mol %);

poly(3-sulfopropyl methacrylate potassium salt-co-methacrylic acid-co-7-(2-methacryloxyethoxy)-4-methylcoumarin) (10:70:20 mol %);

poly(styrene sulfonic acid sodium salt-co-7-(2-methacryloxyethoxy)-4-methylcoumarin) (80:20 mol %);

poly(styrene sulfonic acid sodium salt-co-methacrylic acid-co-7-(2-methacryloxyethoxy)-4-methylcoumarin) (50:30:20 mol %);

poly(2-acylamido-2-methyl-1-propanesulfonic acid-co-7-(2-methacryloxyethoxy)-4-methylcoumarin) (80:20 mol %);

poly(2-acylamido-2-methyl-1-propanesulfonic acid-co-methacrylic acid-co-7-(2-methacryloxyethoxy)-4-methylcoumarin) (50:30:20 mol %);

poly(2-acylamido-2-methyl-1-propanesulfonic acid-co-methacrylic acid-co-7-(2-methacryloxyethoxy)-4-methylcoumarin) (10:70:20 mol %);

poly(3-sulfopropyl methacrylate potassium salt-co-acrylamide-co-7-(2-methacryloxyethoxy)-4-methylcoumarin) (50:30:20 mol %);

poly(3-sulfopropyl methacrylate potassium salt-co-2-hydroxyethyl methacrylate-co-7-(2-methacryloxyethoxy)-4-methylcoumarin) (50:30:20 mol %);

poly(3-sulfopropyl methacrylate potassium salt-co-maleic anhydride-co-7-(2-methacryloxyethoxy)-4-methylcoumarin) (50:30:20 mol %);

poly(3-sulfopropyl methacrylate potassium salt-co-N-vinyl-2-pyrrolidone-co-7-(2-methacryloxyethoxy)-4-methylcoumarin) (50:30:20 mol %);

poly(3-sulfopropyl methacrylate potassium salt-co-N-vinyl-2-pyrrolidone-co-methacrylic acid-co-7-(2-methacryloxyethoxy)-4-methylcoumarin) (20:30:30:20 mol %);

poly (3-sulfopropyl methacrylate-co-N-(2-(methacryloxy)ethyl) dimethylmaleimide) (20:80 mol %);

poly (3-sulfopropyl methacrylate-co-methacrylic acid-co-N-(2-(methacryloxy)ethyl) dimethylmaleimide) (50:30:20 mol %);

poly (3-sulfopropyl methacrylate-co-methacrylic acid-co-N-(2-(methacryloxy)ethyl) dimethylmaleimide) (10:70:20 mol %);

poly (styrene sulfonic acid sodium salt-co-methacrylic acid-co-N-(2-(methacryloxy)ethyl) dimethylmaleimide) (50:30:20 mol %);

poly (styrene sulfonic acid sodium salt-co-methacrylic acid-co-N-(2-(methacryloxy)ethyl) dimethylmaleimide) (10:70:20 mol %);

poly (2-acylamido-2-methyl-1-propanesulfonic acid -co-methacrylic acid-co-N-(2-(methacryloxy)ethyl) dimethylmaleimide) (50:30:20 mol %);

poly (2-acylamido-2-methyl-1-propanesulfonic acid -co-methacrylic acid-co-N-(2-(methacryloxy)ethyl) dimethylmaleimide) (10:70:20 mol %);

poly(3-sulfopropyl methacrylate sodium salt-co-methacrylic acid-co-2-(2,3-diphenyl-2-cyclopropene-1-carbonyloxy) ethyl methacrylate) (10:70:20 mol %);

poly(styrene sulfonic acid sodium salt-co-methacrylic acid-co-2-(2,3-diphenyl-2-cyclopropene-1-carbonyloxy) ethyl methacrylate) (10:70:20 mol %); and poly(2-acrylamido-2-methyl-1-propanesulfonic acid-co-methacrylic acid-co-2-(2,3-diphenyl-2-cyclopropene-1-carbonyloxy) ethyl methacrylate) (10:70:20 mol %).

7. The method of claim 1, wherein the substrate has an integrated transmittance of at least 90%.

8. The method of claim 1, comprising disposing the silver-containing composition onto a supporting side of the substrate in a patternwise fashion using a flexographic printing member.

9. The method of claim 1, further comprising:
either immediately before or immediately after disposing the silver-containing composition onto the substrate, reducing the reducible silver ions in the water-soluble complex to form silver nanoparticles in the water-soluble complex.

10. The method of claim 9, further comprising:
after reducing the reducible silver ions, photoexposing the water-soluble complex containing the silver nanoparticles to form a crosslinked water-insoluble complex comprising the silver nanoparticles.

11. The method of claim 10, comprising:
photoexposing the water-soluble complex containing the silver nanoparticles in a patternwise fashion on the substrate.

12. The method of claim 9, comprising:
reducing the silver ions in the water-soluble complex to form silver nanoparticles having an average diameter of at least 2 nm and up to and including 500 nm.

13. The method of claim 11, further comprising, after photoexposing the water-soluble complex to form the crosslinked water-insoluble complex containing silver nanoparticles,
heating the crosslinked water-insoluble complex containing silver nanoparticles at a temperature sufficient to further crosslink the crosslinked water-insoluble complex containing the silver nanoparticles.

14. The method of claim 11, further comprising, after photoexposing the water-soluble complex to form the crosslinked water-insoluble complex containing silver nanoparticles,
removing any remaining water-soluble complex from the substrate.

15. The method of claim 14, further comprising:
electrolessly plating the crosslinked water-insoluble complex using an electrically-conductive metal.

16. The method of claim 1, comprising:
disposing the silver-containing composition onto the first supporting side of a substrate,
either immediately before or immediately after disposing the silver-containing composition onto the first supporting side of the substrate, reducing the reducible silver ions in the water-soluble complex to form silver nanoparticles in the water-soluble complex on the first supporting side of the substrate,
disposing the same or different silver-containing composition onto an opposing second supporting side of the substrate,
either immediately before or immediately after disposing the silver-containing composition onto the opposing second supporting side of the substrate, reducing the reducible silver ions in the water-soluble complex to form silver nanoparticles in the water-soluble complex on the opposing second supporting side of the substrate, and
photoexposing the water-soluble complex containing the silver nanoparticles on either or both of the first supporting side and opposing second supporting side of the substrate, to form a crosslinked water-insoluble complex comprising the silver nanoparticles on either or both of the first supporting side and opposing supporting side of the substrate, and optionally, removing any remaining water-soluble complex from both the first supporting side and the opposing second supporting side of the substrate.

17. The method of claim 16 further comprising:

removing any remaining water-soluble complex from both the first supporting side and the opposing second supporting side of the substrate, and electrolessly plating the crosslinked water-insoluble complex on either or both of the first supporting side and the second opposing supporting side of the substrate using an electrically-conductive metal.

18. The method of claim 16, comprising:

photoexposing the water-soluble complex containing the silver nanoparticles on either or both of the first supporting side and the opposing second supporting side in a patternwise fashion on the substrate.

19. The method of claim 16, comprising:

reducing the silver ions in the water-soluble complex on either or both the first supporting side and the opposing second supporting side to form silver nanoparticles having an average diameter of at least 2 nm and up to and including 500 nm.

20. The method of claim 16, wherein the substrate is a continuous web of transparent polymeric film having an integrated transmittance of at least 80%.

* * * * *